United States Patent

(12) United States Patent
Inoue et al.

(10) Patent No.: US 8,217,493 B2
(45) Date of Patent: Jul. 10, 2012

(54) SEMICONDUCTOR DEVICE HAVING CAPACITOR CELLS

(75) Inventors: Fumihiro Inoue, Tama (JP); Hitoshi Shima, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 283 days.

(21) Appl. No.: 12/598,253

(22) PCT Filed: Jun. 13, 2008

(86) PCT No.: PCT/JP2008/060886

§ 371 (c)(1),
(2), (4) Date: Oct. 30, 2009

(87) PCT Pub. No.: WO2009/001695

PCT Pub. Date: Dec. 31, 2008

(65) Prior Publication Data

US 2010/0117193 A1 May 13, 2010

(30) Foreign Application Priority Data

Jun. 27, 2007 (JP) ................................ 2007-169242

(51) Int. Cl.
*H01L 29/92* (2006.01)

(52) U.S. Cl. ........ 257/532; 257/528; 257/659; 257/E29; 257/E29.342

(58) Field of Classification Search .................. 257/532, 257/E29.342, 528, 659, E29
See application file for complete search history.

(56) References Cited

U.S. PATENT DOCUMENTS

| | | | | |
|---|---|---|---|---|
| 6,066,537 | A * | 5/2000 | Poh | 438/393 |
| 2001/0050409 | A1 | 12/2001 | Kasahara | |
| 2003/0006481 | A1 * | 1/2003 | Miyada et al. | 257/532 |
| 2005/0001291 | A1 | 1/2005 | Miyada et al. | |
| 2006/0055379 | A1 | 3/2006 | Yamamoto et al. | |
| 2006/0237819 | A1 | 10/2006 | Kikuta et al. | |

FOREIGN PATENT DOCUMENTS

| | | |
|---|---|---|
| JP | 05-90489 | 4/1993 |
| JP | 2003-17575 | 1/2003 |
| JP | 2004-221317 | 8/2004 |
| JP | 2006-115455 | 4/2006 |
| JP | 2006/115455 A | 4/2006 |
| JP | 2006-303220 | 11/2006 |

OTHER PUBLICATIONS

Chinese Office Action mailed Nov. 12, 2010 with partial trans.

* cited by examiner

*Primary Examiner* — Marc Armand
(74) *Attorney, Agent, or Firm* — IPUSA, PLLC

(57) ABSTRACT

A semiconductor device includes a plurality of capacitor cells having respective lower electrodes to which signals are applied and respective upper electrodes arranged to face the respective lower electrodes, wherein each interconnect connected to a corresponding one of the lower electrodes includes a shield interconnect section enclosing a corresponding one of the upper electrodes.

23 Claims, 40 Drawing Sheets

(a)

(b)

(a)

(b)

SEMICONDUCTOR DEVICE HAVING CAPACITOR CELLS

TECHNICAL FIELD

The present invention generally relates to semiconductor devices, and particularly relates to a semiconductor device having a plurality of capacitor cells.

BACKGROUND ART

Semiconductor devices having a capacitor array in which a plurality of unit capacitor cells are arranged on a semiconductor substrate have been known to those skilled in the art. Such a capacitor array may be used for a D/A converter, a switched capacitor, etc.

FIG. 39 is a circuit diagram showing part of a D/A converter circuit in which a related-art capacitor array is utilized. Condensers C0 through Cn are connected in parallel. Voltages V0 through Vn corresponding to the respective condensers C0 through Cn are applied from an input side to respective lower electrodes CL in a binary fashion. On the output side, upper electrodes CU of the respective condensers C0 through Cn are connected together to output an analog signal. The input side is low impedance, and the output side is high impedance.

FIG. 40 is a drawing illustrating an example of a plane arrangement of a semiconductor device 200 having a related-art capacitor array 150 for implementing the circuit shown in FIG. 39. In FIG. 40, 9 capacitor cells C0 through C8 each serving as a unit capacitance are arranged in a 3-by-3 matrix form, thereby constituting the capacitor array 150 as a whole. Each capacitor cell has a lower electrode CL and an upper electrode CU facing each other. The area size of the upper electrode CU is smaller than the area size of the lower electrode CL. The lower electrodes CL of the respective capacitor cells C0 through C8 are coupled to input interconnects V0 through V8, respectively. Input signals are supplied to the respective capacitor cells C0 through C9 via the input interconnects V0 through V8, respectively. Signal components of the input signals are converted into an analog converted signal by coupling the input nodes to a predetermined reference to redistribute electric charges after the charging of the unit capacitor cells C0 through C8.

The capacitor cells C0 through C3 and C5 through C8 are arranged at the perimeter of the capacitor array 150. Accordingly, the input interconnects V0 through V3 and V5 through V8 can directly be coupled to the respective lower electrodes CL at the outside edge from outside the capacitor array 150. With this arrangement, the applied input signals do not significantly affect the other capacitor cells.

Patent Document 1, for example, discloses a capacitor array comprised of four unit-capacitor cells in which shield lines are disposed on both sides of the upper electrode interconnect line such as to suppress capacitive couplings between the upper electrode interconnect line and lower electrode interconnect lines as well as between the upper electrode interconnect line and the lower electrodes.

[Patent Document 1] Japanese Patent Application Publication No. 2003-17575

DISCLOSURE OF INVENTION

Problem to be Solved by Invention

In the configuration of the related-art capacitor array 150 illustrated in FIG. 40, the input interconnect V4 coupled to the lower electrode CL of the capacitor cell C4 situated at the center is disposed at a gap between the unit capacitor cell C2 and the unit capacitor cell C5. Accordingly, a parasitic capacitance Cp1 is in existence between the input interconnect V4 and the capacitor cell C2, and a parasitic capacitance Cp2 is in existence between the input interconnect V4 and the capacitor cell C5.

FIG. 41 is a cross-sectional view of the capacitor cell C2 and the capacitor cell C5 illustrated in FIG. 40. In FIG. 41, the input interconnect V4 is situated between the capacitor cell C2 and the capacitor cell C5, creating a parasitic capacitance Cd1 with the upper electrode CU of the capacitor cell C2 and a parasitic capacitance Cd2 with the upper electrode CU of the capacitor cell C5. When this is considered in the circuit shown in FIG. 39, the unit capacitance C4 actually becomes C4+Cp1+Cp2 due to the effect of the input signal, thereby giving rise to a problem of capacitance mismatch. Further, when the unit capacitance is used alone, the capacitor cells C2 and C5 suffer the occurrence of noises through the parasitic capacitances Cp1 and Cp2 due to a voltage change in V4.

Accordingly, it is an object of the invention to provide a semiconductor device with improved circuit precision by use of a capacitor array for which capacitance mismatch and noise caused by parasitic capacitances are reduced.

Means to Solve the Problem

In order to achieve the above-noted object, a semiconductor device according to the first invention includes a plurality of capacitor cells having respective lower electrodes to which signals are applied and respective upper electrodes arranged to face the respective lower electrodes, wherein each interconnect connected to a corresponding one of the lower electrodes includes a shield interconnect section enclosing a corresponding one of the upper electrodes.

With this arrangement, an upper electrode is shielded to reduce a parasitic capacitance created with an interconnect coupled to another capacitor cell lower electrode, thereby reducing a capacitance mismatch and noise caused by such a capacitance mismatch.

A second invention is configured based on the semiconductor device of the first invention, such that the shield interconnect section includes an interconnect structure enclosing the corresponding one of the upper electrodes as viewed from above.

With this arrangement, an upper electrode is laterally shielded to reduce the main component of a parasitic capacitance created with an interconnect coupled to a lower electrode, thereby reducing a capacitance mismatch and noise caused by such a capacitance mismatch.

A third invention is configured based on the semiconductor device of the second invention, such that the shield interconnect section has a multilayer interconnect structure.

With this arrangement, parasitic capacitance components are further reduced, thereby reducing a capacitance mismatch and noise caused by such a capacitance mismatch.

A fourth invention is configured based on the semiconductor device of the second invention, such that a fixed-potential shield interconnect section situated above the shield interconnect section is further provided, the fixed-potential shield interconnect section having a plate shape covering at least the corresponding one of the upper electrodes and configured to receive a fixed potential.

With this arrangement, various available potentials are utilized to flexibly cope with different circuit needs, thereby more effectively reducing a capacitance mismatch and noise caused by such a capacitance mismatch.

A fifth invention is configured based on the semiconductor device of the fourth invention, such that the plate shape has an area size that covers the upper electrodes.

With this arrangement, the upper electrodes are shielded by a single plate-shape interconnect, thereby reducing a capacitance mismatch and noise caused by such a capacitance mismatch while easily forming interconnect layers.

A sixth invention is configured based on the semiconductor device of the first invention, such that the shield interconnect section includes a plate shape that covers the corresponding one of the upper electrodes from above.

With this arrangement, an upper electrode is almost completely shielded to significantly reduce a parasitic capacitance created with an interconnect coupled to another capacitor cell lower electrode, thereby significantly reducing a capacitance mismatch and noise caused by such a capacitance mismatch.

A seventh invention is configured based on the semiconductor device of the second invention, such that the shield interconnect section includes an interconnect structure partly enclosing the corresponding one of the upper electrodes.

With this arrangement, a capacitance mismatch and noise caused by such a capacitance mismatch are substantially reduced, and the precision of capacitances is improved while forming a proper interconnect structure conforming to the structure and usage of the semiconductor device.

An eighth invention is configured based on the semiconductor device of the seventh invention, such that the interconnect structure partly enclosing the corresponding one of the upper electrodes provides an enclosure along a perimeter excluding a portion where an upper electrode connecting section is provided to electrically connect the upper electrodes together.

With this arrangement, most of the upper electrode is enclosed to reduce a capacitance mismatch and noise caused by such a capacitance mismatch in the substantially same manner as in the case in which the upper electrode is fully enclosed. The precision of capacitances can thus be improved while coping with various interconnect structures.

A ninth invention is configured based on the semiconductor device of the seventh invention, such that a fixed-potential shield interconnect section situated above the shield interconnect section is further provided, the fixed-potential shield interconnect section having a plate shape covering at least the corresponding one of the upper electrodes and configured to receive a fixed potential.

With this arrangement, various potentials in the circuit are utilized to shield an upper electrode, thereby coping with different circuit needs and reducing a capacitance mismatch and noise caused by such a capacitance mismatch.

A tenth invention is configured based on the semiconductor device of the ninth invention, such that the plate shape has an area size that covers the upper electrodes.

With this arrangement, the upper electrodes are shielded by a single plate-shape interconnect, thereby providing a wide-area shielding effect while forming an easy interconnect structure.

An eleventh invention is configured based on the semiconductor device of the first invention, such that a comparator and a D/A converter circuit are further provided.

With this provision, the output precision of the D/A converter is improved.

A twelfth invention is configured based on the semiconductor device of the first invention, such that an operational amplifier and an amplification circuit are further provided.

With this arrangement, the amplification circuit using condensers is implemented with high precision.

Advantage of the Invention

The present invention reduces a capacitance mismatch caused by a parasitic capacitance created in a capacitor array of a semiconductor device.

DESCRIPTION OF REFERENCE NUMBERS

Figure 1:
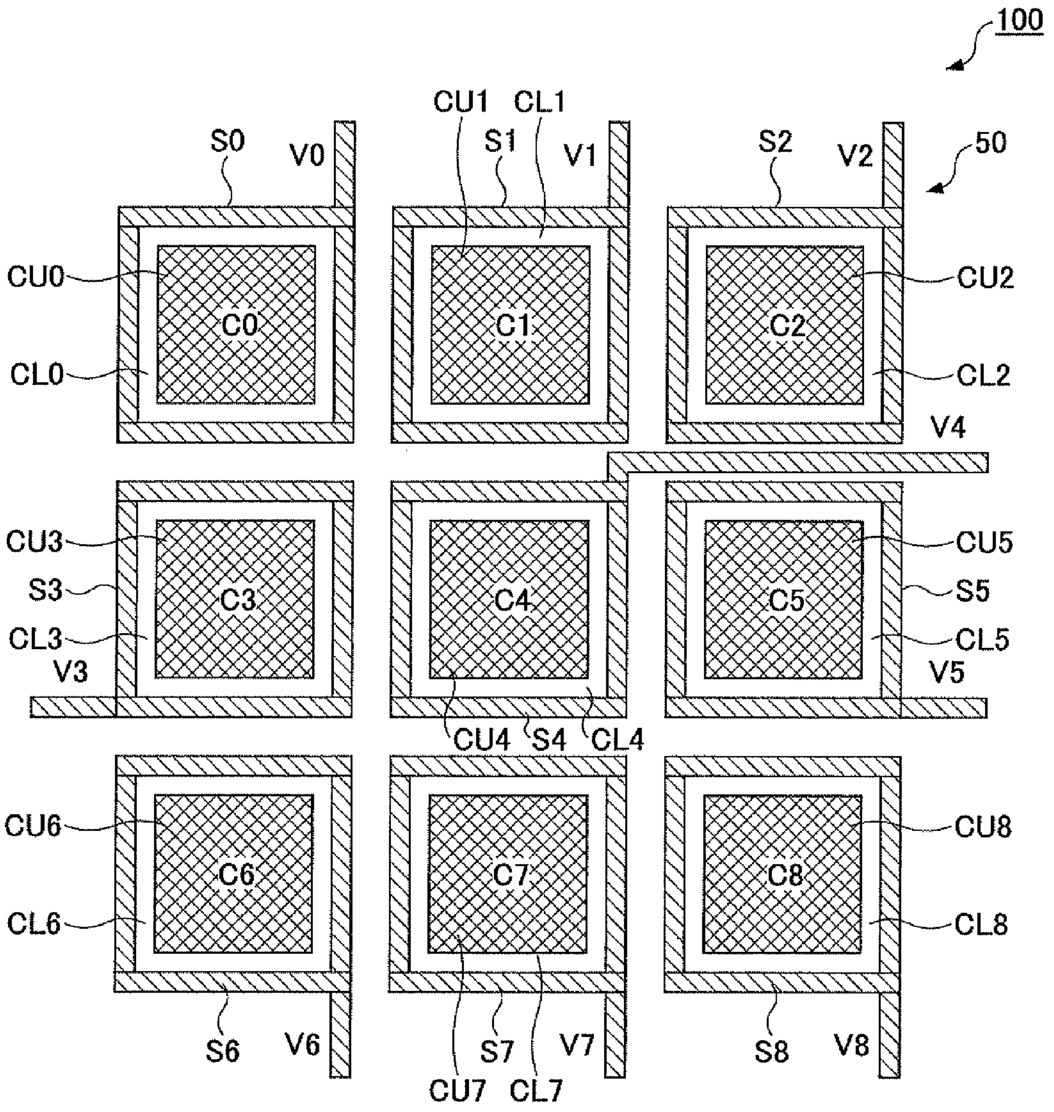
FIG. 1 is a drawing showing a plane configuration of a semiconductor device 100 according to a first embodiment of the present invention.

10 semiconductor substrate
C0-C8, C11-C14, C11*a*-C14*a* capacitor cell
CU0-CU8, CU11-CU14, CU11*a*-CU14*a* upper electrode CL0-CL8, CL11-CL14 lower electrode
S0-S8, S10-S18, S20-S28, S31-S34, S31*a*-S34*a*, S31*c*-S34*c*, S71-S74, S71*a*-S74*a*, S131-S134, S171-S174 shield interconnect section
V0-V8, V11-V14 input interconnect
CUC upper electrode connecting section
22, 25, 21*a*-24*a*, 21*b*-24*b* contact hole
30, 30*a*, 30*c*, 31*a*-34*a*, 31*b*-34*b* first metal interconnect layer
41-44, 81-84, 141, 142, 181, 182 via hole
50, 50*c*, 50*e*, 150 capacitor array
60, 61, 62, 63, 64, 65 insulating layer
70, 70*a*, 70*c*, 70*e*, 71*d*-74*d*, 71*e*, 72*e* second metal interconnect
S70*f*, S71*f*, S72*f*, S170, S171, S172 fixed-potential shield interconnect section
90, 91, 92, 93, 94, 130 third metal interconnect layer
100, 100*a*, 100*b*, 100*c*, 100*d*, 100*e*, 100*f*, 100*g*, 100*h*, 100*i*, 100*j*, 100*k*, 200 semiconductor device
170, 171, 172, 173, 174, fourth metal interconnect layer
190, 191, 192, 193, 194, fifth metal interconnect layer
280 D/A converter circuit
290 comparator
291 successive approximation register
292 switch control circuit
Cd1, Cd2 condenser
Amp operational amplifier

BEST MODE FOR CARRYING OUT THE INVENTION

In the following, the best mode for carrying out the present invention will be described by referring to the accompanying drawings.

First Embodiment

FIG. 1 is a drawing showing a plane configuration of a semiconductor device 100 according to a first embodiment of the present invention. The same elements as those already described are referred to by the same reference symbols.

In FIG. 1, the semiconductor device 100 according to the first embodiment includes capacitor cells C0 through C8 on a semiconductor substrate. The capacitor cells C0 through C8 include upper electrodes CU0 through CU8, lower electrodes CL0 through CL8, shield interconnect sections S0 through S8, and input interconnects V0 through V8, respectively.

The capacitor cells C0 through C8 are arranged side by side in a 3-by-3 matrix form, thereby constituting a capacitor array 50 as a whole. In the present embodiment, the capacitor array 50 having the capacitor cells C0 through C8 arranged in a 3-by-3 matrix form is used as an example since this simplest configuration will facilitate the understanding of the invention. The number of the capacitor cells C0 through C8 may be larger. It may be 4-by-4 configuration, or may be 4-by-8 configuration, for example.

The capacitor cells C0 through C8 have substantially the same shape, and each of the capacitor cells C0 through C8 constitutes a unit capacitance. Such a unit capacitance may be set to a desired electrostatic capacitance for each semiconductor device 100. The unit capacitance may be 125 [fF], or may be 250 [fF], for example. The semiconductor device 100 of the present embodiment may be utilized as appropriate in semiconductor integrated circuit devices (ICs). In semiconductor integrated circuit devices, high precision may be achieved when making a number of identical elements on a semiconductor substrate. The provision of the identical capacitor cells C0 through C8 is thus advantageous for the purpose of manufacturing capacitors with high precision. In the semiconductor device 100 of the present embodiment, the capacitor array 50 has the unit-capacitance capacitor cells C0 through C8 arranged side by side, thereby providing capacitors having desired electrostatic capacitances with high precision. The capacitor cells C0 through C8 each serve as basic capacitance units that constitute the capacitor array 50.

The capacitor cells C0 through C8 have the upper electrodes CU0 through CU8 and the lower electrodes CL0 through CL8, respectively, which are situated to face each other. The upper electrodes CU0 through CU8 and the lower electrodes CL0 through CL8 may be made of a poly-crystal conductive material such as a polysilicon, and may have an insulating oxide film made of silicon dioxide therebetween. The provision of an insulating material between conductive elements provides a capacitive function of the capacitor cells C0 through C8.

The capacitor cells C0 through C8 are configured such that the area size of the lower electrodes CL0 through CL8 is larger than the area size of the upper electrodes CU0 through CU8. Since the lower electrodes CL0 through CL8 are on a lower impedance side, and the upper electrodes CU0 through CU8 are on a higher impedance side, it is preferable for the lower electrodes CL0 through CL8 to have a larger area size.

The input interconnects V0 through V8 are coupled to the lower electrodes CL0 through CL8 of the capacitor cells C0 through C8, respectively. The lower electrodes CL0 through CL8 may receive signals from the input interconnects V0 through V8, and may be fixed to a fixed potential through the input interconnects V0 through V8 having low impedance.

The capacitor cells C0 through C8 are provided with the shield interconnect sections S0 through S8, respectively. The shield interconnect sections S0 through S8 are situated such as to enclose the capacitor cells C0 through C8, respectively, and coupled to the respective input interconnects V0 through V8. To be exact, it suffices for the shield interconnect sections S0 through S8 to enclose the upper electrodes CU0 through CU8 of the capacitor cells C0 through C8, respectively. When viewed from above, thus, the shield interconnect sections S0 through S8 may be situated slightly inside the perimeter of the lower electrodes CL0 through CL8, respectively. The provision of the shield interconnect sections S0 through S8 makes it possible to contain the creation of parasitic capacitance within the respective capacitor cells C0 through C8, thereby preventing a capacitance mismatch in which the capacitances of the capacitor cells C0 through C8 become uneven or irregular. In FIG. 1, the input interconnect V4 coupled to the capacitor cell C4 situated at the center of the capacitor array 50 is disposed along a space between the capacitor cell C2 and the capacitor cell C5. Since the upper electrodes CU2 and CU5 are shielded by the respective shield lines S2 and S5, the parasitic capacitance created between the input interconnect V4 and the upper electrode CU2 of the capacitor cell C2 and the parasitic capacitance created between the input interconnect V4 and the upper electrode CU5 of the capacitor cell C5 become significantly small.

Figure 2:
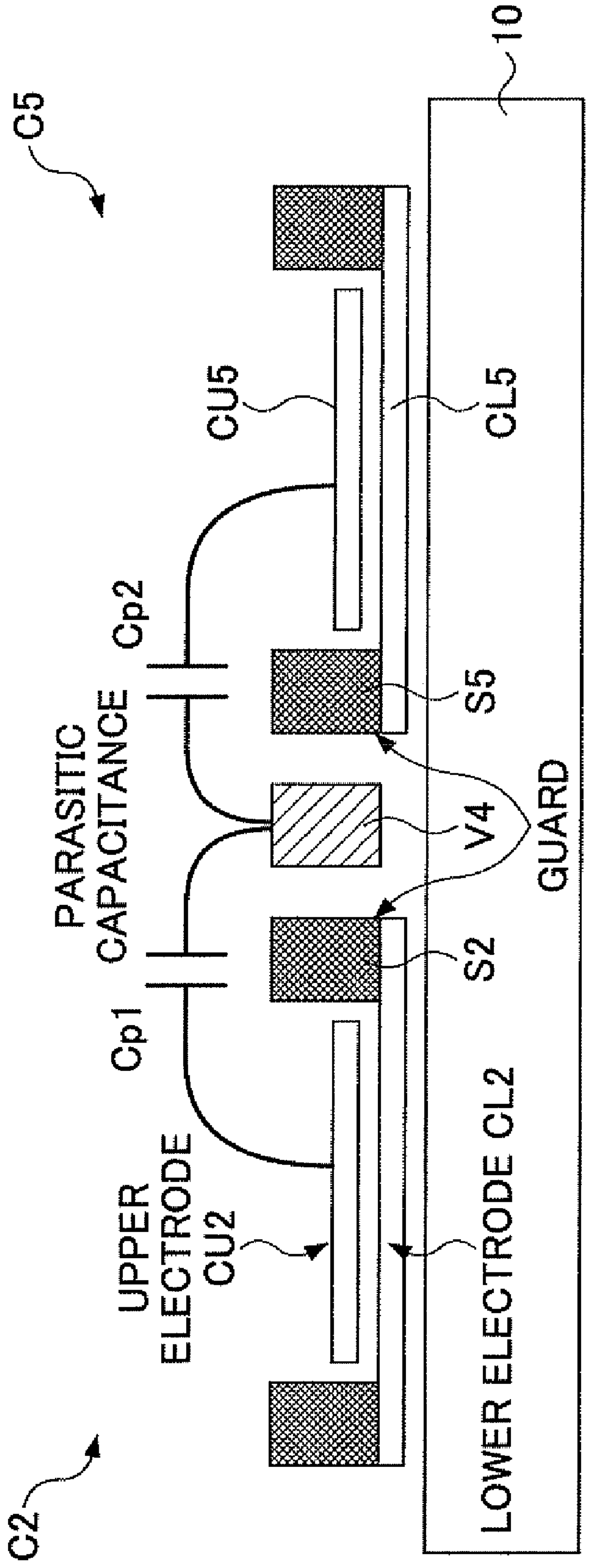
FIG. 2 is a cross-sectional view of a portion of the semiconductor device 100 of the first embodiment for illustrating a section where the capacitor cells C2 and C5 are situated.

FIG. 2 is a cross-sectional view of a portion of the semiconductor device 100 illustrated in FIG. 1 for illustrating a section where the capacitor cells C2 and C5 are situated. In FIG. 2, the lower electrodes CL2 and CL5 of the capacitor cells C2 and C5 are formed on a semiconductor substrate 10 made of silicon or the like. The upper electrodes CU2 and CU5 are formed to face the lower electrodes CL2 and CL5, respectively. The shield interconnect sections S2 and S5 are electrically connected to the lower electrodes CL2 and CL5 to enclose the upper electrodes CU2 and CU5, respectively. The input interconnect V4 is situated between the inner lines of the shield interconnect sections S2 and S5. Although not illustrated, an insulating oxide film such as silicon dioxide ($SiO_2$) may be disposed between the semiconductor substrate 10 and the lower electrodes CL2 and CL5 and between the lower electrodes CL2 and CL5 and the corresponding upper electrodes CU2 and CU5. Further, an interconnect layer for output purposes may be provided above the upper electrodes CU2 and CU5.

Figure 41:
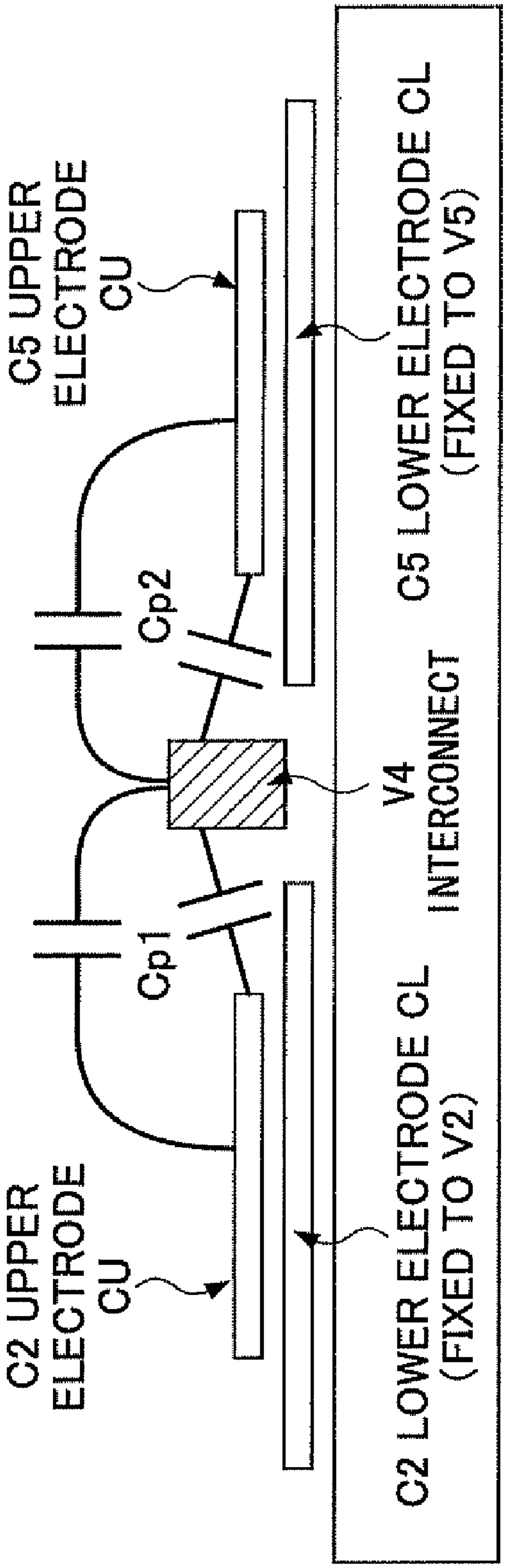
FIG. 41 is a cross-sectional view of the capacitor cell C2 and the capacitor cell C5 illustrated in FIG. 40.

In FIG. 2, the parasitic capacitance Cp1 created between the input interconnect V4 and the upper electrode CU2 and the parasitic capacitance Cp2 created between the input interconnect V4 and the upper electrode CU5 are lacking in the main straight-line components extending in a horizontal direction, and only have the components bypassing over the shield interconnect sections S2 and S5. Electrostatic capacitance is in inverse proportion to a distance between electrodes. The capacitances of the parasitic capacitances Cp1 and Cp2 are thus significantly lower than those of the related-art configuration illustrated in FIG. 41. In this manner, the shield interconnect sections S0 through S8 coupled to the lower electrodes CL0 through CL8 enclose the upper electrodes CU0 through CU8 of the capacitor cells C0 through C8, respectively. This arrangement removes the main component of parasitic capacitances created between the input interconnects V0 through V8 and the upper electrodes CU0 through CU8, thereby significantly reducing parasitic capacitances.

The shield interconnect sections S0 through S8 may be formed in the same interconnect layer as the layer in which the input interconnects V0 through V8 are formed. This arrangement reliably blocks electric lines of force connecting in a straight line between the upper electrodes CU0 through CU8 and the input interconnects V0 through V8, thereby providing a great shielding effect while employing a simple coupling structure. It should be noted, however, that the shield interconnect sections S0 through S8 suffice if they block electric lines of force generated between the upper electrodes CU0 through CU8 and the input interconnects V0 through V8, as previously described. As long as this effect is achieved, the shield interconnect sections S0 through S8 may be provided at different height from the input interconnects V0 through V8. If the input interconnects V0 through V8 are situated further above, provision may be made to position the shield interconnect sections right on a straight line that connects between the input interconnects V0 through V8 and the upper electrodes CU0 through CU8 in the shortest distance. With this provision, an improved shielding effect may be obtained despite the use of a slightly more complex interconnect structure.

With reference to FIG. 1 and FIG. 2, only the parasitic capacitances Cp1 and Cp2 between the input interconnect V4 coupled to the capacitor cell C4 and the respective capacitor cells C2 and C5 have been discussed as being relevant in considering the problem. Needless to say, however, the same arguments also apply in the case of larger number of capacitor cells.

Figure 3:
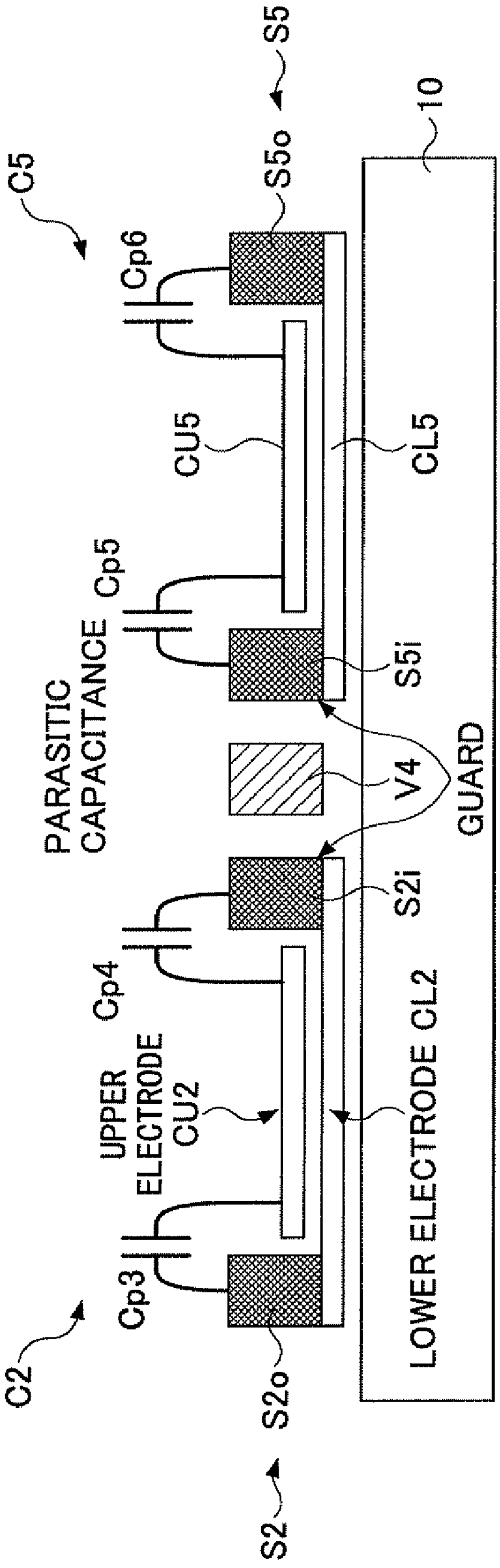
FIG. 3 is a cross-sectional view illustrating a section where the capacitor cells C2 and C5 and the input interconnect V4 are situated.

In the following, a description will be given of parasitic capacitances created between the shield lines S0 through S8 and the upper electrodes CU0 through CU8 inside the capacitor cells C0 through C8, respectively, with reference to FIG. 3. FIG. 3 is a cross-sectional view illustrating a section where the capacitor cells C2 and C5 and the input interconnect V4 are situated as is illustrated in FIG. 2.

In FIG. 3, the arrangements of the semiconductor substrate 10, the lower electrodes CL2 and CL5 and upper electrodes CU2 and CU5 of the capacitor cells C2 and C5, the shield interconnect sections S2 and S5, and the input interconnect V4 are the same as those illustrated in FIG. 2, and a description thereof will be omitted.

FIG. 3 shows parasitic capacitances Cp3 and Cp4 between the upper electrode CU2 and the shield lines disposed in the same capacitor cell, and also shows parasitic capacitances Cp5 and Cp6 between the upper electrode CU5 and the shield lines disposed in the same capacitor cell. The shield interconnect sections S2 and S5 are disposed to enclose the upper electrodes CU2 and CU5, respectively, and are electrically connected to the lower electrodes CL2 and CL5 to be set to the same potential as the lower electrodes CL2 and CL5, respectively. In this configuration, the shield interconnect sections S2 and 35 create parasitic capacitances with the upper electrodes CU2 and CU5, respectively.

With respect to the parasitic capacitances Cp3 and Cp4 created in the capacitor cell C2, the positional relationship between the outer edge of the upper electrode CU2 and the neighboring outer shield line S2*o* is symmetrical with the positional relationship between the inner edge of the upper electrode CU2 and the neighboring inner shield line S2*i*. The parasitic capacitances Cp3 and Cp4 are thus identical. By the same token, the positional relationship between the inner edge of the upper electrode CU5 of the capacitor cell C5 and the neighboring inner shield line S5*i* is symmetrical with the positional relationship between the outer edge of the upper electrode CU5 and the neighboring outer shield line S5*o*. The parasitic capacitances Cp5 and Cp6 are thus identical. Since the capacitor cells C2 and C5 are formed to have the same shape, the parasitic capacitances Cp3, Cp4, Cp5, and Cp6 are all substantially identical to each other. Since the other capacitor cells C0, C1, C3, C4, and C6 through C8 (not shown) have the same interconnection structure, the parasitic capacitances Cp3 through Cp6 created inside the same cells are also substantially identical with respect to these capacitor cells C0, C1, C3, C4, and C6 through C8. In the semiconductor device 100 of the present embodiment, thus, the parasitic capacitances created inside the capacitor cells C0 through C8 are substantially even across the capacitor cells. Accordingly, no capacitance mismatch occurs in the capacitor array 50, thereby improving the output precision of the capacitor array 50.

A simulation was conducted in which four capacitor cells C0 through C4 were arranged side by side in a 2-by-2 matrix form to constitute a rectangular capacitor array, with the unit capacitance set to 250 [fF]. An input interconnect was disposed between the two capacitor cells C1 and C2. Capacitances of the capacitor cells situated on both sides of this input interconnect were measured. In the absence of shield interconnect sections, C1 was 257.12 [fF], and C2 was 255.98 [fF], resulting in a capacitance mismatch being 1.14 [fF] (0.45%). When a similar simulation was conducted with the presence of aluminum shield interconnect sections, C1 was 258.55 [fF], and C2 was 258.26 [fF] The capacitance mismatch in this case was 0.29 [fF] (0.11%), providing an improvement of capacitance mismatch by 75%. Deviation of the electrostatic capacitances of unit capacitor cells increased with the presence of shield interconnect sections. The capacitance mismatch between the capacitor cells C0 through C4, however, was significantly improved to provide extremely-high-level output precision for the capacitor array. From the viewpoint of achieving improvements in the output precision of the capacitor array, it is more important to reduce unevenness of the capacitor cells as a whole than to bring each unit capacitance of the capacitor cells C0 through C4 closer to 250 [fF]. According to the semiconductor device 100 of the present embodiment, the output precision of a D/A converter circuit or the like to which the capacitor array 50 is applied can be significantly improved to enhance its function.

As a manner described above, the semiconductor device 100 using the shield interconnect sections S0 through S8 according to the first embodiment reduces a capacitance mismatch in the capacitor array 50, thereby suppressing noise or the like caused by such a mismatch.

Second Embodiment

Figure 4:
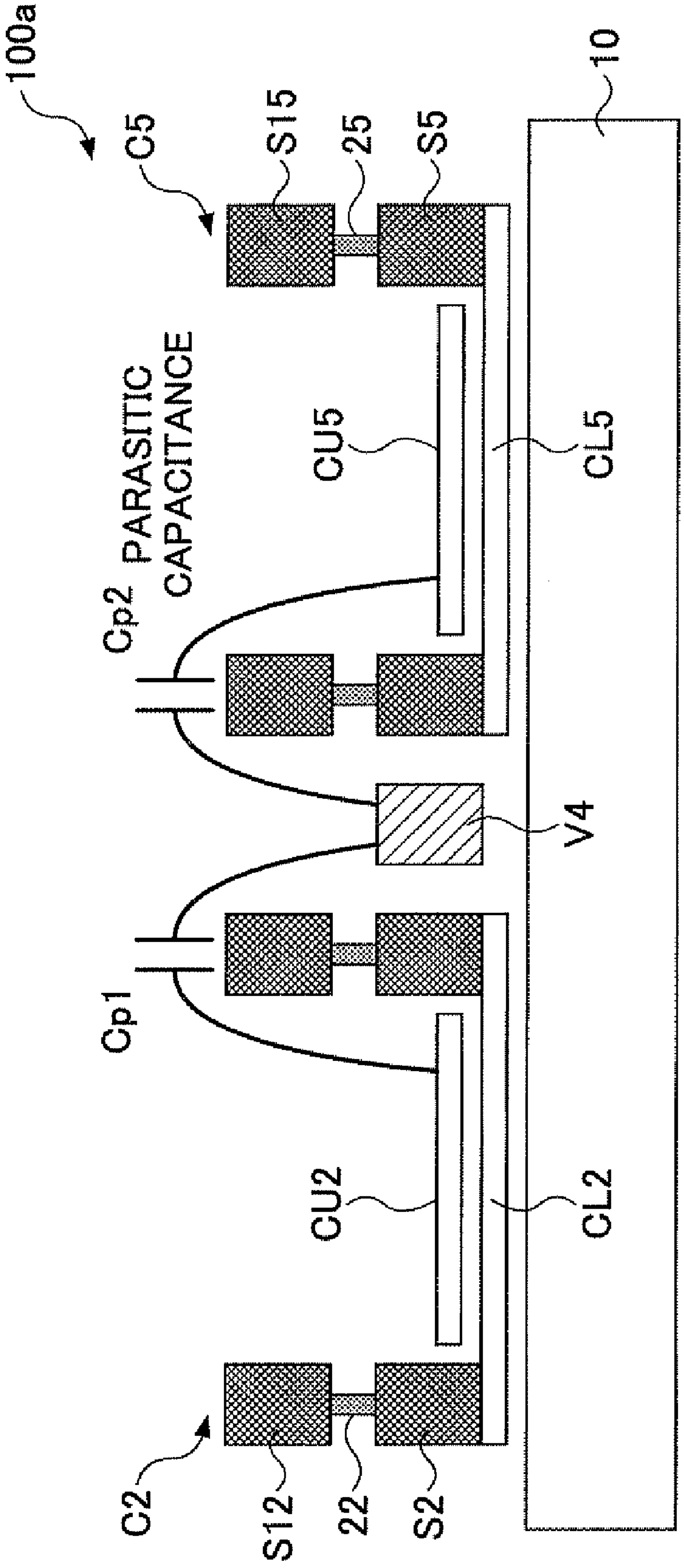
FIG. 4 is a cross-sectional view of the semiconductor device 100*a* according to the second embodiment.

In the following, a description will be given of a semiconductor device 100*a* according to a second embodiment. FIG. 4 is a cross-sectional view of the semiconductor device 100*a* according to the second embodiment. The semiconductor device 100*a* of the second embodiment has the same plane-view configuration as the configuration of the first embodiment illustrated in FIG. 1. For the sake of convenience of explanation, a description will only be given of the portion of the semiconductor device 100*a* corresponding to the portion illustrated in FIG. 2 and FIG. 3.

In FIG. 4, the semiconductor device 100*a* of the second embodiment includes the semiconductor substrate 10 made of silicon or the like, on which the lower electrodes CL2 and CL5 are formed. The upper electrodes CU2 and CU5 are formed to face the lower electrodes CL2 and CL5, respectively. The shield interconnect sections S2 and S5 are disposed around the upper electrodes CU2 and CU5 to enclose the upper electrodes CU2 and CU5, respectively. These constituent elements are the same as those of the first embodiment. Further, the fact that insulating oxide films disposed on the semiconductor substrate 10 and situated between the lower electrodes CL2 and CL5 and the respective upper electrodes CU2 and CU5 are omitted from illustration is also the same as in the first embodiment.

The semiconductor device 100*a* according to the second embodiment differs from the semiconductor device 100 of the first embodiment in that additional shield interconnect sections S12 and S15 are provided above the shield interconnect sections S2 and S5, respectively. The upper layer shield interconnect sections S12 and S15 are coupled through contact holes 22 and 25 to the lower layer shield interconnect sections S2 and S5, respectively. The shield interconnect sections S2 and S12 are set to the same potential, and the shield interconnect sections S5 and S15 are set to the same potential. In this manner, the shield interconnect sections S2, S5, S12, and S15 may be configured to have a multilayer structure. The input interconnect V4 is disposed in the same layer as the lower shield interconnect sections S2 and S5, so that the distance between the input interconnect V4 and the upper electrodes CU2 and CU5 is further increased. Namely, the parasitic capacitance Cp1 created between the upper electrode CU2 and the input interconnect V4 and the parasitic capacitance Cp2 created between the upper electrode CU5 and the input interconnect V4 are further decreased.

Although not illustrated, shield interconnect sections S10 through S18 may be provided in a layer higher than the layer of the input interconnect V4 for the capacitor cells C0 through C8 (not shown), respectively. This can further reduce the capacitance mismatch of the semiconductor device 100*a*.

As in a manner described above, the semiconductor device 100*a* according to the second embodiment utilizes a multi-layer structure comprised of the shield interconnect sections S0 through S8 and S10 through S18 to enclose the upper electrodes CU0 through CU8, respectively, to achieve a further reduction in capacitance mismatch, thereby suppressing noise or the like caused by the mismatch.

Third Embodiment

Figure 5:
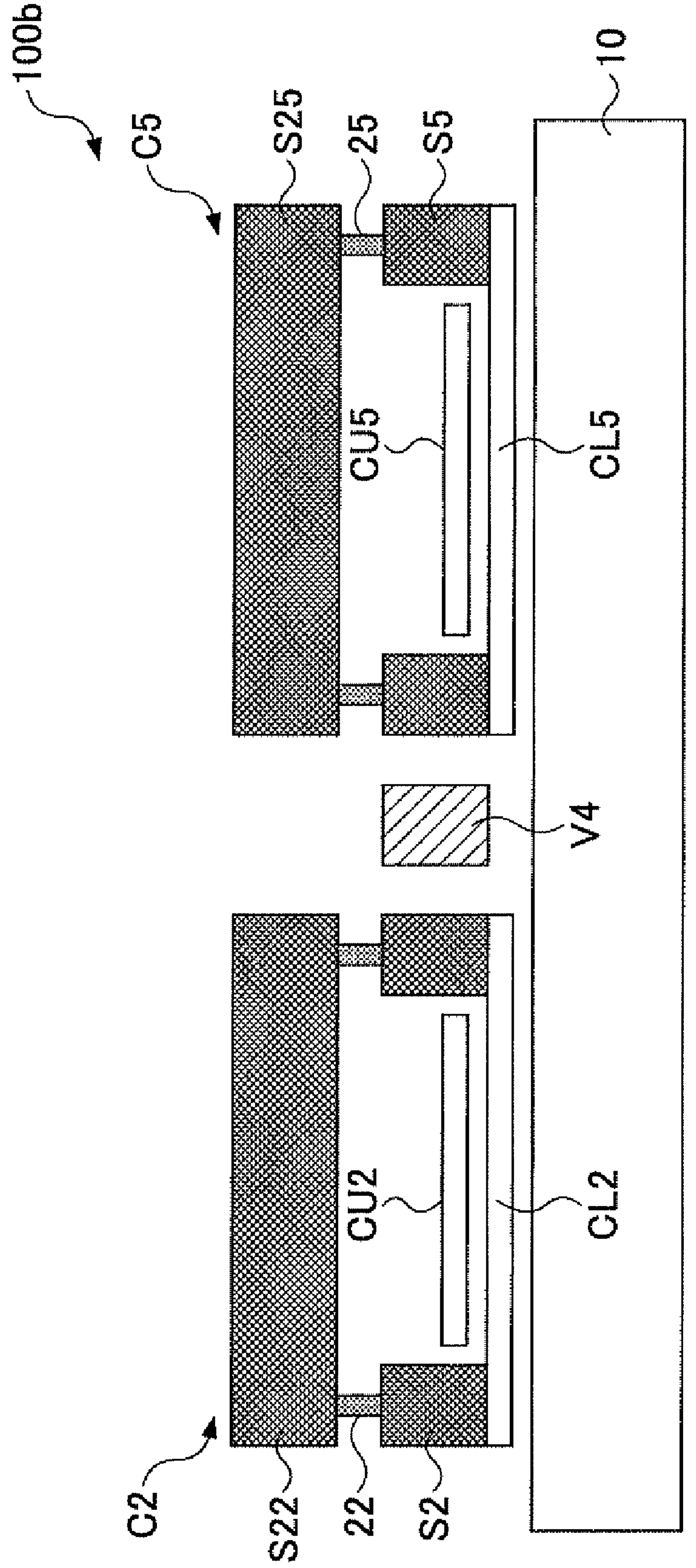
FIG. 5 is a cross-sectional view of a semiconductor device 100*b* according to a third embodiment.

FIG. 5 is a cross-sectional view of a semiconductor device 100*b* according to a third embodiment. FIG. 5 illustrates a cross-sectional view of a portion corresponding to the portion that is illustrated in FIG. 2 through FIG. 4 for the sake of facilitating the understanding of the invention.

In FIG. 5, the arrangements of the semiconductor substrate 10, the lower electrodes CL2 and CL5 and upper electrodes CU2 and CU5 of the capacitor cells C2 and C5, the shield interconnect sections S2 and S5, and the input interconnect V4 are the same as those of the first embodiment and the second embodiment. The configuration shown in FIG. 5 differs from the configurations of the first embodiment and the second embodiment in that shield interconnect sections S22 and S25 having a flat-plate shape are provided to cover the upper electrodes CU2 and CU5 above the shield interconnect sections S2 and S5, respectively. The shield interconnect sections S22 and S25 are coupled through contact holes 22 and 25 to the lower layer shield interconnect sections S2 and S5, respectively. As in the second embodiment, the shield interconnect sections S2 and S22 for the same capacitor cell C2 are set to the same potential, and the shield interconnect sections S5 and S25 for the same capacitor cell C5 are set to the same potential. In this manner, provision may be made such that the shield interconnect sections S2 and S22 as well as the shield interconnect sections S5 and S25 are configured in a multilayer structure, and such that the upper layer shield interconnect sections S22 and S25 cover the entirety of the upper electrodes CU2 and CU5 from above, respectively. With this provision, the upper electrodes CU2 and CU5 are fully shielded by the shield interconnect sections S2, S22 and S5, S25, respectively, thereby almost completely eliminating the capacitance mismatch caused by parasitic capacitance.

In the third embodiment, shield interconnect sections S20 through S28 for fully covering and enclosing the upper electrodes CU0 through CU8 may be provided in a layer above the layer of the shield interconnect sections S0 through S8 for the capacitor cells C0 through C8, respectively, some of which are not illustrated. With this provision, the semiconductor device 100*b* of the third embodiment can be implemented as a semiconductor device that has almost no parasitic capacitance and extremely high-level output precision.

Fourth Embodiment

In the following, a description will be given of a semiconductor device 100*c* according to a fourth embodiment by referring to FIG. 6 through FIG. 9. In the first through third embodiments, illustrative drawings have been used for the purpose of facilitating the understanding of the invention. In the present embodiment, however, more detailed drawings will be used to describe the semiconductor device 100*c* to which the present invention is applied.

Figure 6:
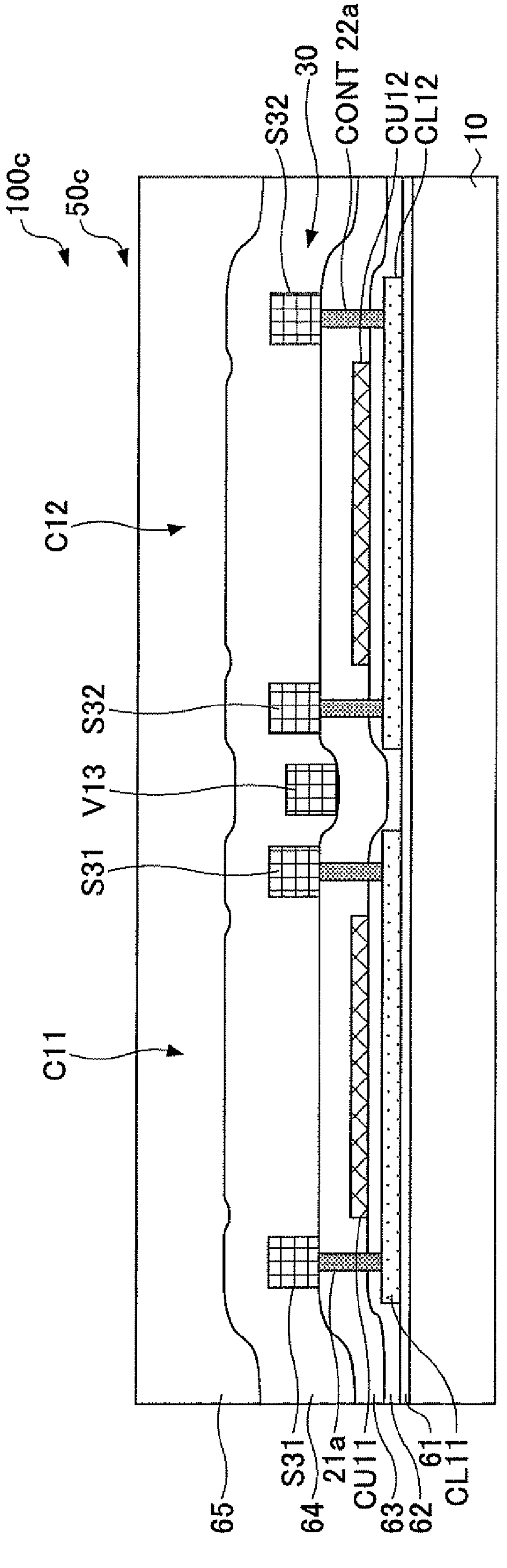
FIG. 6 is a cross-sectional view of the semiconductor device 100*c* according to the fourth embodiment.

FIG. 6 is a cross-sectional view of the structure of the semiconductor device 100*c* according to the fourth embodiment. In FIG. 6, the semiconductor device 100*c* according to the fourth embodiment includes capacitor cells C11 and C12 formed side by side on a semiconductor substrate 10 made of silicon or the like. In the present embodiment, a configuration in which four capacitor cells C11 through C14 are arranged in a 2-by-2 matrix form to form a capacitor array 50*c* will be used as an example. It is the case, more often than not, that a semiconductor device 100*c* actually manufactured has a larger number of capacitor cells arranged in the capacitor array 50*c*. For the purpose of facilitating the understanding of the invention, however, the present embodiment will be described by referring to an example in which four capacitor cells are arranged.

In FIG. 6, the capacitor cells C11 and C12 may have the same shape, and may have a unit capacitance. The capacitor cells C11 and C12 may be formed on an insulating layer 61 comprised of an insulating oxide film made of silicon dioxide or the like or an insulating film layer made of a nitride film disposed on the semiconductor substrate 10. The capacitor cells C11 and C12 have upper electrodes CU11 and CU12 and lower electrodes CL11 and CL12, respectively, which are situated to face each other across an insulating layer 62. The lower electrodes CL11 and CL12 and the upper electrodes CU11 and CU12 may be made of a poly-crystal conductive material such as polysilicon. Contact holes 21*a* and 22*a* are formed directly above the portion of the lower electrodes CL11 and CL12 where the lower electrodes CL11 and CL12 do not face the upper electrodes CU11 and CU12. Shield interconnect sections S31 and S32 are formed above the contact holes 21*a* and 22*a*, respectively, as part of a first metal interconnect layer 30. The contact holes 21*a* and 22*a* and the shield interconnect sections S31 and S32 are made of an interconnection-purpose metal such as aluminum, copper, or the like. The lower electrodes CL11 and CL12 receive signals through the contact holes 21*a* and 22*a* and the shield interconnect sections S31 and S32 of the first metal interconnect layer 30, respectively. The first metal interconnect layer 30 includes an input interconnect V13 between the shield interconnect sections S31 and S32 near the center. The input interconnect V13 is coupled to a shield interconnect section S33 of a capacitor cell C13 (not shown), and serves to supply a signal to a lower electrode CL13. This input interconnect V13 may also be made of an interconnection-purpose metal. The upper electrodes CU11 and CU12 and the contact holes 21*a* and 22*a* are covered by an insulating layer 63, and the first metal interconnect layer 30 is covered by an insulating layer 64, thereby securing insulation. Further, an insulating device 65 may be provided over the insulating layer 64 according to need.

In the following, a description will be given of the plane configuration of the semiconductor device 100*c* according to the fourth embodiment by referring to FIG. 7 and FIG. 8.

Figure 7:
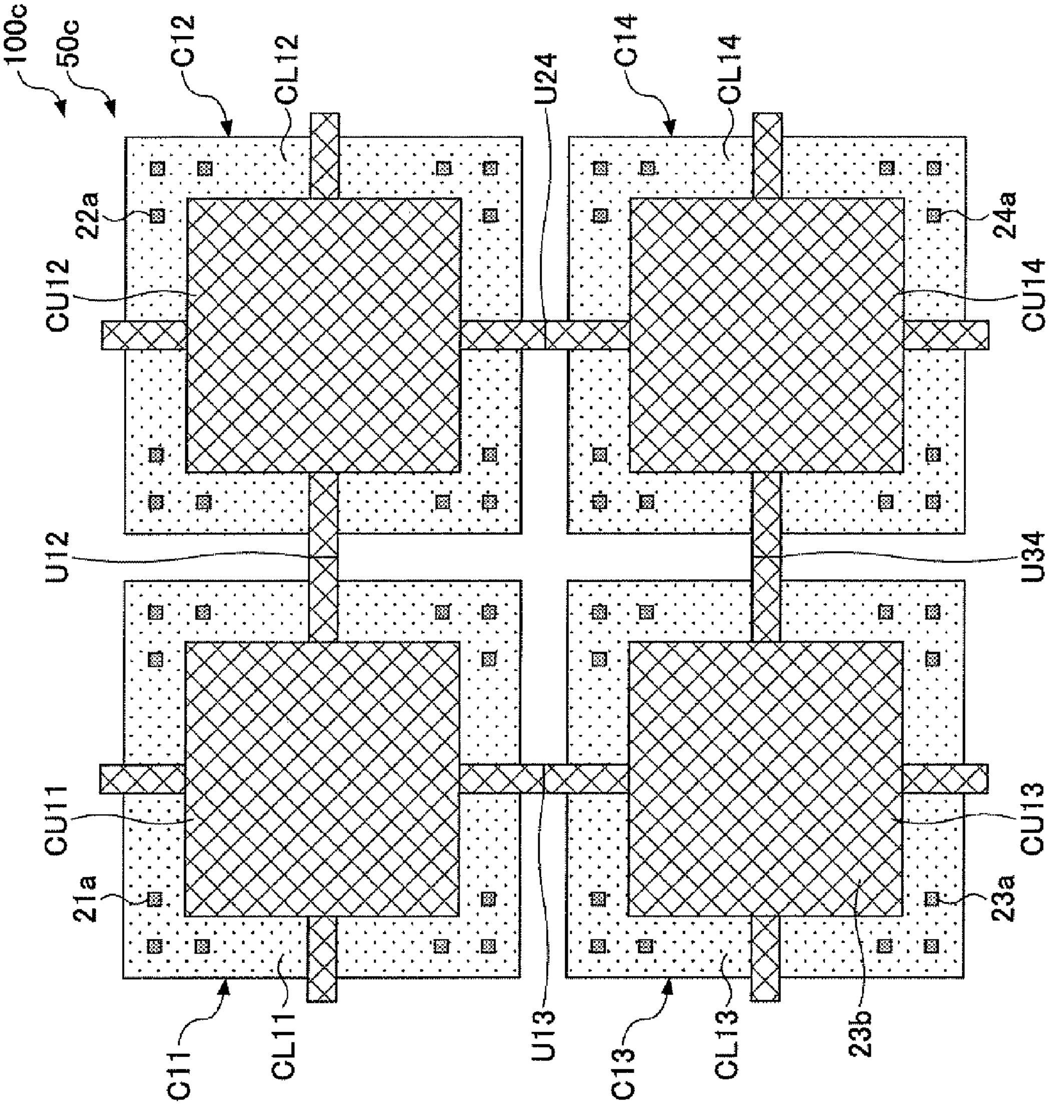
FIG. 7 is a plan view illustrating the plane configuration of the semiconductor device 100*c* according to the fourth embodiment.

FIG. 7 is a transparent plan view illustrating the plane configuration of the capacitor array 50*c* of the semiconductor device 100*c* according to the fourth embodiment. In FIG. 7, four capacitor cells C11 through C14 are arranged in a 2-by-2 matrix form to constitute the capacitor array 50*c*.

The capacitor cells C11 through C14 have upper electrodes CU11 through CU14 and lower electrodes CL11 through CL14, respectively. The lower electrodes CL11 through CL14 are larger in area size than the upper electrodes CU11 through CU14. When viewed from above, the lower electrodes CL11 through CL14 thus appear to contain the upper electrodes CU11 through CU14. The upper electrodes CU11 through CU14 and the lower electrodes CL11 through CL14 may be made of a conductive material having a resistance of approximately 5 to 100Ω/□ such as polysilicon.

The upper electrodes CU11 through CU14 are connected through connecting sections U12, U24, U34, and U13, which form part of the upper electrodes CU11 through CU14, thereby collectively forming a common electrode of the capacitor array 50*c*. In FIG. 7, the upper electrodes CU11 and CU12 are connected through the connecting section U12, the upper electrodes CU12 and CU14 through the connecting section U24, the upper electrodes CU13 and CU14 through the connecting section U34, and the upper electrodes CU11 and CU13 through the connecting section U13. The connecting sections U12, U24, U34, and U13 may be made of the same material as the upper electrodes CU11 through CU14. When the upper electrodes CU11 through CU14 are made of polysilicon, the connecting sections U12, U24, U34, and U13 may also be made of polysilicon. The upper electrodes CU11 through CU14 produce a common output signal.

On the other hand, the lower electrodes CL11 through CL14 are formed separately from each other. Contact holes 21*a* through 24*a* and connection points for supplying voltages to the respective lower electrodes CL11 through CL14 are formed at the four corners of each of the lower electrodes CL11 through CL14, respectively. Signals are applied to the lower electrodes CL11 through CL14 independently of each other through the respective contact holes 21*a* through 24*a*.

Figure 8:
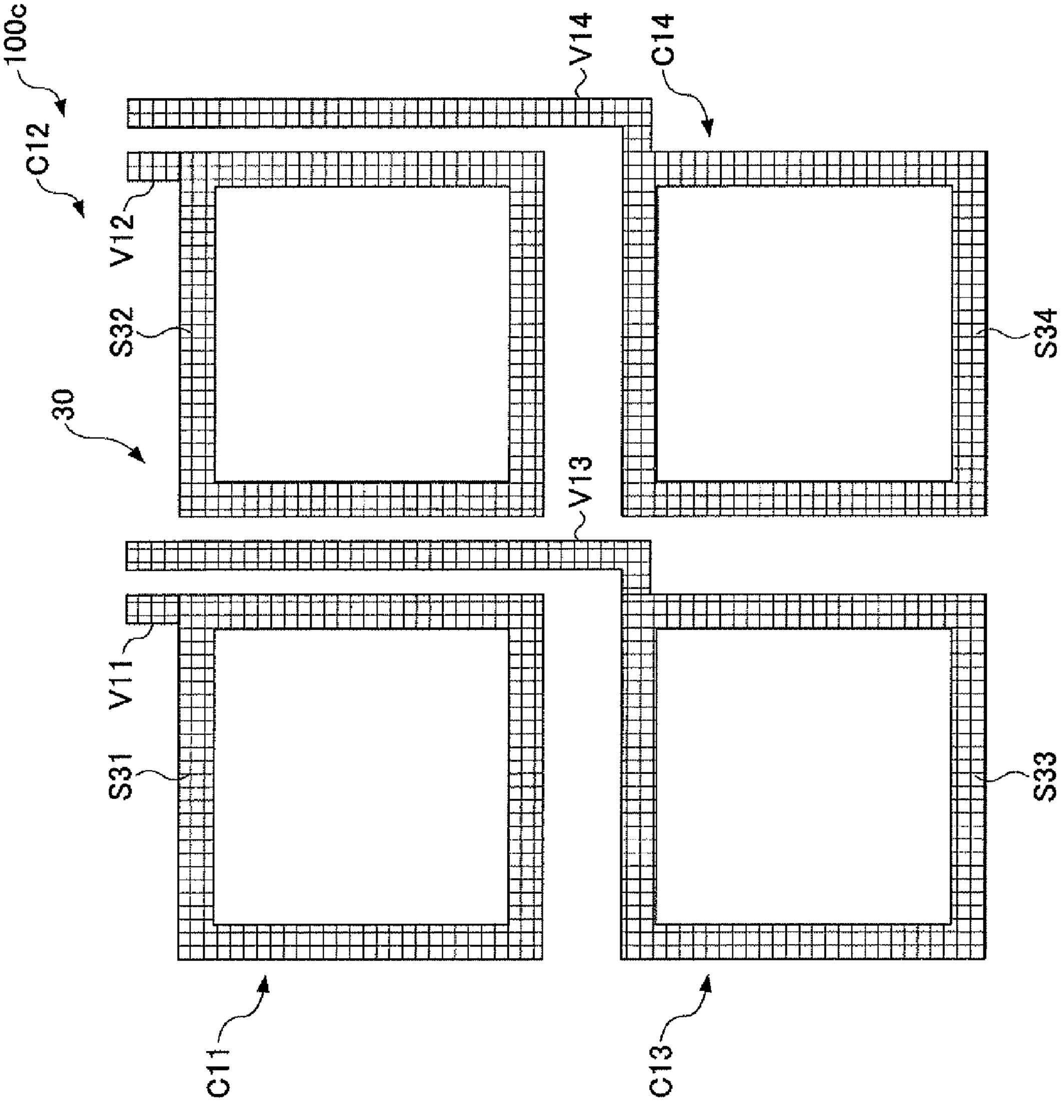
FIG. 8 is a drawing illustrating the plan configuration of the first metal interconnect layer 30 of the semiconductor device 100*c* according to the fourth embodiment.

FIG. 8 is a plan view illustrating the plane configuration of the first metal interconnect layer 30 of the semiconductor device 100*c* according to the present embodiment. In FIG. 8, the first metal interconnect layer 30 includes shield interconnect sections S31 through S34 and input interconnects V11 through V14.

The shield interconnect sections S31 through S34 are disposed to enclose the upper electrodes CU11 through CU14, respectively, as viewed from above, such that the four corners thereof are situated directly above the contact holes 21*a* through 24*a* to be coupled to the contact holes 21*a* through 24*a*.

The input interconnects V11 through V14 are conductive lines for supplying signals to the shield interconnect sections S31 through S34, and are connected to the shield interconnect sections S31 through S34, respectively. In FIG. 8, the input interconnects V11, V12, and V14 connected to the respective capacitor cells C11, C12, and C14 are coupled to the respective shield interconnect sections S31, S32, and S34 directly from outside. On the other hand, the input interconnect V13 coupled to the capacitor cell C13 is situated between the shield interconnect sections S31 and S32.

Based on the appreciation of the plane configurations illustrated in FIG. 7 and FIG. 8, attention is now directed to FIG. 6. At around the center of FIG. 6, as described with reference to FIG. 8, the input interconnect V13 is situated between the shield interconnect sections S31 and S32. The input interconnect V13 is coupled to the contact hole 23*a* as described by referring to FIG. 7 and FIG. 8, and is coupled to the lower electrode CL13 via the contact hole 23*a*. The input interconnect V13 is thus set to the same potential as the lower electrode CL13. When a signal is applied to the input interconnect V13, parasitic capacitances are created between the input interconnect V13 and an inner edge of the upper electrode CU11 of the capacitor cell C11 on the same side as the input interconnect V13, and between the input interconnect V13 and an inner edge of the upper electrode CU12 of the capacitor cell C12 on the same side as the input interconnect V13. The shield interconnect section S31 is in existence to serve as a block between the input interconnect V13 and the inner edge of the upper electrode CU11. Further, the shield interconnect section S32 is in existence to serve as a block between the input interconnect V13 and the inner edge of the upper electrode CU12. These shield interconnect sections S31 and S32 eliminate most of the parasitic capacitance between the input interconnect V13 and the upper electrode CU11 of the capacitor cell C11 and the parasitic capacitance between the input interconnect V13 and the upper electrode CU12 of the capacitor cell C12, thereby significantly reducing a capacitance mismatch between these capacitor cells.

In this manner, the first metal interconnect layer 30 supplying voltages to the lower electrodes is provided as the shield interconnect sections S31 and S32 to enclose the respective upper electrodes CU11 and CU12 as viewed from above in the semiconductor device configuration having a single metal interconnect layer. This arrangement can significantly reduce parasitic capacitances that are created between the input interconnects V11 through V14 and the upper electrodes CU11 through CU14 of the capacitor cells C11 through C14.

Figure 9:
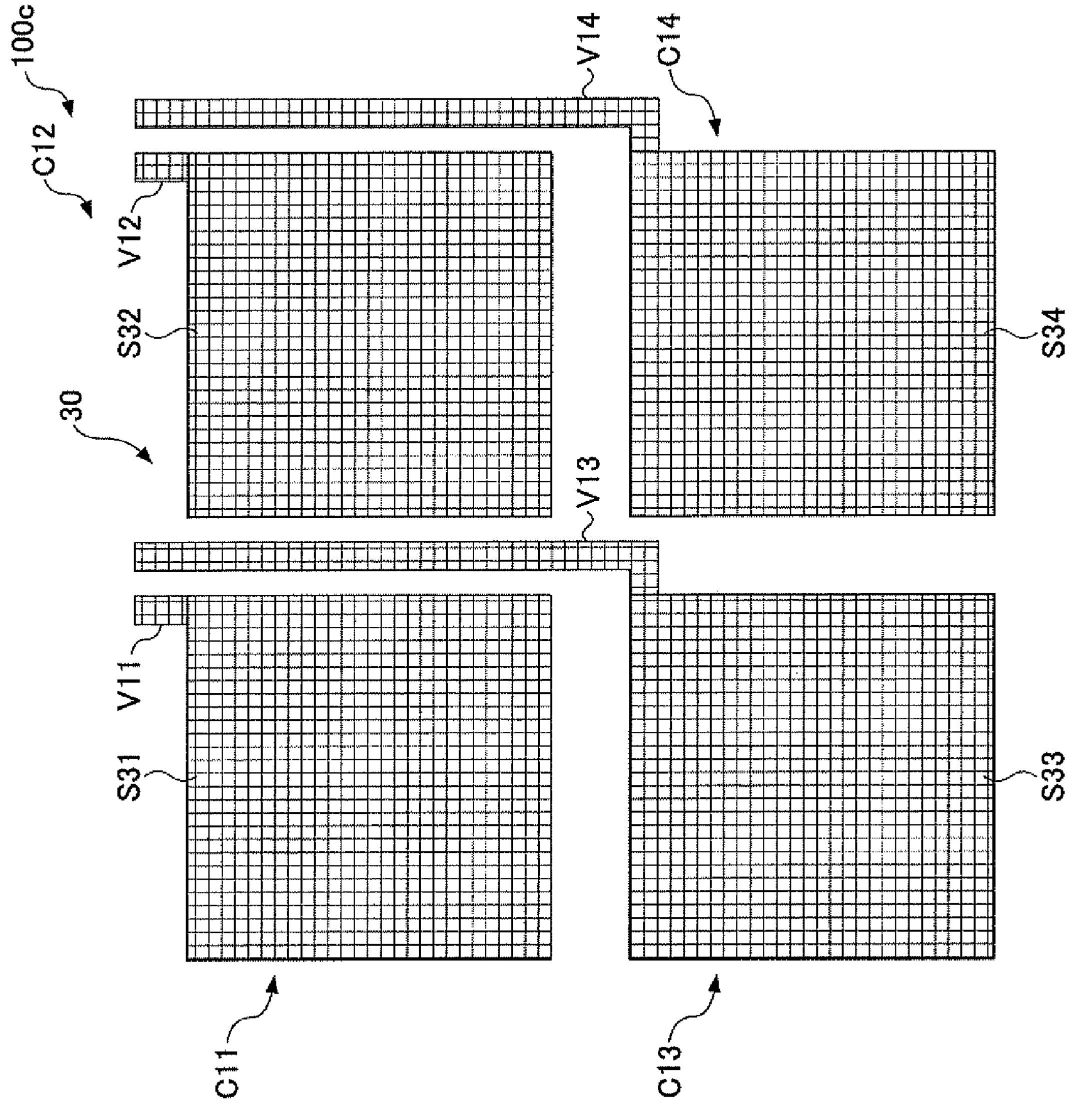
FIG. 9 is a drawing showing a variation of the fourth embodiment.

In the following, a description will be given of a variation of the semiconductor device 100*c* according to the fourth embodiment. FIG. 9 is a plan view illustrating the plan configuration of the first metal interconnect layer 30 of the semiconductor device 100*c* according to the fourth embodiment.

In FIG. 9, the first metal interconnect layer 30 of the semiconductor device 100*c* includes shield interconnect sections S31 through S34 and input interconnects V11 through V14 similarly to the manner in which they are provided in the configuration shown in FIG. 8. The configuration shown in FIG. 9 differs from the configuration shown in FIG. 8 in that the shield interconnect sections S31 through S34 cover the respective upper electrodes CU11 through CU14 as if placing caps thereon.

With this configuration in which the shield interconnect sections S31 through S34 fully cover the respective upper electrodes CU11 through CU14, the upper electrodes CU11 through CU14 are completely shielded from the input interconnects V11 through V14. Parasitic capacitances created in the capacitor array 50*c* can thus be completely eliminated, thereby further reducing a capacitance mismatch.

Fifth Embodiment

In the following, a description will be given of a semiconductor device 100*d* according to a fifth embodiment by referring to FIG. 10 through FIG. 13. In the fifth embodiment, a configuration in which the four capacitor cells C11 through C14 are arranged in a 2-by-2 matrix form to constitute a capacitor array 50*d* will be used as an example. The same elements as those of the fourth embodiment are referred to by the same reference symbols, and a description thereof will be omitted.

Figure 10:
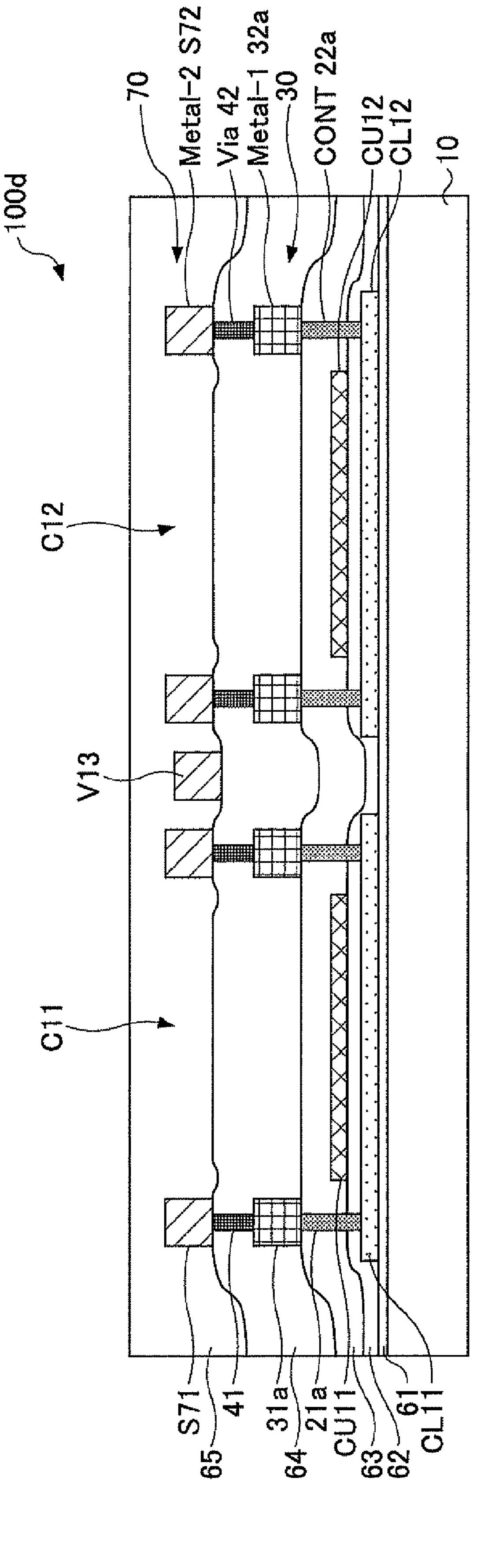
FIG. 10 is a cross-sectional view of the capacitor array 50*d* of the semiconductor device 100*d* according to the fifth embodiment.

FIG. 10 is a cross-sectional view of the capacitor array 50*d* of the semiconductor device 100*d* according to the fifth embodiment. The electrode configuration of the capacitor cells C11 and C12 of the semiconductor device 100*d* according to the fifth embodiment, i.e., the shapes of the upper electrodes CM and CU12 and the lower electrodes CL11 and CL12, is similar to that of the fourth embodiment. However, there is a difference in that the interconnect line structure of the lower electrodes CL11 and CL12 has a two-layer metal interconnect line structure.

Namely, the lower electrodes CL11 and CL12 are formed on the insulating layer 61 disposed on the semiconductor substrate 10 in FIG. 10, and the upper electrodes CU11 and CU12 are formed to face the respective lower electrodes CL11 and CL12 across the insulating layer 62, with the lower electrodes CL11 and CL12 coupled to the first metal interconnect layers 31*a* and 32*a* via the contact holes 21*a* and 22*a*, respectively. This noted configuration is the same as the configuration of the semiconductor device 100*c* of the fourth embodiment. The configuration of fifth embodiment differs from the configuration of fourth embodiment illustrated in FIG. 6 in that via holes 41 and 42 are formed on the first metal interconnect layers 31*a* and 32*a*, and shield interconnect sections S71 and S72 are formed in a second metal interconnect layer 70 above the via holes 41 and 42, respectively. Further, as a consequence of the provision of the shield interconnect sections S71 and S72 in the second metal interconnect layer 70, the input interconnect V13 is formed in the second metal interconnect layer 70.

In the following, a description will be given of the plane configuration of the semiconductor device 100*d* as viewed from above according to the present embodiment by referring to FIG. 7, FIG. 11, and FIG. 12.

FIG. 7 is a drawing illustrating the electrodes of the semiconductor device 100*b* according to the present embodiment. The configuration of the electrodes is the same as the configuration of the electrodes of the semiconductor device 100*c* according to the fourth embodiment, and a description thereof will be omitted.

Figure 11:
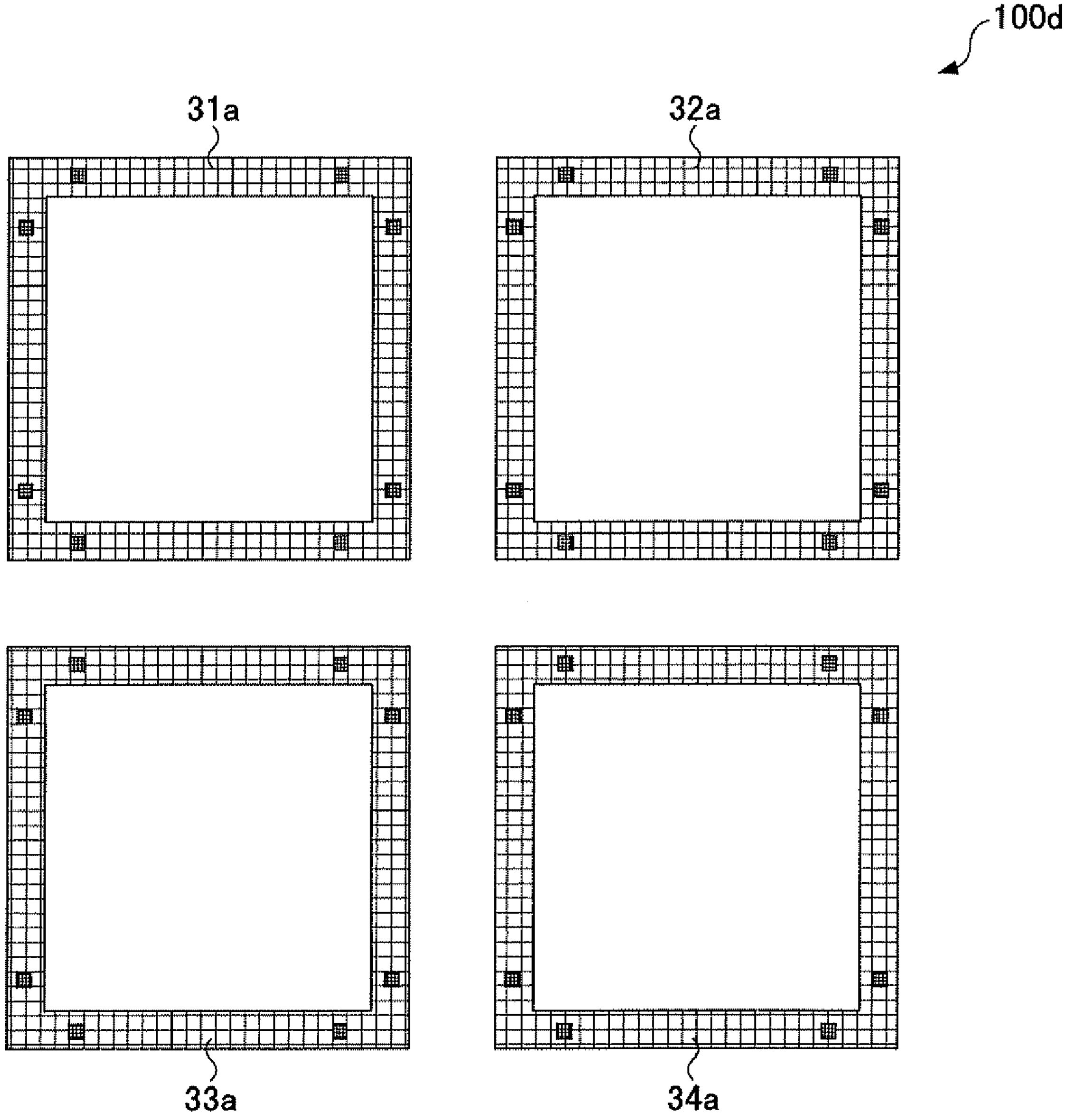
FIG. 11 is a drawing illustrating first metal interconnect layers 31*a* through 34*a* of the semiconductor device 100*d* according to the fifth embodiment.

FIG. 11 is a drawing illustrating first metal interconnect layers 31*a* through 34*a* of the semiconductor device 100*d* according to the fifth embodiment. In FIG. 11, the first metal interconnect layers 31*a* through 34*a* have such size as to enclose the upper electrodes CU11 through CU14 of the capacitor cells C11 through C14, respectively. Further, the first metal interconnect layers 31*a* through 34*a* are configured such that the four corners thereof are coupled to the contact holes 21*a* through 24*a* situated below and the via holes 41 through 44 situated above.

The first metal interconnect layers 31*a* through 34*a* of the semiconductor device 100*d* of the present embodiment each have a rectangular shape to enclose the upper electrodes CU11 through CU14, respectively. No input interconnects are directly connected to the first metal interconnect layers 31*a* through 34*a*. However, the first metal interconnect layers 31*a* through 34*a* are electrically coupled to the input interconnects indirectly through the second metal interconnect layer 70. The first metal interconnect layers 31*a* through 34*a* thus serve as shield interconnect sections.

Figure 12:
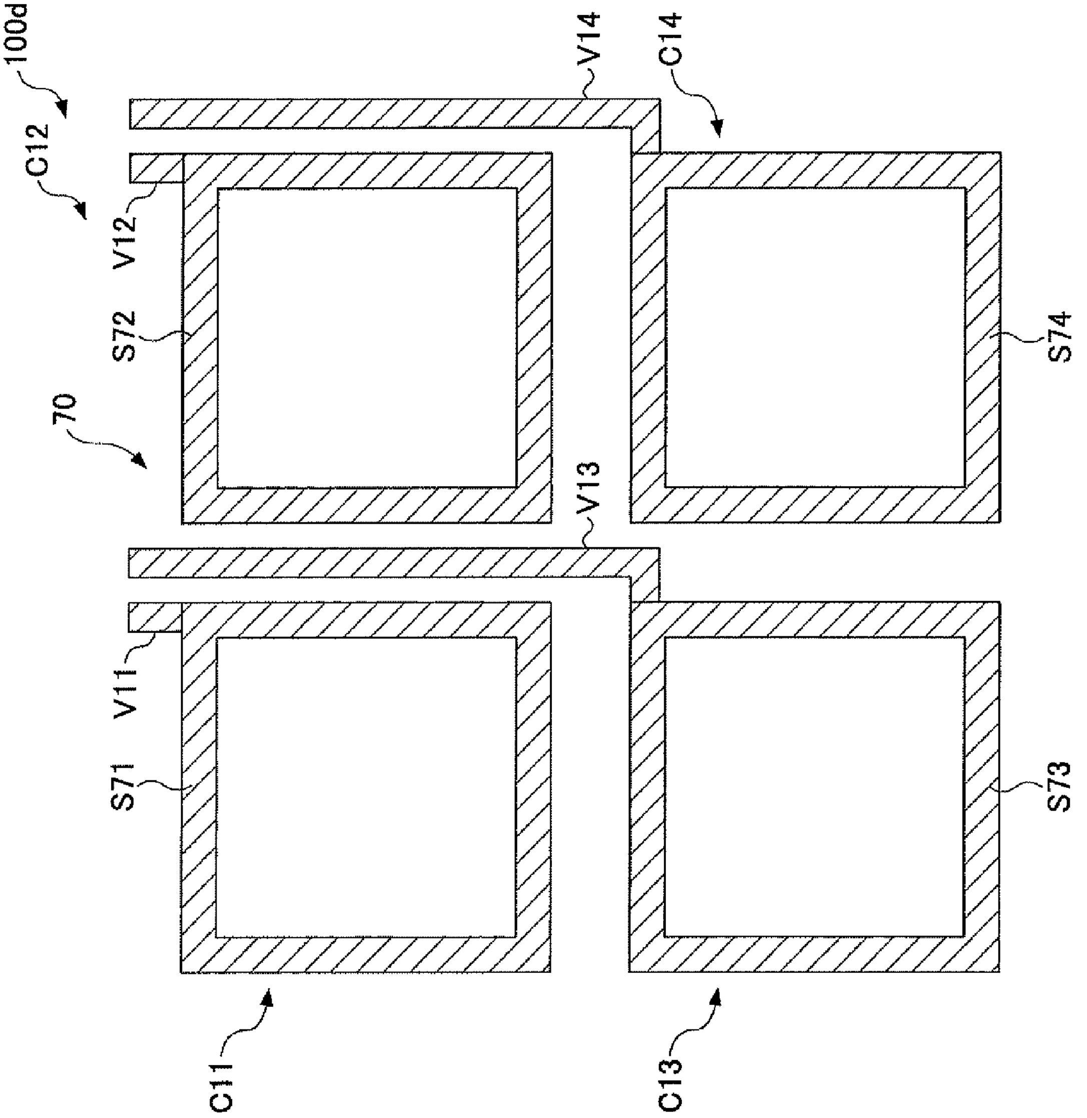
FIG. 12 is a drawing illustrating the plane configuration of the second metal interconnect layer 70 of the semiconductor device 100*d* according to the fifth embodiment.

FIG. 12 is a plan view illustrating the plane configuration of the second metal interconnect layer 70 of the semiconductor device 100*d* according to the fifth embodiment. In FIG. 12, the second metal interconnect layer 70 includes the shield interconnect sections S71 through S74 to enclose the respective capacitor cells C11 through C14 as viewed from above, and further includes the input interconnects V11 through V14 coupled to the respective shield interconnect sections S71 through S74. In the fourth embodiment, the first metal interconnect layer 30 includes the input interconnects V11 through V14. In the fifth embodiment, on the other hand, the second metal interconnect layer 70 includes the shield interconnect sections S71 through S74 and the input interconnects V11 through V14. In the present embodiment, therefore, signals are supplied through the input interconnects V11 through V14 of the second metal interconnect layer 70, and are applied to the lower electrodes CL11 through CL14 via the shield interconnect sections S71 through S74 and the first metal interconnect layers 31*a* through 34*a*, respectively. For example, the input interconnect V13 is coupled to the lower electrode CL13 of the capacitor cell C13 via the shield interconnect section S73 and the first metal interconnect layer 33*a*. The input interconnect V13 is thus set at the same potential as the lower electrode CL13.

Referring to FIG. 10 again, with an appreciation of the plane configuration illustrated in FIG. 7, FIG. 11, and FIG. 12 as viewed from above, the input interconnect V13 and the lower electrode CL13 are set at the same potential in FIG. 10. Parasitic capacitance with the input interconnect V13 is thus likely to be created by an inner edge of the upper electrode CU11 of the capacitor cell C11 on the same side as the input interconnect V13 and by an inner edge of the upper electrode CU12 of the capacitor cell C12 on the same side as the input interconnect V13. The input interconnect V13 and the upper electrodes CU11 and CU12 are shielded from each other by the inner portion of the first metal interconnect layers 31*a* and 32*a* and the shield interconnect sections S71 and S72 of the second metal interconnect layer 70. Thus, the main component of the parasitic capacitances between the input interconnect V13 and the upper electrodes CU11 and CU12 is reduced. Namely, electric lines of force connecting between the inner edges of the upper electrodes CU11 and CU12 and the input interconnect V13 are blocked by the first metal interconnect layers 31*a* and 32*a* if they take the shortest distance route. The electric lines of force can only exist by taking a roundabout route passing over the shield interconnect sections S71 and S72. The main component of the electric lines of force can thus be almost entirely eliminated.

In this manner, the semiconductor device 100*d* of the present embodiment can significantly reduce parasitic capacitances even when the interconnect structure for supplying inputs to the lower electrodes CL11 through CL14 has a two-layer metal interconnect structure, thereby significantly decreasing capacitance mismatches between the capacitor cells C11 through C14.

The present embodiment has been described with respect to an example in which the input interconnect structure has a two-layer metal interconnect structure for the purpose of facilitating the understanding of the invention. Notwithstanding this, the present embodiment is applicable to a multilayer interconnect structure having a larger number of layers. For example, the input interconnects V11 through V14 for supplying input signals may be situated in the n-th layer. In such a case, the first to (n−1)-th layers may be configured to have similar configurations to the configuration of the first metal interconnect layers 31*a* through 34*a* of the semiconductor device 100*d* of the present embodiment as illustrated in FIG. 11, and the n-th layer may be configured to have the configuration that includes the shield interconnect sections S71 through S74 as illustrated in FIG. 12.

Figure 13:
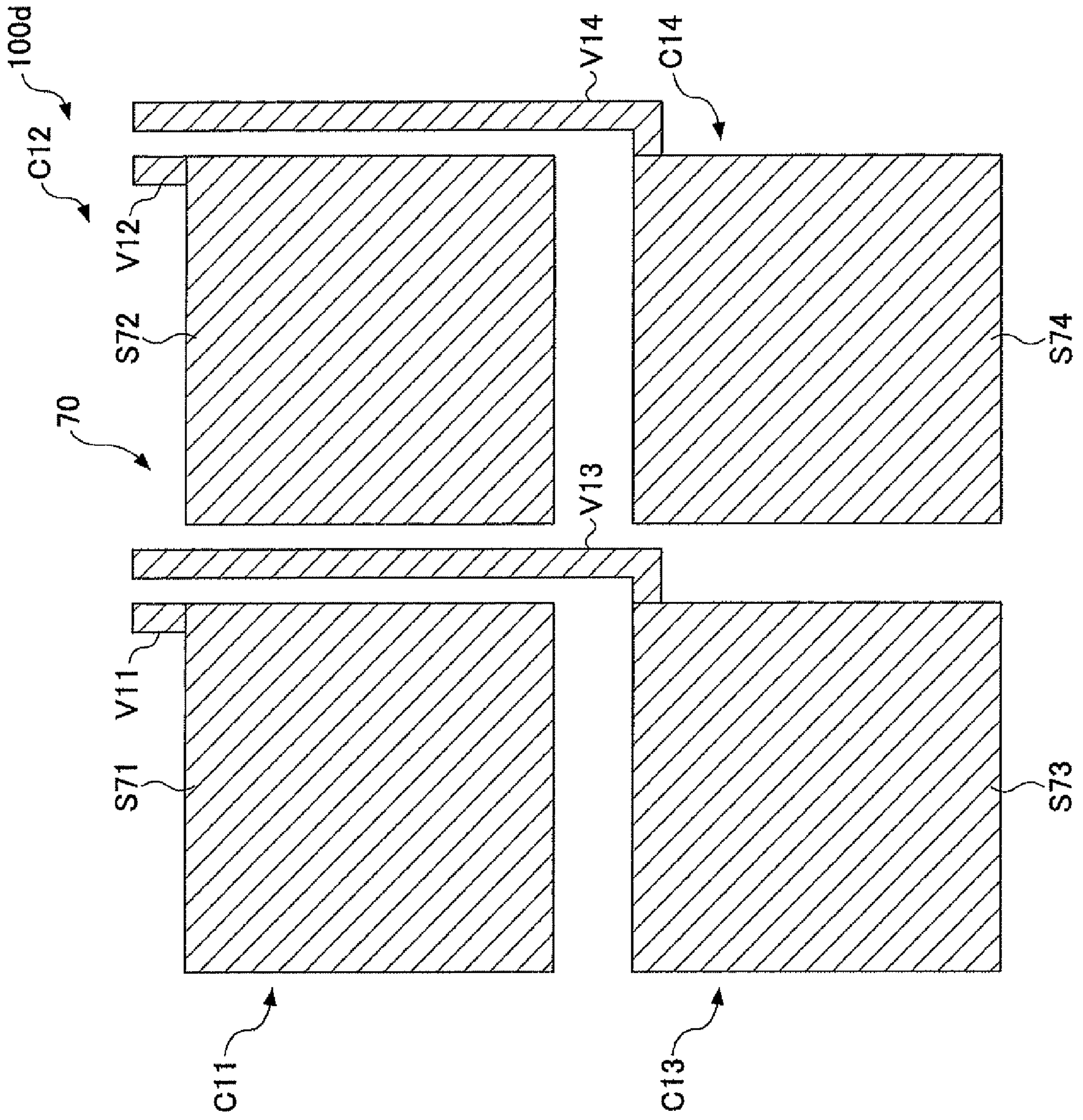
FIG. 13 is a drawing showing a variation of the fifth embodiment.

In the following, a variation of the fifth embodiment will be described by referring to FIG. 13. FIG. 13 is a drawing illustrating a configuration of the semiconductor device 100*d* in which the shield interconnect sections S71 through 374 of the second metal interconnect layer 70 are configured to serve as caps to cover the upper electrodes CU11 through CU14, respectively. In this manner, the second metal interconnect layer 70 may be configured to cover the upper electrodes CU11 through CU14.

This configuration can almost entirely eliminate the parasitic capacitances created between the upper electrodes CU11 through CU14 and the input interconnects V11 through V14, thereby significantly reducing capacitance mismatches.

If the input interconnects V11 through V14 are formed in the n-th layer of a multilayer metal interconnect structure, the shield interconnect sections in the n-th layer may be configured to have such a cap structure. With this arrangement, the configuration of the present embodiment is applicable to the semiconductor device 100*d* having a multilayer metal interconnect structure.

Sixth Embodiment

Figure 14:
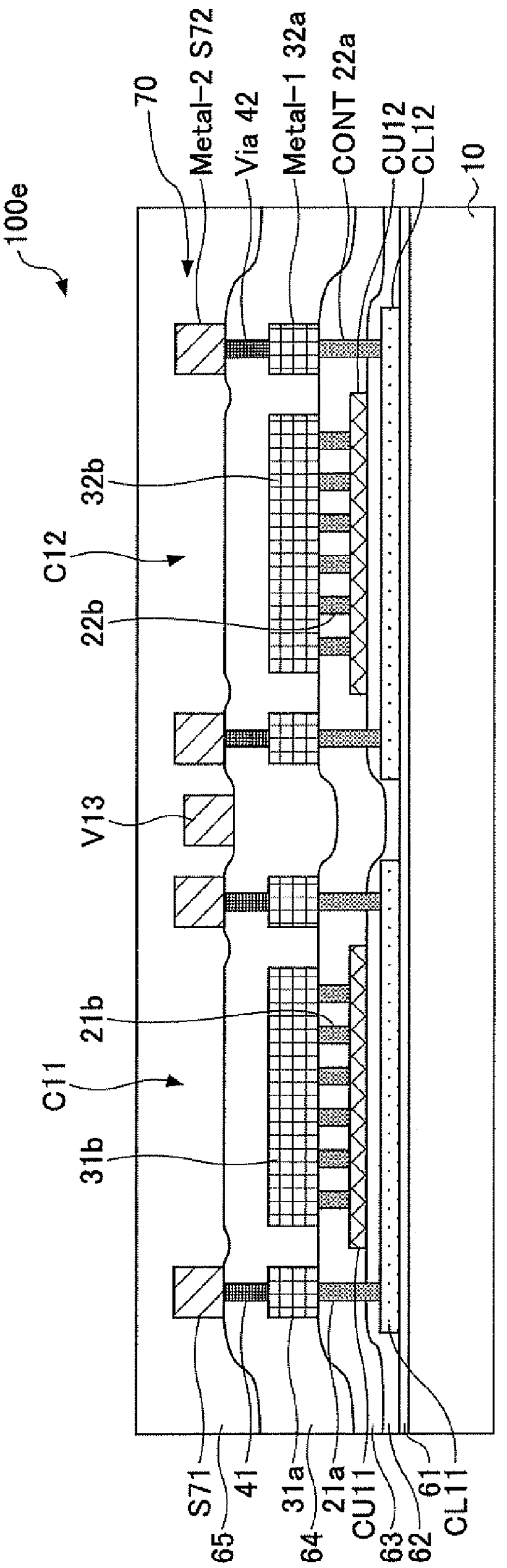
FIG. 14 is a cross-sectional view of the semiconductor device 100*e* according to the sixth embodiment.

In the following, a description will be given of a semiconductor device 100*e* according to a sixth embodiment. FIG. 14 is a cross-sectional view of the semiconductor device 100*e* according to the sixth embodiment. With respect to the sixth embodiment, a description will be given of an example in which a two-layer metal interconnect structure is employed, and the output from the upper electrodes is transmitted through the first metal interconnect layer. The same elements as those of the fifth embodiment are referred to by the same reference symbols.

In FIG. 6, the semiconductor device 100*e* according to the sixth embodiment includes capacitor cells C11 and C12 formed on a semiconductor substrate 10 made of silicon or the like. In the same fashion as previously described, the capacitor cells C11 and C12 may have an identical configuration to serve as a unit capacitance. The capacitor cells C11 and C12 may be formed over an insulating layer 61 comprised of an insulating oxide film made of silicon dioxide or the like or an insulating film layer made of a nitride film disposed on the semiconductor substrate 10. The capacitor cells C11 and C12 have upper electrodes CU11 and CU12 and lower electrodes CL11 and CL12, respectively, which are situated to face each other across an insulating layer 62. The lower electrodes CL11 and CL12 and the upper electrodes CU11 and CU12 may be made of a poly-crystal conductive material such as polysilicon. Contact holes 21*a* and 22*a* are formed on the lower electrodes CL11 and CL12, respectively, and contact holes 21*b* and 22*b* are formed on the upper electrodes CU11 and CU12, respectively. The lower electrodes CL11 and CL12 are coupled to the first metal interconnect layers 31*a* and 32*a* via the contact holes 21*a* and 22*a*, respectively. The upper electrodes CU11 and CU12 are coupled to first metal interconnect layers 31*b* and 32*b* via the contact holes 21*b* and 22*b*, respectively. The first metal interconnect layers 31*a* and 32*a* are connected to the via holes 41 and 42 situated above, respectively, which are then connected to the corresponding shield interconnect sections S71 and S72 forming part of the second metal interconnect layer 70, which is an upper layer. The second metal interconnect layer 70 further includes the input interconnect V13. The contact holes 21*a*, 22*a*, 21*b*, and 22*b*, the first metal interconnect layers 31*a*, 32*a*, 31*b*, and 32*b*, the via holes 41 and 42, and the second metal interconnect layer 70 may all be implemented by an interconnection-purpose metal such as aluminum, copper, or the like. Such a multilayer metal interconnect structure provides electrical couplings for the lower electrodes CL11 and CL12 and upper electrodes CU11 and CU12 of the respective capacitor cells C11 and C12. The contact holes 21*a*, 22*a*, 21*b*, and 22*b* may be covered by the insulating layer 63, and the first metal interconnect layers 31*a*, 32*a*, 31*b*, and 32*b* may be covered by the insulating layer 64, with the second metal interconnect layer 70 covered by the insulating layer 65, thereby completing a multilayer interconnect structure.

In the following, the plane interconnect structure of the semiconductor device 100*e* will be described by referring to FIG. 15 through FIG. 17.

Figure 15:
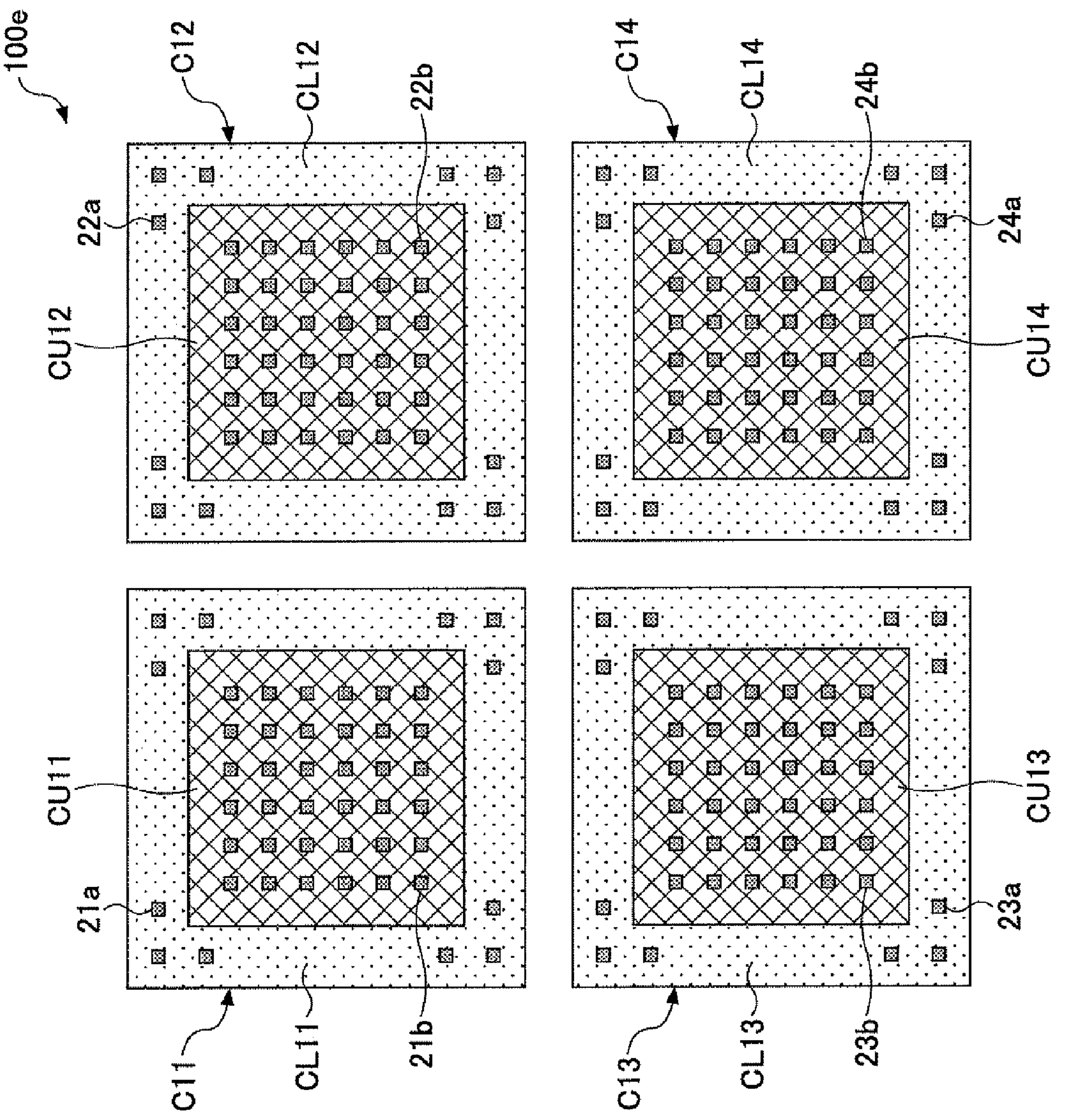
FIG. 15 is a transparent plan view of the semiconductor device 100*e* according to the sixth embodiment.

FIG. 15 is a transparent plan view of the semiconductor device 100*e* illustrated in FIG. 14. In FIG. 7, capacitor cells C11 through C14 are arranged in a 2-by-2 matrix form. The capacitor cells C11 through C14 have lower electrodes CL11 through CL14, respectively, and further have upper electrodes CU11 through CU14 inside the lower electrodes CL11 through CL14, respectively. Contact holes 21*a* through 24*a* are formed at the four corners of each of the lower electrodes CL11 through CL14 for the purpose of providing electrical couplings between the lower electrodes CL11 through CL14 and the first metal interconnect layers 31*a* through 34*a*, respectively. Further, the contact holes 21*b* through 24*b* are provided for the purpose of providing electrical couplings between the upper electrodes CU11 through CU14 and the first metal interconnect layers 31*b* through 34*b*, respectively.

Figure 16:
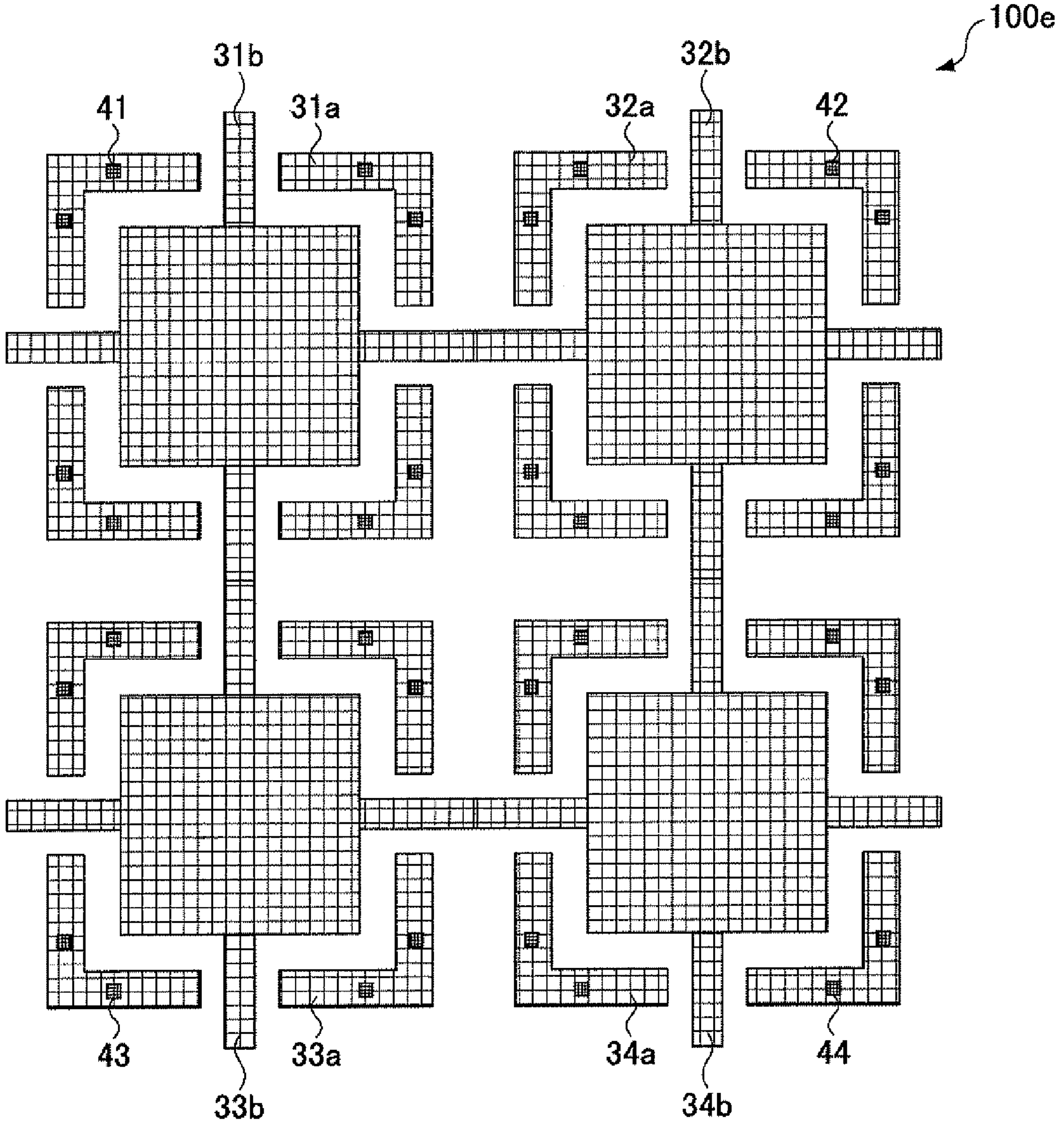
FIG. 16 is a drawing illustrating the plan configuration of the first metal interconnect layer of the semiconductor device 100*e* according to the sixth embodiment.

FIG. 16 is a drawing illustrating the plane configuration of the first metal interconnect layers 31*a* through 34*a* and 31*b* through 34*b* of the semiconductor device 100*e*. In FIG. 16, the first metal interconnect layers 31*b* through 34*b* situated at the centers of the respective capacitor cells C11 through C14 are the interconnect pattern that provides electrical couplings for the upper electrodes CU11 through CU14 of the capacitor cells C11 through C14, respectively. In FIG. 16, the output is supposed to be a common terminal, so that the upper electrodes CU11 through CU14 are electrically connected together to serve as a common electrode. The first metal interconnect layers 31*a* through 34*a* having an L-letter shape insulated from each other are provided at the four corners of each of the capacitor cells C11 through C14, respectively. With this arrangement, signals are independently supplied to the respective lower electrodes CL11 through CL14. Further, via holes 41 through 44 are formed at the corners of the first metal interconnect layers 31*a* through 34*a*, respectively, for the purpose of providing electrical couplings with the second metal interconnect layer.

Figure 17:
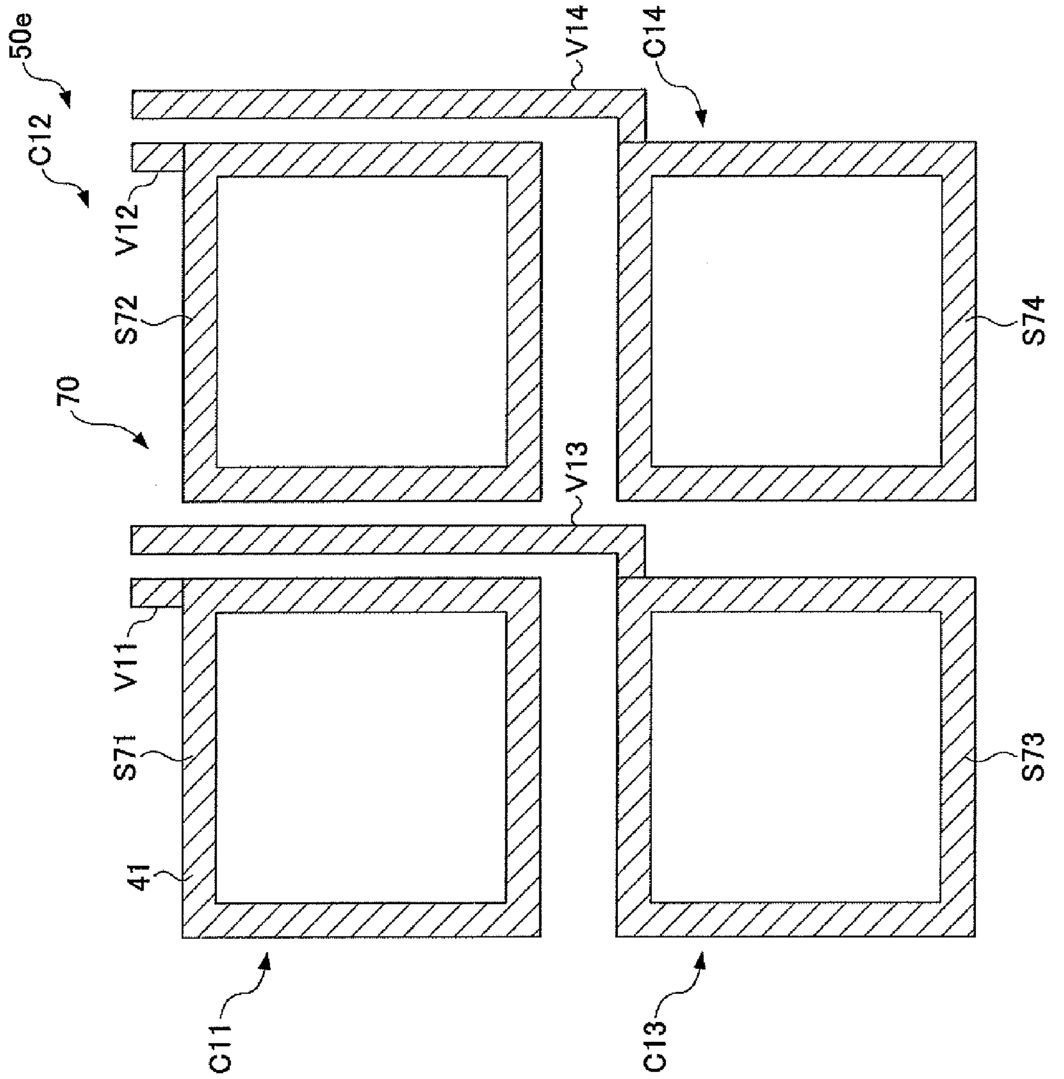
FIG. 17 is a drawing illustrating the plan configuration of the second metal interconnect layer of the semiconductor device 100*e* according to the sixth embodiment.

FIG. 17 is a drawing showing a plane configuration of the second metal interconnect layer 70. In FIG. 17, the second metal interconnect layer includes the shield interconnect sections S71 through S74 having substantially the same shape as the lower electrodes CL11 through CL14 in such a size as to enclose the upper electrodes CU11 through CU14 of the capacitor cells C11 through C14, respectively. This arrangement means that the upper electrodes CU11 through CU14 are fully enclosed and shielded in a plane structure as viewed from above. The second metal interconnect layer 70 further includes the input interconnects V11 through V14 to supply signals to the respective capacitor cells C11 through C14. The input interconnects V11 through V14 are coupled to signal supply lines that are provided outside the capacitor array 50*e*, and applies signals to the capacitor cells via the shield interconnect sections S71 through S74, respectively.

In FIG. 17, the input interconnect V13 is situated between the adjacent capacitor cells C11 and C12. However, since the capacitor cell C11 is shielded by the shield interconnect section S71 and the capacitor cell C12 is shielded by the shield interconnect section S72, the conditions are not conducive to the creation of parasitic capacitance by the input interconnect V13.

Referring to the cross-sectional view of FIG. 14 again with an appreciation of the plane interconnect structure described in connection with FIG. 15 through FIG. 17, a further detailed description will be given of the semiconductor device 100*e* of the sixth embodiment.

In FIG. 14, the input interconnect V13 is formed in the second metal interconnect layer 70, and the shield interconnect sections S71 and S72 are also formed in the second metal interconnect layer 70. The shield interconnect sections S71 and S72 of the second metal interconnect layer 70 are coupled to the first metal interconnect layers 31*a* and 32*a* through the via holes 41 and 42, respectively, and are thence coupled to the lower electrodes CL11 and CL12 through the contact holes 21*a* and 22*a*, respectively. The upper electrodes CU11 and CU12 are coupled to first metal interconnect layers 31*b* and 32*b* via the contact holes 21*b* and 22*b*, respectively.

In this configuration, the point at which the conditions are conducive to the creation of parasitic capacitance serving as a cause of capacitance mismatch is a point between the input interconnect V13 and an element that is close to the input interconnect V13 and set at the same potential as the upper electrodes CU11 and CU12. In FIG. 14, thus, parasitic capacitances are created at the point between the input interconnect V13 and an inner edge of the first metal interconnect layer 31*b* and at the point between the input interconnect V13 and an inner edge of the first metal interconnect layer 32*b*. In FIG. 14, however, these points are shielded by the shield interconnect sections S71 and S72, the via holes 41 and 42, and the first metal interconnect layers 31*a* and 32*a* which are set to the same potential as the lower electrodes CL11 and CL12. This arrangement reduces the parasitic capacitances that are created between the input interconnect V13 and the first metal interconnect layers 31*b* and 32*b*, so that the noise caused by an input signal transmitted through the input interconnect V13 is suppressed. In this configuration, not only the shield interconnect sections S71 and S72 formed in the second metal interconnect layer 70 but also part of the first metal interconnect layers 31*a* and 32*a* and the contact holes 21*a* and 22*a* serve to reduce parasitic capacitance. As illustrated in FIG. 16, the first metal interconnect layers 31*a* and 32*a* situated at the four corners of the respective capacitor cells partly enclose the first metal interconnect layers 31*b* and 32*b* situated at the center. In this manner, the first metal interconnect layers 31*a* and 32*a* of the present embodiment partly serve as shield interconnect sections.

If the shield line structure is not provided in the interconnect structure shown in FIG. 14, the shield interconnect sections S71 and S72 are nonexistent. Further, the first metal interconnect layers 31*a* and 32*a* partly enclosing the respective capacitor cells C11 and C12 are also needless and nonexistent. In such a case, parasitic capacitances are created between the lower face and side face of the input interconnect V13 and the first metal interconnect layers 31*b* and 32*b* and between the lower face and side face of the input interconnect V13 and the upper electrodes CU11 and CU12. Contrary to such a configuration, the semiconductor device 100*e* of the present embodiment has the shield interconnect sections S71 and S72 enclosing the respective upper electrodes CU11 and CU12 as viewed from above in the second metal interconnect layer 70 that is the same layer as the input interconnect V13. Further, the first metal interconnect layers 31*a* and 32*a* are configured to partly enclose the respective upper electrodes CU11 and CU12 as viewed from above. With this configuration, parasitic capacitance can be reduced even when the input interconnect V13 is formed in the second metal interconnect layer 70 of the multilayer metal interconnect structure.

When the present invention is applied to the semiconductor device 100*e* of the present embodiment having a multilayer metal interconnect structure in which the input interconnect V13 is situated in the second metal interconnect layer 70 as described above, the shield interconnect sections S71 and S72 are formed in the second metal interconnect layer 70, and the first metal interconnect layers 31*a* and 32*a* are also configured to exert a shielding effect. With this arrangement, capacitance mismatches caused by parasitic capacitances are effectively reduced, thereby suppressing the generation of noise.

Capacitor cells may be configured such that metal interconnect layers fully cover the upper electrodes as viewed from above as was described in the first through sixth embodiments. In such a case, an input interconnect may be placed over the capacitor cells by providing an intervening insulating layer. This arrangement may fully eliminate the parasitic capacitances between the input interconnects and the upper electrodes, thereby reducing capacitance mismatches caused by the parasitic capacitances and suppressing the generation of noise. In this case, there is no need to place an input interconnect between capacitor cells, which allows the capacitor cells to be spaced at a short interval.

Seventh Embodiment

Figure 18:
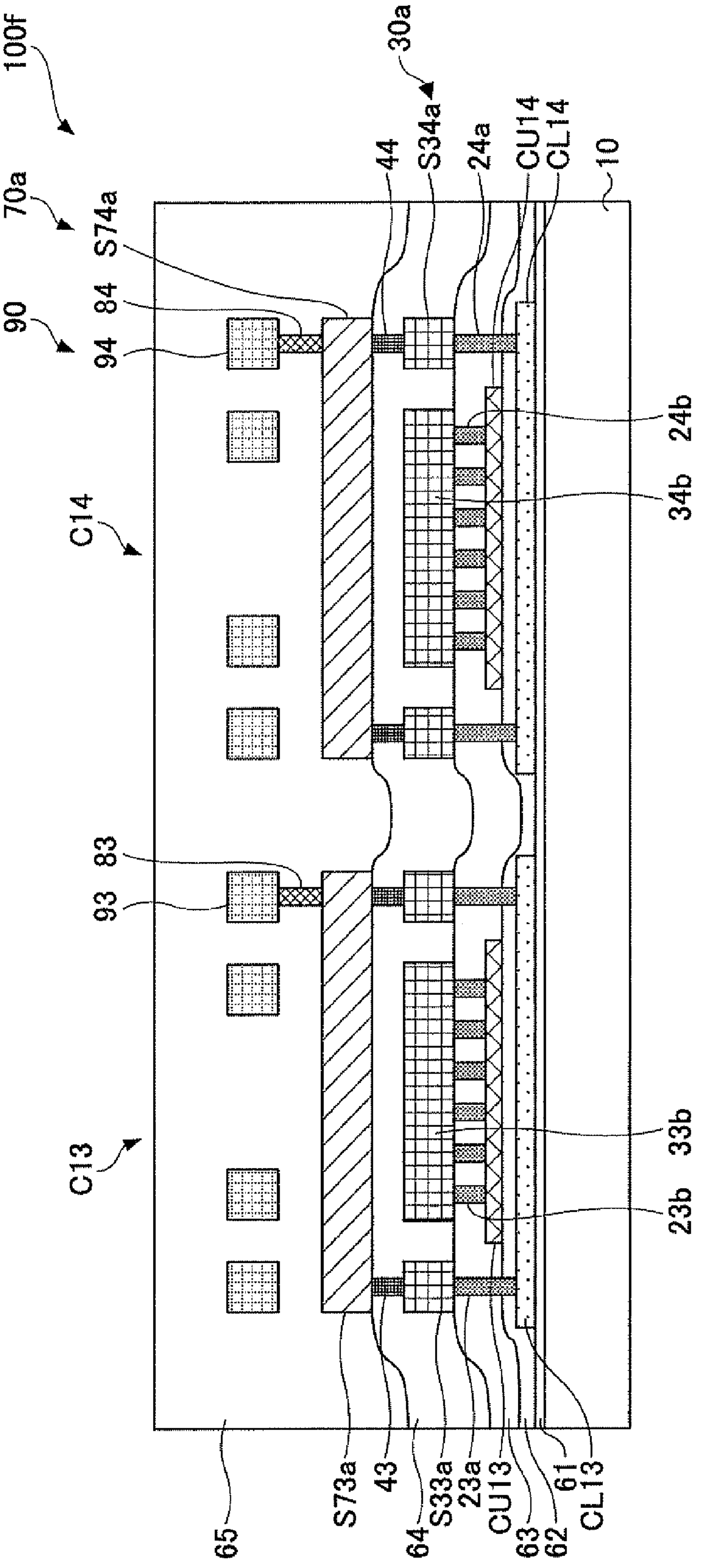
FIG. 18 is a cross-sectional view of the semiconductor device 100*f* according to the seventh embodiment.

FIG. 18 is a drawing showing a cross-sectional configuration of a semiconductor device 100*f* according to a seventh embodiment of the present invention. FIG. 18 illustrates two capacitor cells C13 and C14 arranged adjacent to each other, which are part of the semiconductor device 100*f* of the seventh embodiment. The same elements as those of the sixth embodiment are referred to by the same reference symbols, and a brief description thereof will be given.

In FIG. 18, the semiconductor device 100*f* according to the seventh embodiment includes the lower electrodes CL13 and CL14 of the capacitor cells C13 and C14 formed above a semiconductor substrate 10 made of silicon or the like with an intervening insulating layer 61. Further, the upper electrodes CU13 and CU14 of the respective capacitor cells C13 and C14 are disposed to face the lower electrodes CL13 and CL14, respectively, across the insulating layer 62 intervening therebetween. The lower electrodes CL13 and CL14 and the upper electrodes CU13 and CU14 may be made of a polycrystal material such as polysilicon as has been described heretofore.

A first metal interconnect layer 30*a* is formed above the upper electrodes CU13 and CU14 with an intervening insulating layer 63. In the first metal interconnect layer 30*a*, first metal interconnect layers S33*a* and S34*a* disposed at the outer frame of the respective capacitor cells C13 and C14 are electrically coupled to the lower electrodes CL13 and CL14 through contact holes 23*a* and 24*a*, respectively. In the first metal interconnect layer 30*a*, first metal interconnect layers S33*b* and S34*b* disposed in the central areas of the respective capacitor cells C13 and C14 are electrically coupled to the upper electrodes CU13 and CU14 through contact holes 23*b* and 24*b*, respectively. The first metal interconnect layers S33*a* and S34*a* at the outer frames enclose the first metal interconnect layers S33*b* and S34*b* in the central areas, respectively, and enclose the upper electrodes CU13 and CU14, respectively, as viewed from above. Namely, the outer frame portions of the first metal interconnect layer 30*a* serve as the shield interconnect sections S33*a* and S34*a*. The details of this plane configuration will be described later.

A second metal interconnect layer 70*a* is disposed above the first metal interconnect layer 30*a* with an intervening insulating layer 64. In the second metal interconnect layer 70*a*, plane-shape shield interconnect sections S73*a* and S74*a* are formed to fully cover the upper electrodes CU13 and CU14 of the capacitor cells C13 and C14, respectively. The plane-shape shield interconnect sections S73*a* and S74*a* are connected to and electrically coupled to the outer first metal interconnect layers S33*a* and S34*a* through via holes 43 and 44, respectively.

A third metal interconnect layer 90 is disposed above the second metal interconnect layer 70*a* with an intervening insulating layer 65. The third metal interconnect layer 90 includes third metal interconnect layers 93 and 94 corresponding to the capacitor cells C13 and C14, respectively. Each of the third metal interconnect layers 93 and 94 includes four metal interconnects situated over the corresponding one of the capacitor cells C13 and C14. The metal on the right-hand side is electrically coupled to the shield interconnect section S73*a* or S74*a* of the second metal interconnect layer 70*a* through a via hole 83 or 84, respectively. The third metal interconnect layers 93 and 94 are coupled to the lower electrodes CL13 and CL14 through the via holes 83 and 84, the second metal interconnect layers S73*a* and S74*a*, the via holes 43 and 44, the first metal interconnect layers S33*a* and S34*a*, and the contact holes 23*a* and 24*a*, respectively. Signals input into the lower electrodes CL13 and CL14 may be supplied from the third metal interconnect layers 93 and 94, respectively, for example. The shield interconnect sections S73*a* and S74*a* of the second metal interconnect layer 70*a* are metal plates set at the same potentials as the input signals. The shield interconnect sections S73*a* and S74*a* cover and shield the upper electrodes CU13 and CU14 and the center first metal interconnect layers S33*b* and S34*b* connected thereto, respectively. The shield interconnect sections S33*a* and S34*a* of the first metal interconnect layer 30*a* coupled to the lower electrodes CL13 and CL14 also enclose the upper electrodes CU13 and CU14 and the center first metal interconnect layers S33*b* and S34*b* as viewed from above. The shield interconnect sections S33*a* and S34*a* are thus also set at the same potentials as the input signals to shield the upper electrodes CU13 and CU14, respectively.

In this manner, an interconnect layer (i.e., the third metal interconnect layer 90) situated above the shield interconnect sections S33*a*, S34*a*, S73*a*, and S74*a* is used for interconnection purposes for the capacitor cells C13 and C14. This arrangement allows the capacitor cells C13 and C14 to be spaced at a short interval, thereby reducing the layout area size of the semiconductor device 100*f*.

In the following, a description will be given of the plane configuration of the semiconductor device 100*f* according to the seventh embodiment. The upper electrodes CU13 and CU14 and lower electrodes CL13 and CL14 of the respective capacitor cells C13 and C14 have the same configuration as the configuration shown in FIG. 15 described in connection with the sixth embodiment. With respect to the sixth embodiment, a description has been given by referring to the capacitor cells C11 and C12 as an example. On the other hand, the capacitor cells C13 and C14 are referred to as an example in the seventh embodiment. This is the only difference. Further, the arrangements of the upper electrodes CU11 through CU14, the lower electrodes CL11 through CL14, and the contact holes 21*a* through 24*a* and 21*b* through 24*b* are the same as those illustrated in FIG. 15, and a description thereof will be omitted.

Figure 19:
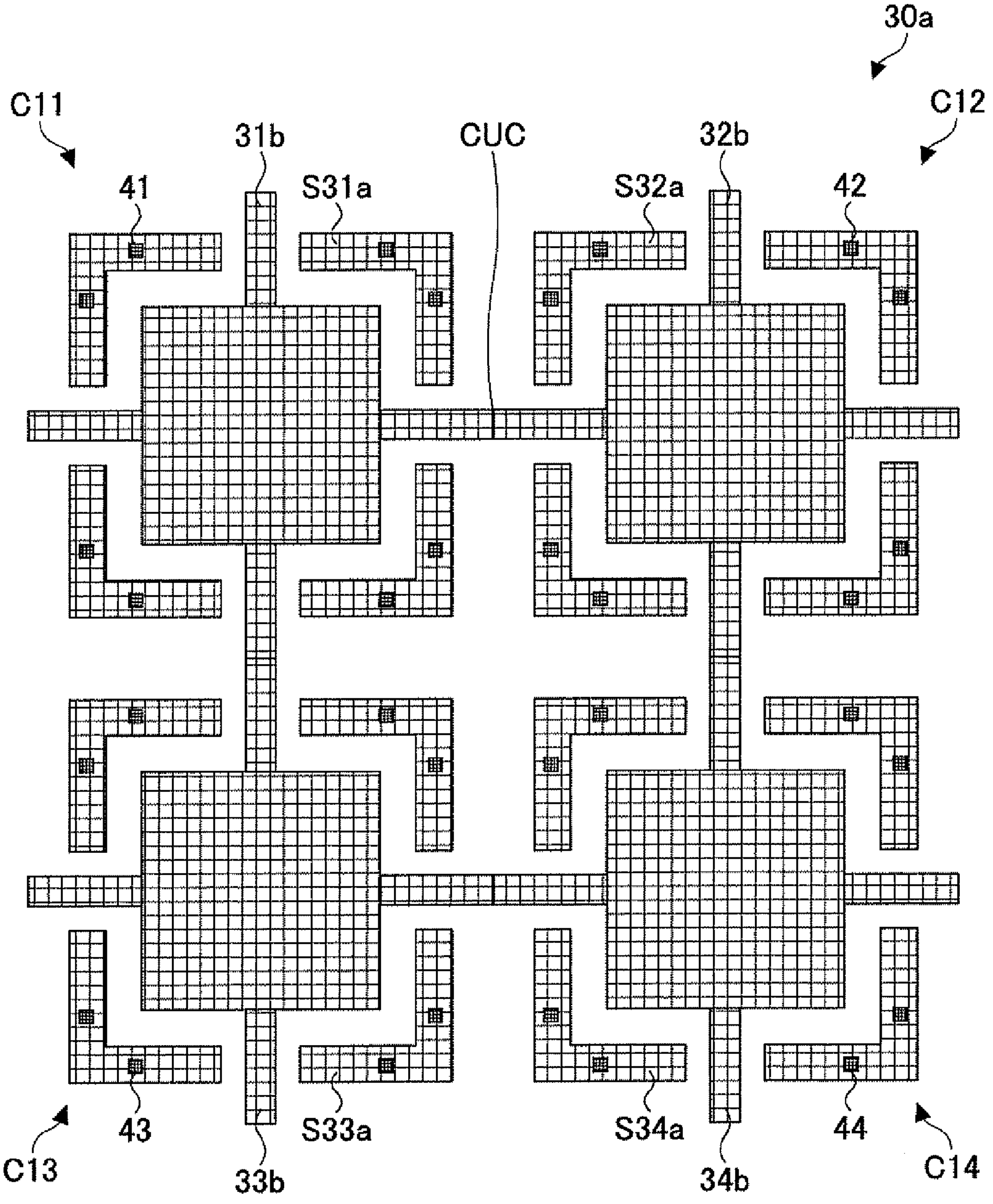
FIG. 19 is a drawing illustrating the plan configuration of the first metal interconnect layer 30*a* of the semiconductor device 100*f*.

FIG. 19 is a drawing illustrating the plane configuration of the first metal interconnect layer 30*a* of the semiconductor device 100*f* according to the seventh embodiment. As can be seen from FIG. 19, the upper electrodes CU11 through CU14 adjacent to each other in the respective capacitor cells C11 through C14 are electrically connected together through the first metal interconnect layers 31*b* through 34*b* situated at the center and above the upper electrodes CU11 through CU14, respectively. Namely, the center first metal interconnect layers 31*b* through 34*b* adjacent to one another are electrically coupled together via upper electrode connecting sections CUC, so that the upper electrodes CU11 through CU14 collectively constitute one large equipotential upper electrode by being connected together through the first metal interconnect layers 31*b* through 34*b* and the upper electrode connecting sections CUC.

Further, the outer-frame shield interconnect sections S31*a* through S34*a* of the respective capacitor cells C11 through C14 are configured to enclose the upper electrodes CU11 through CU14 of the capacitor cells C11 through C14 and the center first metal interconnect layers 31*b* through 34*b* connected thereto, respectively, as viewed from above. With this arrangement, the shield interconnect sections S31*a* through S34*a* prevent the upper electrodes CU11 through CU14 from creating a parasitic capacitance with an input interconnect for supplying an input signal.

In FIG. 19, the shield interconnect sections S31*a* through S34*a* of the first metal interconnect layer 30*a* are discontinuous and nonexistent at the positions where the upper electrode connecting sections CUC are formed to electrically connect the upper electrodes CU11 through CU14 together through the first metal interconnect layers 31*b* through 34*b*. Notwithstanding this, the shield interconnect sections S31*a* through S34*a* are configured to enclose the respective upper electrodes CU11 through CU14 as viewed from above except for the perimeter points where the upper electrode connecting sections CUC are situated. Namely, the shield interconnect sections S31*a* through S34*a* mostly enclose the respective upper electrodes CU11 through CU14 and the center first metal interconnect layers 31*b* through 34*b*, respectively. In other words, the shield interconnect sections S31*a* through S34*a* substantially enclose the upper electrodes CU11 through CU14, respectively, as viewed from above. Since the shield interconnect sections S31*a* through S34*a* of the first metal interconnect layer 30*a* mostly enclose the respective upper electrodes CU11 through CU14 despite some discontinuous points, the occurrence of parasitic capacitance is effectively prevented. In this manner, the shield interconnect sections S71*a* through S74*a* may be configured to partly enclose the upper electrodes CU11 through CU14, without fully enclosing them, to substantially prevent the creation of parasitic capacitance. Even in this case, enclosing the upper electrodes CU11 through CU14 for half the perimeter may not be sufficient. At least 70% of the perimeter, preferably 80% thereof, or even more preferably 85% thereof may need to be enclosed. Alternatively, a percentage of the perimeter may be computed in terms of the lengths of gaps along the imaginary full enclosure frame obtained by connecting the shield interconnect sections S31*a* through S34*a*. Alternatively, lines normal to the first metal interconnect layers 31*b* through 34*b* in the central area or normal to the upper electrodes CU11 through CU14 are made to extend from the gaps of the shield interconnect sections S31*a* through S34*a*, so that the percentage of the perimeter may be computed in terms of the lengths along the perimeter of the first metal interconnect layers 31*b* through 34*b* or the upper electrodes CU11 through CU14.

Figure 20:
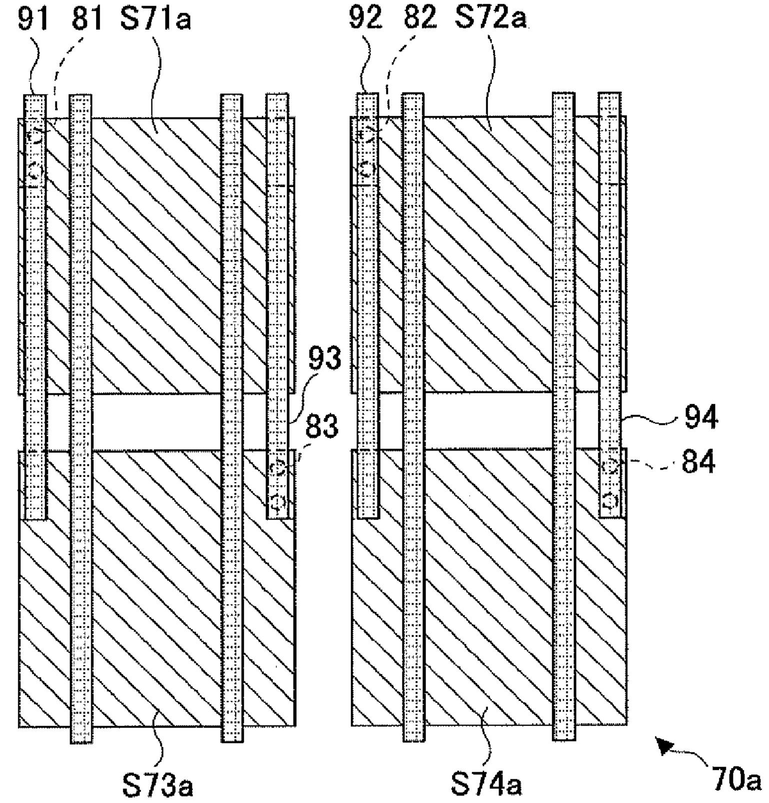
FIG. 20 is a drawing illustrating the plan configuration of the second metal interconnect layer 70*a* of the semiconductor device 100*f*, in which FIG. 20-(*a*) is an enlarged view, and FIG. 20-(*b*) is a wide-area schematic view.
Figure 20:
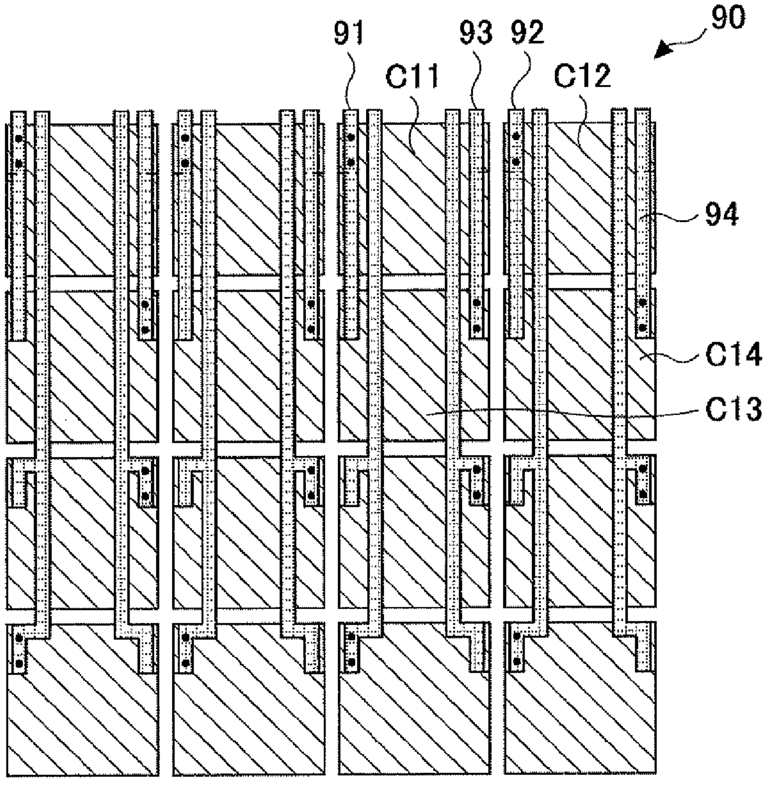

FIG. 20 is a drawing illustrating the plane configuration of the second metal interconnect layer 70*a* of the semiconductor device 100*f* according to the seventh embodiment. FIG. 20-(*a*) shows an enlarged view of the portion corresponding to FIG. 18, and FIG. 20-(*b*) shows a schematic view covering a wider area.

In FIG. 20-(*b*), capacitor cells equal in number to 4×4=16 arranged in a matrix are illustrated. The four capacitor cells arranged at the top right corner are the four capacitor cells C11 through C14 corresponding to FIG. 18. FIG. 20-(*b*) shows an interconnect pattern of the third metal interconnect layer 90 for supplying input signals to the respective capacitor cells. As shown in FIG. 20-(*b*), the third metal interconnect layer 90 is formed so as to traverse the areas over the capacitor cells. The interconnect structure may be configured as described above to supply input signals from one side. FIG. 20-(*b*) also shows third metal interconnect layers 91 through 94 with respect to the four capacitor cells C11 through C14 arranged at the top right corner.

FIG. 20-(*a*) is an enlarged view showing the area of the four capacitor cells C11 through C14 arranged at the top right corner in FIG. 20-(*b*). Second metal interconnect layers 71*a* through 74*a* are shown under the third metal interconnect layers 91 through 94 that extend in a vertical direction. The third metal interconnect layers 91 through 94 are electrically connected to the second metal interconnect layers S71*a* through S74*a* through via holes 81 through 84, respectively. The second metal interconnect layers S71*a* through S74*a* have a plate shape serving as caps to cover the respective capacitor cells C11 through C14, and shield the respective capacitor cells C11 through C14 from above. In this manner, the shield interconnect sections S71*a* through S74*a* may be configured to have a plate shape to cover the respective upper electrodes from above, and the interconnect layer for supplying input signals may be disposed over the shield interconnect sections 571*a* through S74*a*. With this configuration, the upper electrodes CU11 through CU14 are completely shielded. Further, there is no need to provide gaps between the capacitor cells C11 through C14 as a space for laying out an input interconnect. Accordingly, the semiconductor device 100*f* is configured to have high precision while conserving space.

In the semiconductor device 100*f* of the seventh embodiment, further, the shield interconnect sections S31*a* through S34*a* and S71*a* through S74*a* are formed in the first metal interconnect layer 30*a* and the second metal interconnect layer 70*a*, respectively, to constitute a multilayer interconnect structure. The provision of the shield interconnect sections S31*a* through S34*a* and S71*a* through S74*a* in a multilayer structure can further enhance the shielding effect.

Eighth Embodiment

Figure 21:
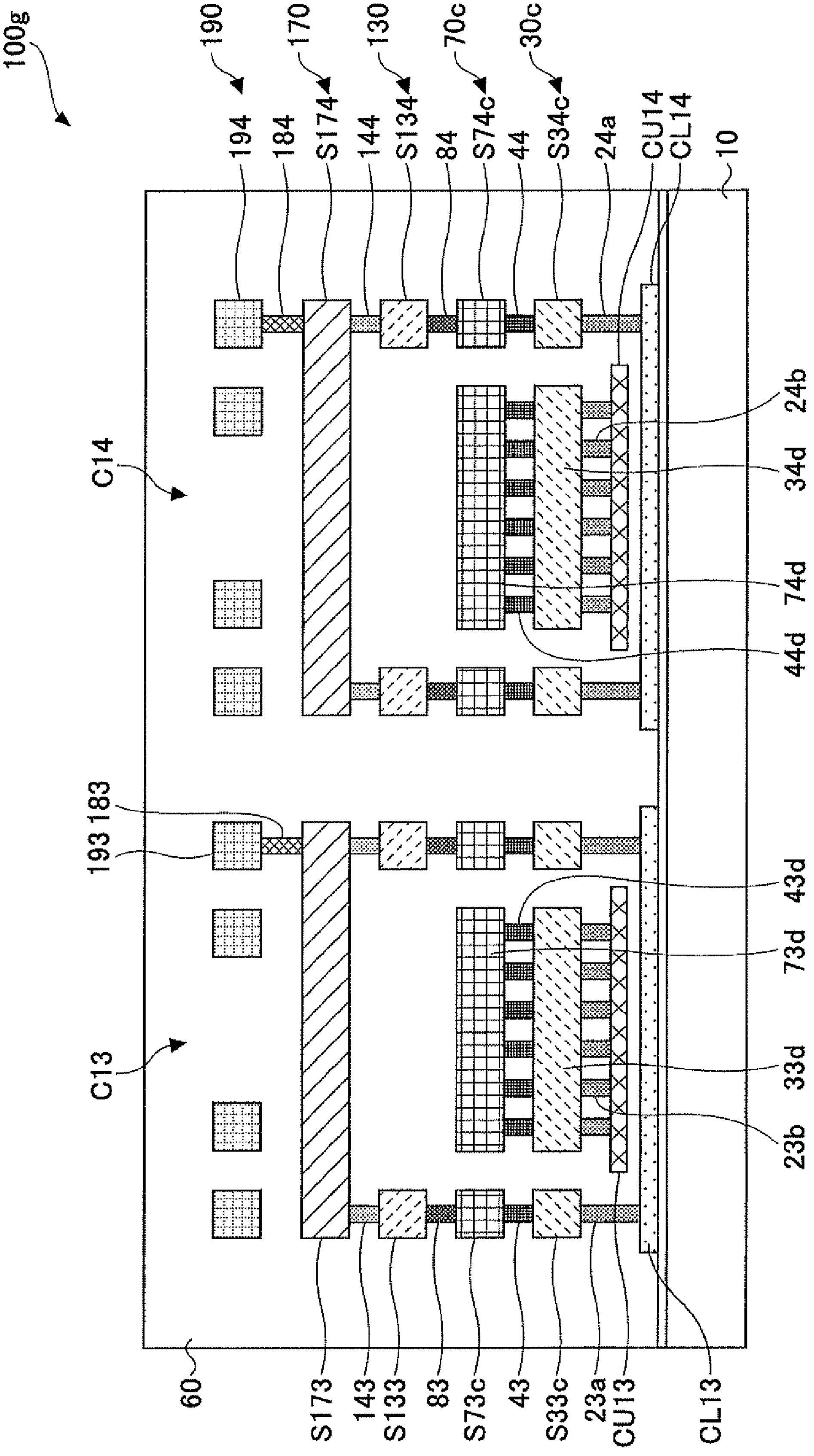
FIG. 21 is a cross-sectional view of the semiconductor device 100*g* according to the eighth embodiment.

FIG. 21 is a drawing showing a cross-sectional configuration of a semiconductor device 100*g* according to an eighth embodiment of the present invention. The semiconductor device 100*g* of the eighth embodiment may be regarded as a variation of the semiconductor device 100*f* of the seventh embodiment. The eighth embodiment expands the multilayer structure of the semiconductor device 100*f* of the seventh embodiment. In FIG. 21, the detailed configuration of insulating layers is omitted, and an insulating layer 60 is shown as a general means to provide insulation between conductive members.

In FIG. 21, the semiconductor device 100*g* of the eighth embodiment includes lower electrodes CL13 and CL14 and upper electrodes CU13 and CU14 disposed to face each other above the semiconductor substrate 10, above all of which a first metal interconnect layer 30*c* is further formed. The first metal interconnect layer 30*c* includes shield interconnect sections S33*c* and S34*c*, which are positioned to correspond to the outer frames of the capacitor cells C13 and C14 and coupled to the lower electrodes CL13 and CL14, respectively. The first metal interconnect layer 30*c* further includes first metal interconnect layers 33*d* and 34*d*, which are positioned to correspond to the central areas of the capacitor cells C13 and C14 and coupled to the upper electrodes CU13 and CU14, respectively. The shield interconnect sections S33*c* and S34*c* at the outer frames are connected to the lower electrodes CL13 and CL14 through contact holes 23*a* and 24*a*, respectively. The first metal interconnect layers 33*d* and 34*d* in the central areas are connected to the upper electrodes CU13 and CU14 through contact holes 23*b* and 24*b*, respectively.

Figure 22:
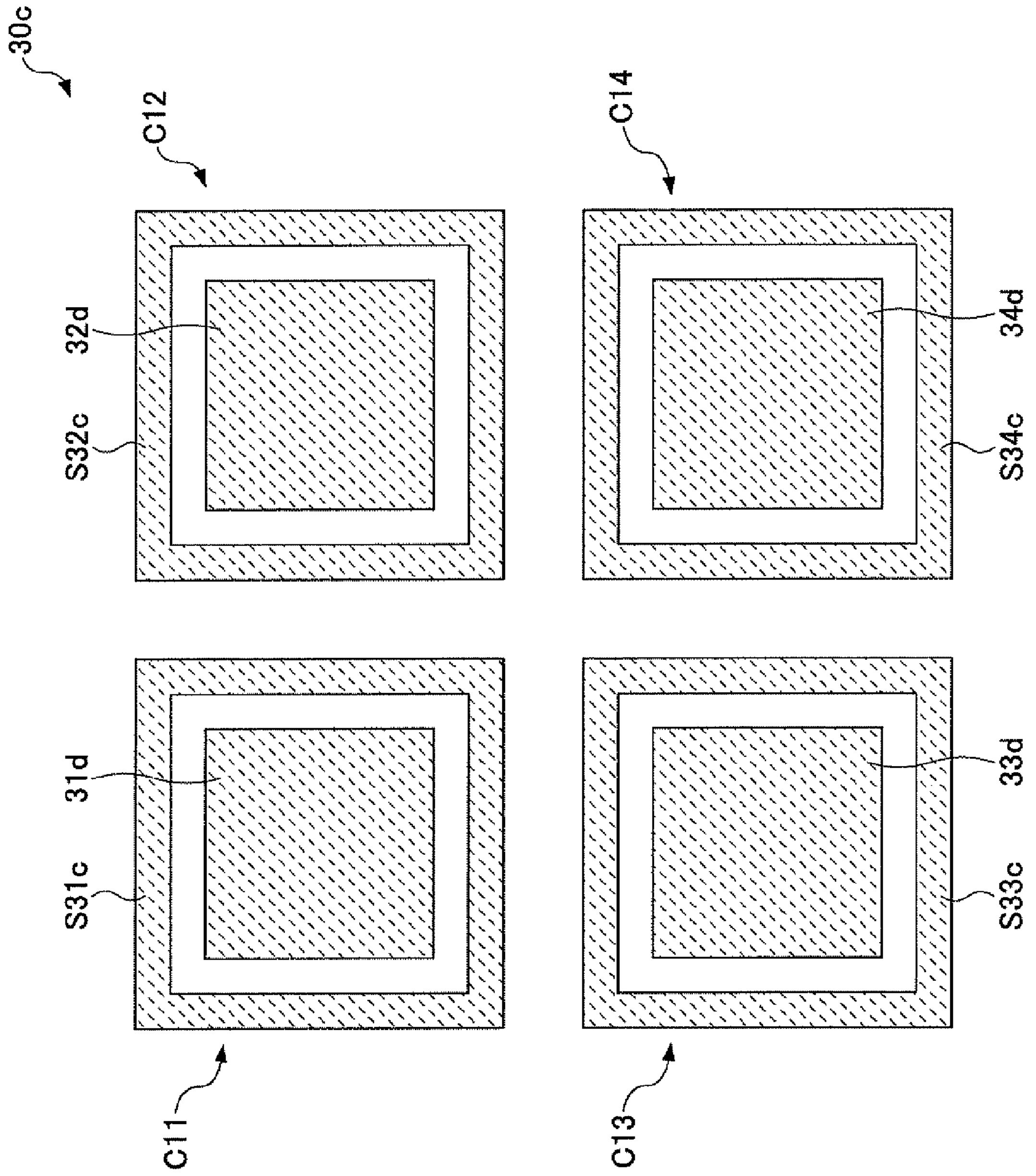
FIG. 22 is a drawing illustrating the plan configuration of the first metal interconnect layer 30*c* of the semiconductor device 100*g*.

FIG. 22 is a drawing illustrating the plane configuration of the first metal interconnect layer 30*c* of the semiconductor device 100*g* according to the eighth embodiment. Interconnect layers 31*d* through 34*d* coupled to the upper electrodes CU11 through CU14 are situated at the centers of the respective capacitor cells C11 through C14. To enclose the interconnect layers 31*d* through 34*d*, the shield interconnect sections S31*c* through S34*c* are disposed and coupled to the lower electrodes CL11 through CL14, respectively. The shield interconnect sections S31*c* through S34*c* are the first metal interconnect layer coupled to the lower electrodes CL11 through CL14 to transmit input signals, and fully enclose the upper electrodes CU11 through CU14, respectively, as viewed from above. Accordingly, the shield interconnect sections S31*c* through S34*c* shield the respective upper electrodes CU11 through CU14 to reduce the creation of parasitic capacitance.

Referring to FIG. 21 again, a second metal interconnect layer 70*c* is disposed above the first metal interconnect layer 30*c*. Like the first metal interconnect layer 30*c*, the second metal interconnect layer 70*c* also includes shield interconnect sections S73*c* and S74*c*, which are positioned to correspond to the outer frames of the capacitor cells C13 and C14 and electrically coupled to the lower electrodes CL13 and CL14, respectively. The second metal interconnect layer 70*c* further includes second metal interconnect layers 73*d* and 74*d*, which are positioned to correspond to the central areas of the capacitor cells C13 and C14 and electrically coupled to the upper electrodes CU13 and CU14, respectively.

The outer shield interconnect sections S73*c* and S74*c* are connected to the shield interconnect sections S33*c* and S34*c* of the first metal interconnect layer 30*c* through via holes 43 and 44, respectively. The inner second metal interconnect layers 73*d* and 74*d* are connected to the inner first metal interconnect layers 33*d* and 34*d* through via holes 43*d* and 44*d*, respectively.

Figure 23:
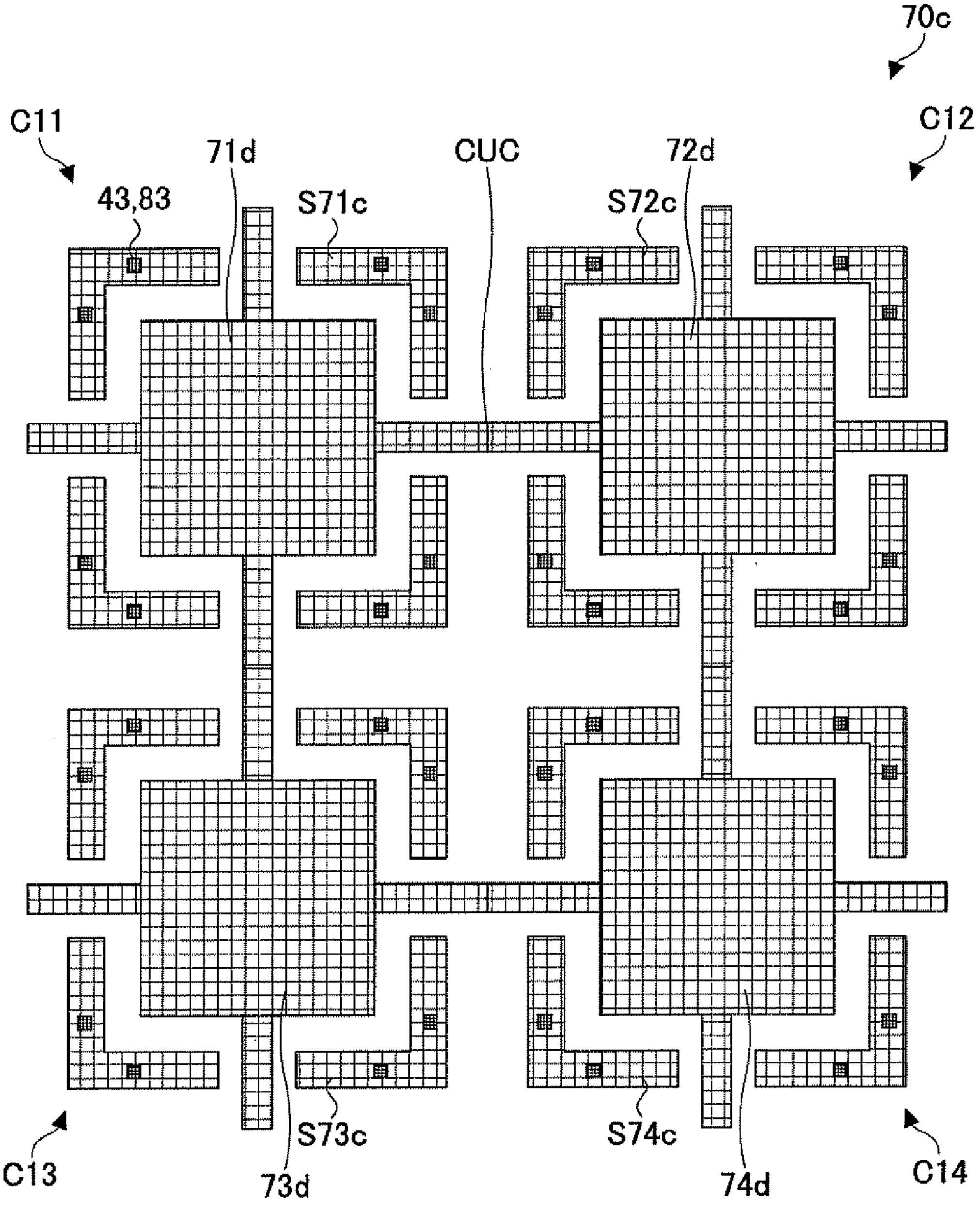
FIG. 23 is a drawing illustrating the plan configuration of the second metal interconnect layer 70*c* of the semiconductor device 100*g*.

FIG. 23 is a drawing illustrating the plane configuration of the second metal interconnect layer 70*c* of the semiconductor device 100*g* according to the eighth embodiment. The plane configuration of the second metal interconnect layer 70*c* is almost the same as the configuration of the first metal interconnect layer 30*a* described in the seventh embodiment in connection with FIG. 19. The second metal interconnect layers S71*d* through S74*d* are formed at the centers of the capacitor cells C11 through C14 as the interconnect layers for the upper electrodes CU11 through CU14, respectively. The second metal interconnect layers S71*d* through S74*d* are connected together through upper electrode connecting sections CUC. Further, shield interconnect sections S71*c* through S74*c* are formed to mostly enclose the respective second metal interconnect layers S71*d* through S74*d* as viewed from above, while leaving gaps for the upper electrode connecting sections CUC to pass through. In this manner, the interconnect layer for connecting the upper electrodes CU13 and CU14 together may be provided in the second metal interconnect layer 70*c* which is above the first metal interconnect layer 30*c*. In so doing, the shield interconnect sections S71*c* through S74*c* coupled to the respective lower electrodes CL13 and CL14 are provided to partly enclose the upper electrodes CU11 through CU14 or the second metal interconnect layers S71*d* through S74*d* connected thereto, respectively, thereby reducing the creation of parasitic capacitance.

Referring to FIG. 21 again, a third metal interconnect layer 130 is disposed above the second metal interconnect layer 70*c*. The third metal interconnect layer 130 includes third metal interconnect layers S133 and S134 corresponding to the capacitor cells C13 and C14, respectively. The third metal interconnect layers S133 and S134 are formed only at the outer frames of the capacitor cells C13 and C14, and serve as interconnect layers to supply input signals to the lower electrodes CL13 and CL14, respectively.

Figure 24:
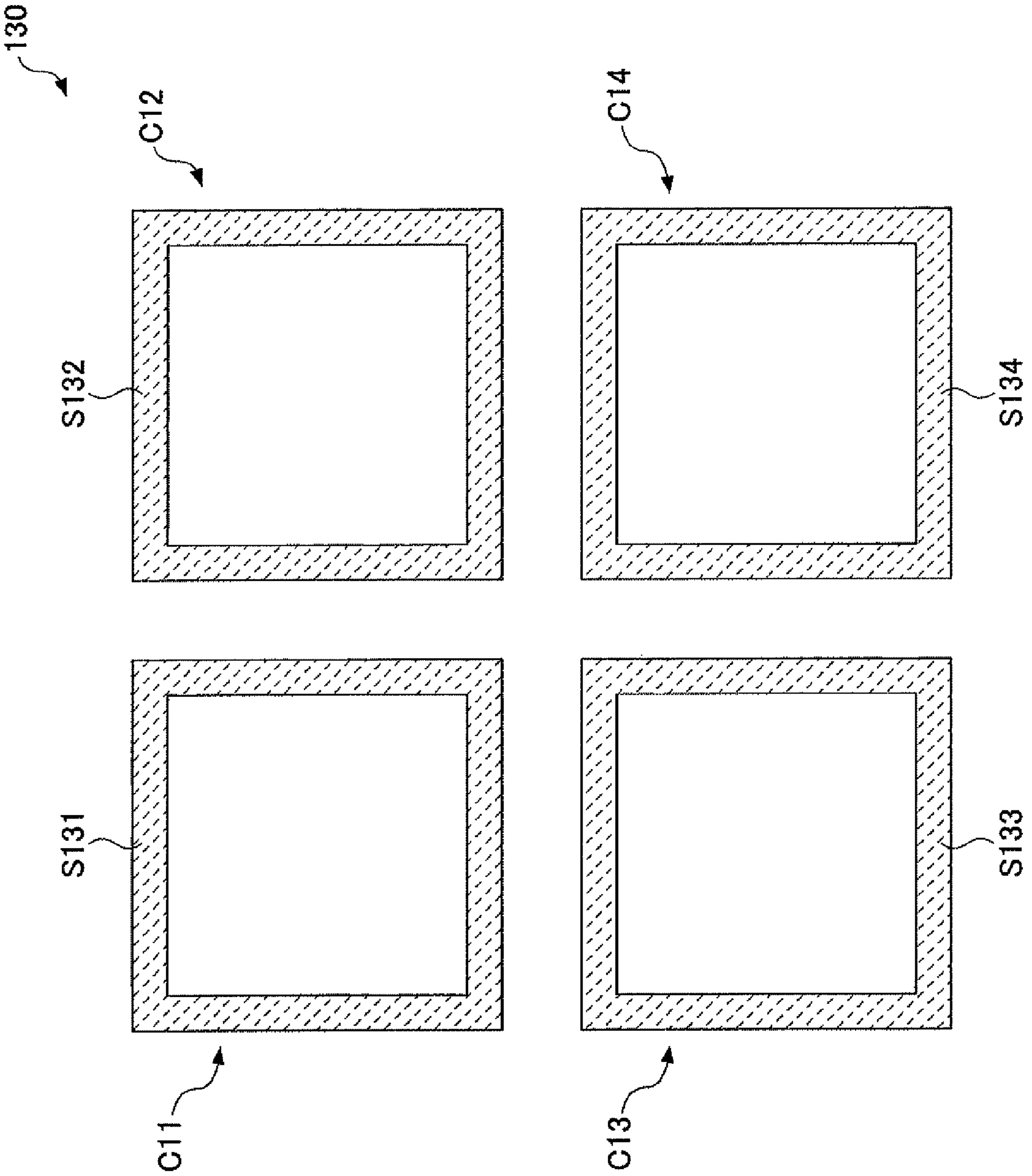
FIG. 24 is a drawing illustrating the plan configuration of the third metal interconnect layer 130 of the semiconductor device 100*g*.

FIG. 24 is a drawing illustrating the plane configuration of the third metal interconnect layer 130 of the semiconductor device 100*g* according to the eighth embodiment. In FIG. 24, the third metal interconnect layer 130 is formed as shield interconnect sections S131 through S134 having a frame shape to enclose the respective capacitor cells C11 through C14. This allows electrical couplings to the lower electrodes CL11 through CL14. Further, the shield interconnect sections S131 through S134 have a frame shape enclosing the upper electrodes CU11 through CU14 as viewed from above, respectively, thereby to reduce parasitic capacitances created between the upper electrodes and the input interconnects. In this manner, the shield interconnect sections S131 through S134 of the third metal interconnect layer 130 serve as interconnect layers to supply input signals to the respective lower electrodes CL11 through CL14, and also reduce parasitic capacitances.

Referring to FIG. 21 again, a fourth metal interconnect layer 170 is disposed above the third metal interconnect layer 130. The fourth metal interconnect layer 130 includes plate-shape shield interconnect sections S173 and S174 corresponding to the respective capacitor cells C13 and C14, and covers the capacitor cells C13 and C14 from above. Via holes 143 and 144 are formed between the shield interconnect sections S173 and S174 of the fourth metal interconnect layer 170 and the shield interconnect sections S133 and S134 of the third metal interconnect layer 130, respectively, to establish electrical couplings.

A fifth metal interconnect layer 190 is disposed above the fourth metal interconnect layer 170. Like the third metal interconnect layer 90 of the semiconductor device 100*f* of the sixth embodiment illustrated in FIG. 18, the fifth metal interconnect layer 190 serves as an input interconnect layer to supply input signals to the lower electrodes CL13 and CL14. The fifth metal interconnect layer 190 includes four layers situated over each of the capacitor cells C13 and C14 as a cross-sectional view thereof is illustrated. Fifth metal interconnect layer 193 or 194 that is the rightmost one is connected to the shield interconnect section S173 or S174 through a via hole 183 or 184, respectively.

Figure 25:
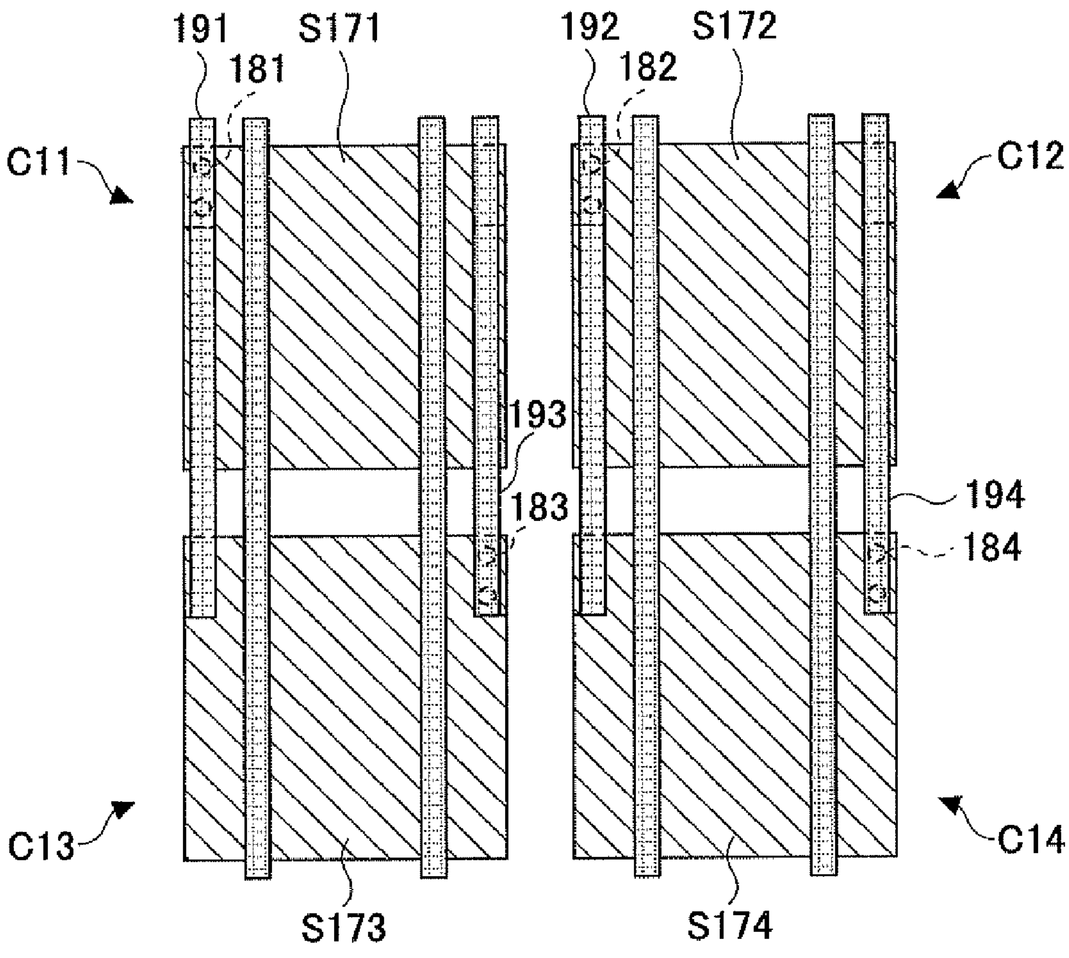
FIG. 25 is a drawing illustrating the plan configuration of the fourth metal interconnect layer 170 and the fifth metal interconnect layer 190 of the semiconductor device 100*g*.

FIG. 25 is a drawing illustrating the plane configuration of the fourth metal interconnect layer 170 and fifth metal interconnect layer 190 of the semiconductor device 100*g* according to the eighth embodiment. In FIG. 25, the shield interconnect sections S171 through S174 of the fourth metal interconnect layer 170 are provided to correspond to the capacitor cells C11 through C14. The shield interconnect sections S171 through S174 have a plate shape to cover the respective upper electrodes CU11 through CU14 from above. The fifth metal interconnect layer 190 includes fifth metal interconnect layers 191 through 194 corresponding to the capacitor cells C11 through C14 to provide respective interconnecting lines. The fifth metal interconnect layers 191 through 194 are disposed to traverse the portions over the shield interconnect sections S171 through S174 of the fourth metal interconnect layer 170, and are coupled to the shield interconnect sections 5171 through S174 through via holes 181 through 184, respectively.

In this manner, the shield interconnect sections S171 through S174 of the fourth metal interconnect layer 170 receive input signals from the fifth metal interconnect layers 191 through 194, and cover the respective upper electrodes CU11 through CU14 from above to reduce the parasitic capacitances created between the upper electrodes CU11 through CU14 and the fifth metal interconnect layers 191 through 194 serving as input interconnects. As a result, the shield interconnect sections 5171 through S174 of the fourth metal interconnect layer 170 serve as a plate-shape shield interconnect section to equalize the capacitances of the capacitor cells C11 through C14 with high precision.

By referring to FIG. 21 again, as described heretofore, the semiconductor device 100*g* of the eighth embodiment is configured such that the shield interconnect sections having equal potentials to input signals to enclose the upper electrodes CU11 through CU14 are implemented as a four-layer multilayer interconnect structure which includes the first metal interconnect layer 30*c*, the second metal interconnect layer 70*c*, the third metal interconnect layer 130, and the fourth metal interconnect layer 170. The first metal interconnect layer 30*c* having the plate configuration illustrated in FIG. 22 and the third metal interconnect layer 130 having the plate configuration illustrated in FIG. 24 may be repeated as many times as necessary, such that the interconnect layers having the same plane configurations are formed. For example, the second metal interconnect layer 70*c* having the plane configuration illustrated in FIG. 23 may be the n-th layer. In this case, the first metal interconnect layer through the (n−1)-th metal interconnect layer may be configured to have the same plane configuration as the first metal interconnect layer 30*c* illustrated in FIG. 22, and the (n+1)-th and higher metal interconnect layers may be configured to have the same plane configuration as the third metal interconnect layer 130 illustrated in FIG. 24, thereby providing as many layers as necessary.

In the semiconductor device 100*g* of the eighth embodiment, the input interconnects are formed in the interconnect layers 191 through 194 which are situated above the shield interconnect sections S31*c* through S34*c*, S71*c* through S74*c*, S131 through S134, and S171 through S174, thereby providing a multilayer interconnect structure that conserves space. If a circuit to be implemented in the semiconductor device 100*f* is complex and requires a multilayer interconnect structure having a large number of layers, then, the capacitor cells C11 through C14 may be implemented as a multilayer interconnect structure having a required number of layers.

Figure 26:
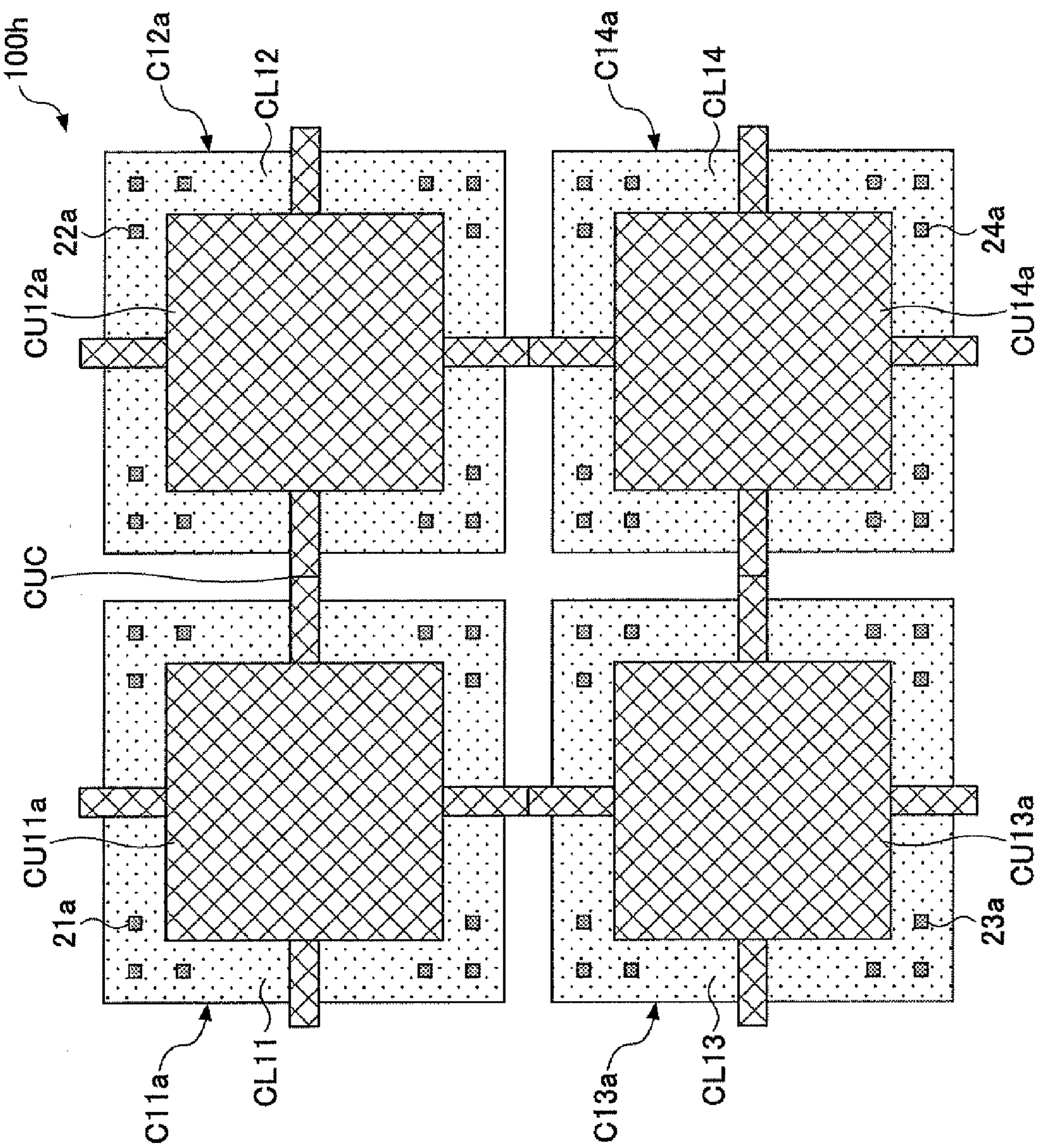
FIG. 26 is a drawing illustrating the plane configuration of the semiconductor device 100*h* according to a variation of the eighth embodiment.

In the following, a description will be given of a variation of the semiconductor device 100*g* according to the eighth embodiment by referring to FIG. 26. FIG. 26 is a drawing showing the plane configuration of a semiconductor device 100*h* according to a variation of the eighth embodiment.

FIG. 26 shows capacitor cells C11*a* through C14*a* arranged side by side in a lattice form. The upper electrodes CU11*a* through CU14*a* are directly connected together through upper electrode connecting sections CUC without utilizing an interconnect layer. In the case of FIG. 26, if the upper electrodes CU11*a* through CU14*a* are formed of polysilicon, for example, this polysilicon pattern is configured to have the shape inclusive of the upper electrode connecting sections CUC thereby to provide an electrode shape in which the upper electrodes CU11*a* through CU14*a* are connected together. The lower electrodes CL11 through CL14 have the same shape as described in the sixth through eighth embodiments, and are provided in one-to-one correspondence to the capacitor cells C11 through C14. Further, the lower electrodes CL11 through CL14 have areas to which contact holes 21*a* through 24*a* are connected at the four corners thereof.

When the semiconductor device 100*g* of the eighth embodiment is applied to the capacitor cells C11*a* through C14*a* having the upper electrodes CU11*a* through CU14*a* illustrated in FIG. 26, the first metal interconnect layer 30*c* and the second metal interconnect layer 70*c* may not be necessary in the cross-sectional configuration illustrated in FIG. 21. The cross-sectional configuration may thus be modified by removing them.

In such a case, the metal interconnect layers S131 through S134 having a frame shape illustrated in FIG. 24 may be situated around the upper electrode CU11 in FIG. 21. The metal interconnect layers S131 through S134 are connected to the lower electrodes CL11 through CL14 to have the same potentials as the lower electrodes CL11 through CL14, respectively, and enclose the respective upper electrodes CU11*a* through CU14*a* as viewed from above. The metal interconnect layers S131 through S134 thus serve as shield interconnect sections.

The metal interconnect layers having a frame shape illustrated in FIG. 24 may be implemented by use of a multilayer interconnect structure in which as many layers as necessary are formed one over another. With this arrangement, the shield interconnect sections S131 through S134 for shielding the respective upper electrodes CU11*a* through CU14*a* are implemented as a multilayer structure, thereby preventing the creation of parasitic capacitances while coping with a multilayer interconnect structure.

Above the frame-shape shield interconnect sections S131 through S134 illustrated in FIG. 24, interconnect layers having similar configurations to the fourth metal interconnect layer 170 and the fifth metal interconnect layer 190 illustrated in FIG. 25 are formed. The shield interconnect sections S171 through S174 of the fourth metal interconnect layer 170 cover the upper electrodes CU11*a* through CU14*a* from above, respectively. Further, input signals are supplied to the lower electrodes CL11 through CL14 through the fifth metal interconnect layers 191 through 194 serving as an input signal interconnect layer while preventing the creation of parasitic capacitances. This aspect is the same as what is described in the eighth embodiment, and a detailed description thereof will be omitted.

In the semiconductor device 100*h* of the eighth embodiment described above, the capacitor cells C11*a* through C14*a* having the upper electrodes CU11*a* through CU14*a* directly connected together are implemented by use of a multilayer structure while conserving space, and reduce the creation of parasitic capacitances in the shield interconnect layer.

Ninth Embodiment

Figure 27:
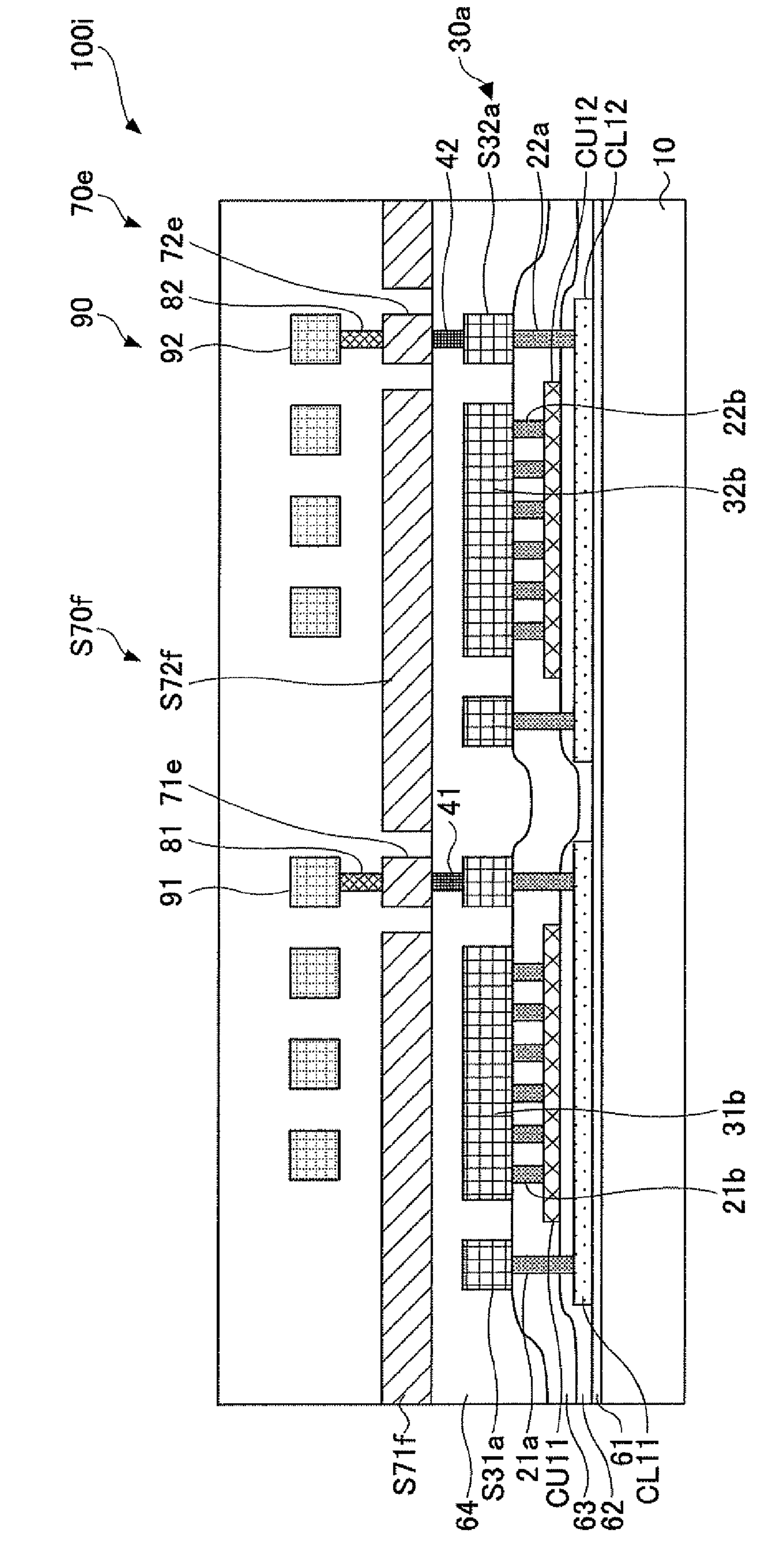
FIG. 27 is a cross-sectional view of the semiconductor device 100*i* according to the ninth embodiment.

FIG. 27 is a drawing showing a cross-sectional configuration of a semiconductor device 100*i* according to a ninth embodiment of the present invention. In FIG. 27, the semiconductor device 100*i* of the ninth embodiment includes lower electrodes CL11 and CL12 formed above the semiconductor substrate 10 with an intervening insulating layer 61, and upper electrodes CU11 and CU12 are formed above the respective lower electrodes CL11 and CL12 with an intervening insulating layer 62. A first metal interconnect layer 30*a* is formed above the upper electrodes CU11 and CU12 with an intervening insulating layer 63. Outer shield interconnect sections S31*a* and S32*a* of the first metal interconnect layer 30*a* are connected to the lower electrodes CL11 and CL12 via contact holes 21*a* and 22*a*, respectively, and inner first metal interconnect layers 31*b* and 32*b* are connected to the upper electrodes CU11 and CU12 through contact holes 21*b* and 22*b*, respectively. This configuration is the same as the configuration of the semiconductor device 100*f* of the seventh embodiment, except for the fact that the capacitor cells of interest are the capacitor cells C11 and C12 rather than the capacitor cells C13 and C14. Accordingly, the plane configurations of the upper electrodes CU11 and CU12 and the lower electrodes CL11 and CL12 are the same as those illustrated in FIG. 15, and the plane configuration of the first metal interconnect layer 30*a* is the same as the configuration illustrated in FIG. 19. A detailed description of these plane configurations will be omitted. The first metal interconnect layer 30*a* having the same plane configuration as illustrated in FIG. 19 includes shield interconnect sections S31*a* and S32*a* that mostly enclose the upper electrodes CU11 and CU12 and the center first metal interconnect layers 31*b* and 32*b* as viewed from above, respectively, thereby reducing the creation of parasitic capacitances.

A second metal interconnect layer 70*e* provided above the first metal interconnect layer 30*a* in FIG. 27, on the other hand, does not fully cover the upper electrodes CU11 and CU12. The second metal interconnect layer 70*e* is divided into second metal interconnect layers 71*e* and 72*e* and second metal interconnect layers S71*f* and S72*f*. The second metal interconnect layers 71*e* and 72*e* are situated on the right-hand side of the capacitor cells and connected to the lower electrodes CL11 and CL12, respectively. The second metal interconnect layers S71*f* and S72*f* cover other areas inclusive of the upper electrodes CU11 and CU12, respectively. In this aspect, this configuration differs from the semiconductor device 100*f* of the seventh embodiment illustrated in FIG. 18.

The second metal interconnect layers 71*e* and 72*e* situated at the positions corresponding to the right-hand side portions of the respective capacitor cells C11 and C12 are electrically coupled to the shield interconnect sections S31*a* and S32*a* of the first metal interconnect layer 30*a* through the via holes 43 and 44, respectively. Further, the second metal interconnect layers 71*e* and 72*e* are electrically coupled to the right-hand-side input interconnects 91 and 92 of the third metal interconnect layer 90 through via holes 81 and 82, respectively. Accordingly, the right-hand-side second metal interconnect layers 71*e* and 72*e* of the second metal interconnect layer 70*e* serve as input signal supply interconnects for the lower electrodes CL11 and CL12, respectively.

The second metal interconnect layers S71*f* and 72*f* formed to cover the entirety of the capacitor cells C11 and C12 inclusive of the upper electrodes CU11 and CU12 are connected to neither the lower electrodes CL11 and CL12 nor the upper electrodes CU11 and CU12. The second metal interconnect layers S71*f* and 72*f* fully covering the respective capacitor cells C11 and C12 are connected to a fixed potential that may be used as a reference potential or the like, thereby shielding the upper electrodes CU11 and CU12 with this fixed potential. Such a fixed potential may be a power supply potential Vdd, a ground potential GND, a reference potential Vref used in the circuit, or the like. Any appropriate fixed potential may be used according to need.

Figure 28:
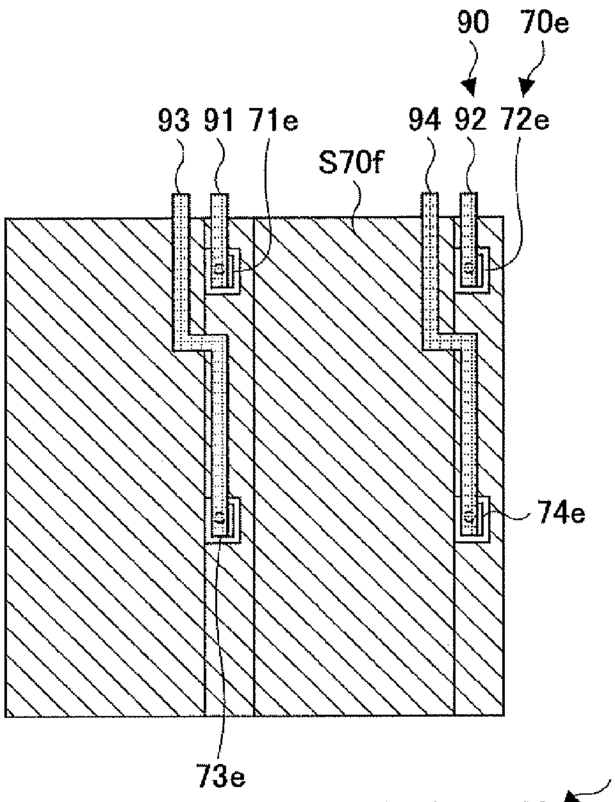
FIG. 28 is a drawing illustrating the plan configuration of the second metal interconnect layer 70*e* and the third metal interconnect layer of the semiconductor device 100*i* in which FIG. 28-(*a*) is an enlarged view of the plane configuration, FIG. 28-(*b*) is a wide-area schematic view of the plane configuration.
Figure 28:
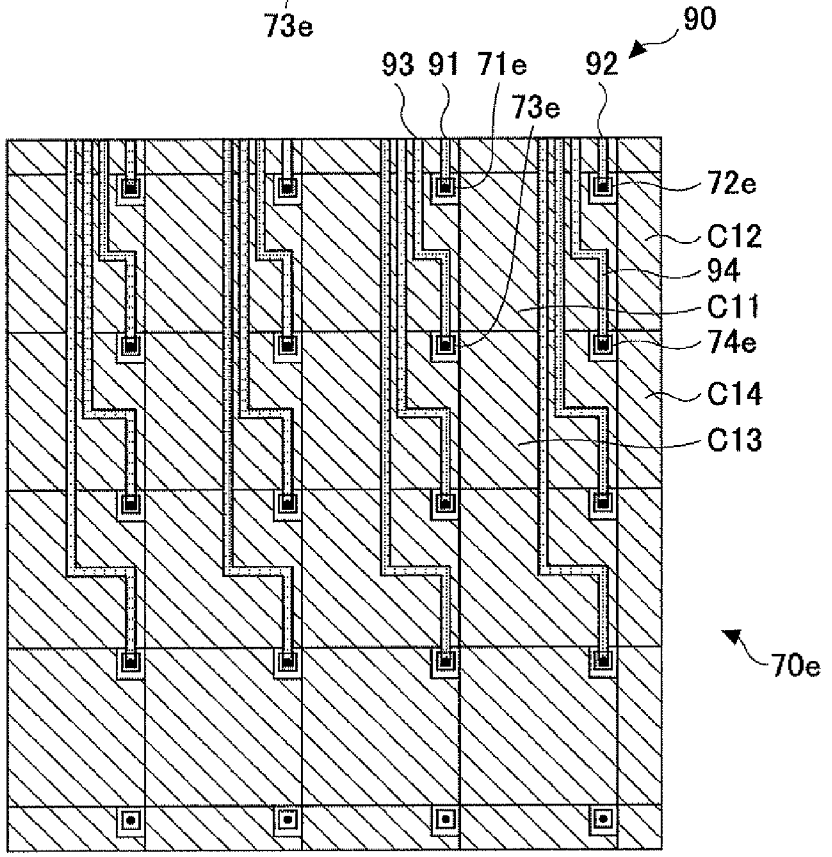

FIG. 28 is a drawing illustrating the plane configuration of the second metal interconnect layer 70*e* and third metal interconnect layer of the semiconductor device 100*i* according to the ninth embodiment. FIG. 28-(*a*) is an enlarged view showing the plane configuration of the capacitor cells C11 through C14. FIG. 28-(*b*) is a schematic diagram showing the plane configuration of an area for 16 capacitor cells.

In FIG. 28-(*b*), the plan view of the second metal interconnect layer 70*e* and the third metal interconnect layer 90 is illustrated with respect to 16 capacitor cells arranged in a 4-by-4 configuration. Third metal interconnect lines come from one direction to vertically extend, and are laid out separately from each other to supply input signals to the respective capacitor cells. The capacitor cells C11 through C14, which have been used as an example, are illustrated at the top right corner area in FIG. 28-(*b*).

FIG. 28-(*a*) is an enlarged view of the second metal interconnect layer 70*e* and third metal interconnect layer 90 at an area corresponding to the capacitor cells C11 through C14. In FIG. 28-(*a*), most of the second metal interconnect layer 70*e* is comprised of the fixed-potential shield interconnect section S70*f* that is a single plate continuously covers the capacitor cells C11 through C14. The supply of input signals to the lower electrodes CL11 through CL14 of the respective capacitor cells C11 through C14 is performed through holes that are formed through the fixed-potential shield interconnect section S70*f*. The second metal interconnect layers 71*e* through 74*e* are provided and connected to the third metal interconnect layers 91 through 94, respectively.

Instead of separately covering the capacitor cells C11 through C14, the fixed-potential shield interconnect section S70*f* that is a single plate may be used as described above to continuously cover the capacitor cells C11 through C14, thereby shielding the upper electrodes CU11 through CU14 with the fixed potential. The separate shielding of the individual upper electrodes CU11 through CU14 may be performed in the first metal interconnect layer 30*a* by using interconnect layers set at the input signal potentials as previously described. In addition, the shielding of the upper electrodes CU11 through CU14 is performed by continuously covering the upper electrodes CU11 through CU14 from above for fixed-potential shielding, thereby providing dual shielding effects utilizing different potentials. With this arrangement, both the input signals and the fixed potential are effectively utilized, thereby making it possible to provide the semiconductor device 100*i* in a flexible manner according to need.

Figure 29:
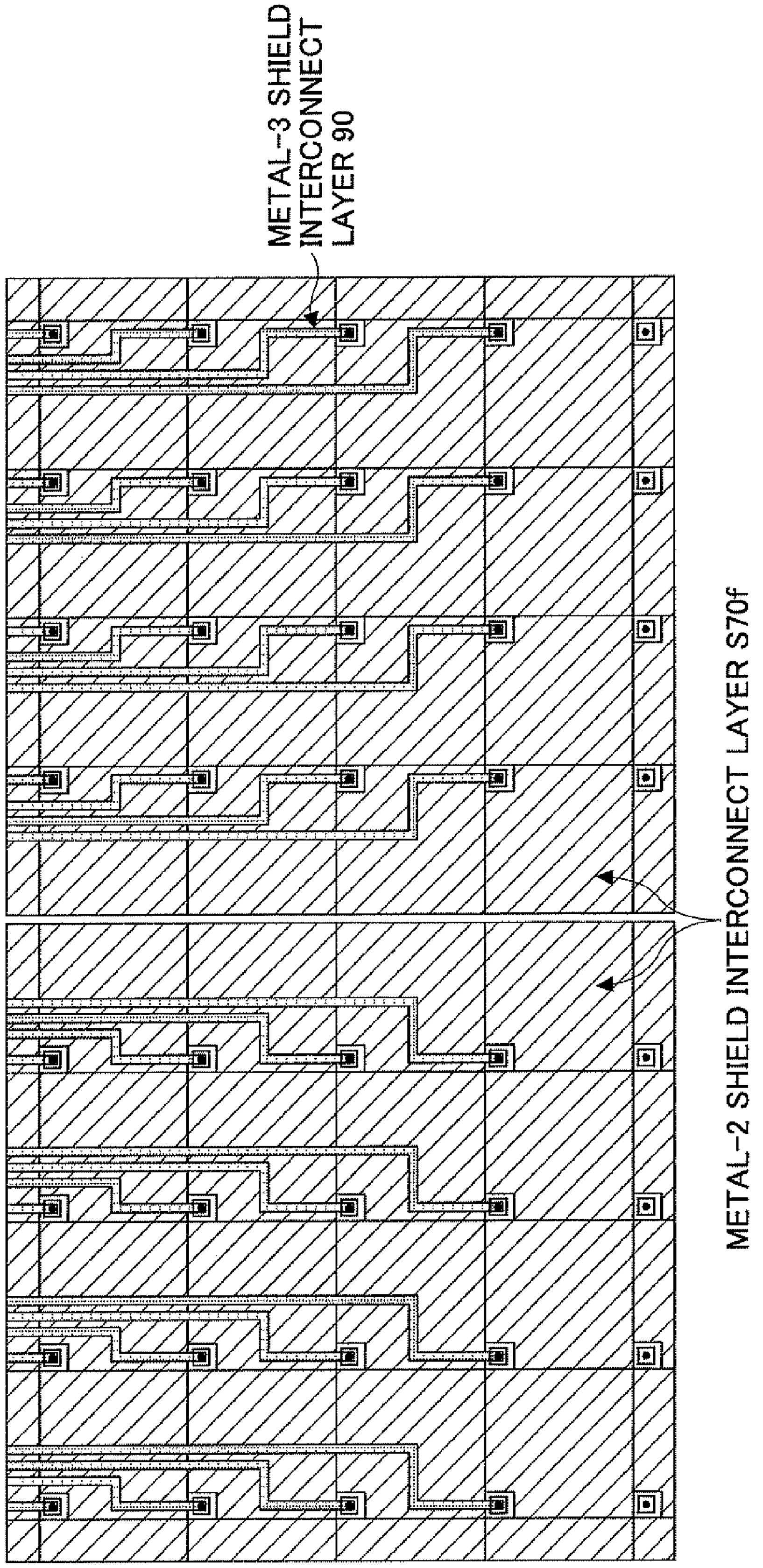
FIG. 29 is a drawing illustrating the plan configuration of the second metal interconnect layer 70*e* of the semiconductor device 100*i*.

FIG. 29 is a drawing illustrating the plane configuration of twice the area of the second metal interconnect layer 70*e* of the semiconductor device 100*i* illustrated in FIG. 28-(*b*). In FIG. 29, the fixed-potential shield interconnect section S70*f* of the second metal interconnect layer 70*e* is divided into right and left. When the fixed-potential shield interconnect section S70*f* is divided in this manner, the left half may be set to the power supply potential Vdd, and the right half may be set to the ground potential GND. Namely, potential may be changed for each of the fixed-potential shield interconnect sections S70*f*. Depending on the circuit configuration formed in the semiconductor device 100*i*, a fixed potential that is easily available may vary from position to position. In such a case, the fixed potential of the fixed-potential shield interconnect section S70*f* may be changed for each position.

According to the semiconductor device 100*i* of the ninth embodiment, the shield interconnect sections S31*a* through S34*a* and S70*f* are implemented by combining different potentials, thereby providing a semiconductor device 100*i* that has highly-precise capacitor cells C11 through C14 responsive to various types of potential supply circuits.

Tenth Embodiment

Figure 30:
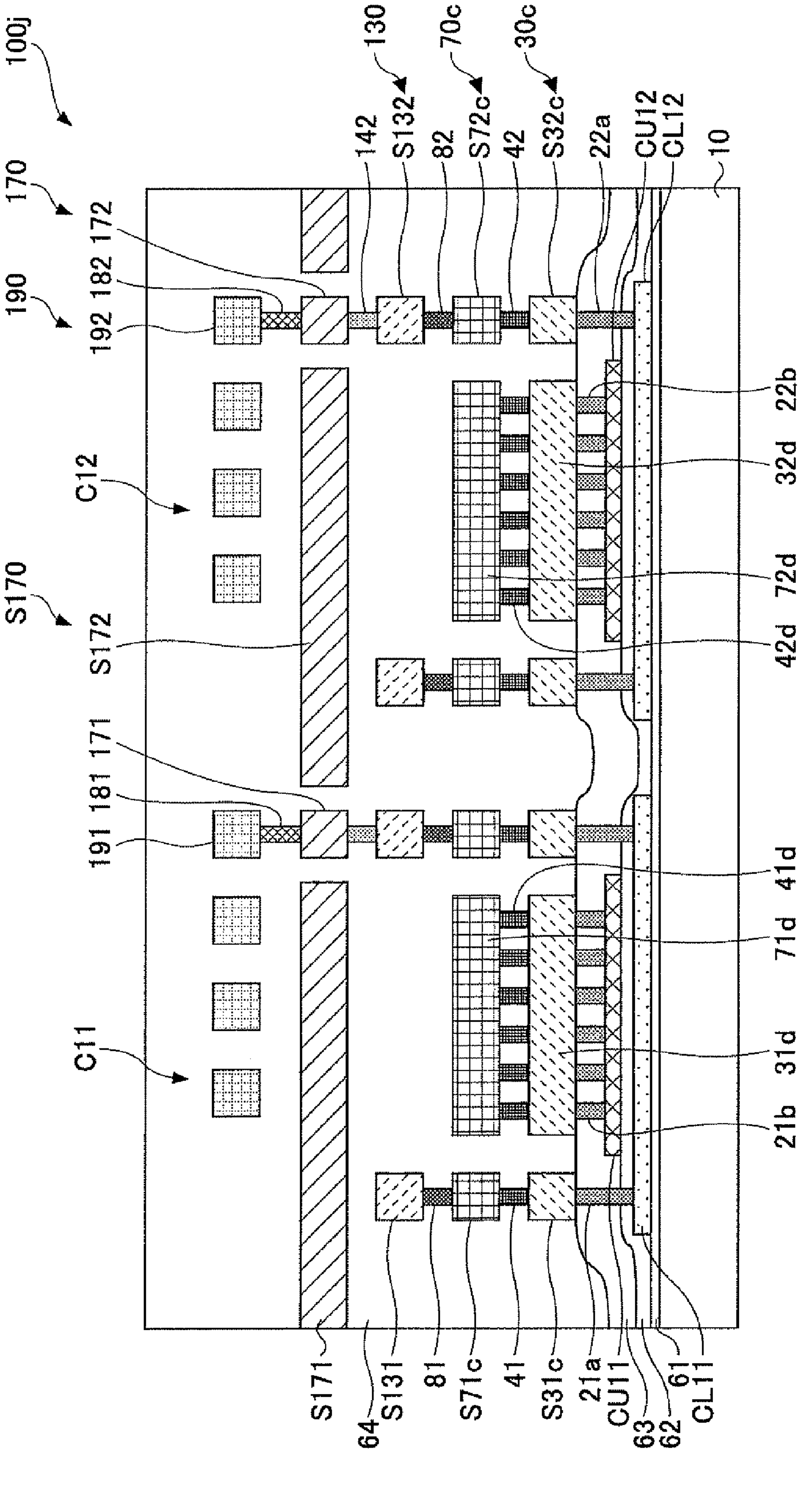
FIG. 30 is a cross-sectional view of the semiconductor device 100*j* according to the tenth embodiment.

FIG. 30 is a drawing showing a cross-sectional configuration of a semiconductor device 100*j* according to a tenth embodiment of the present invention. The semiconductor device 100*j* of the tenth embodiment includes lower electrodes CL11 and CL12 formed above the semiconductor substrate 10 with an intervening insulating layer 61, and upper electrodes CU11 and CU12 are formed to face the respective lower electrodes CL11 and CL12 across an intervening insulating layer 62. The first metal interconnect layer 30*c* is formed above the upper electrodes CM and CU12. The first metal interconnect layer 30*c* is divided into shield interconnect sections S31*c* and S32*c* formed at the positions corresponding to the peripheral areas of the respective capacitor cells C11 and C12 and the first metal interconnect layers 31*d* and 32*d* formed at the positions corresponding to the central areas of the respective capacitor cells C11 and C12. The shield interconnect sections S31*c* and S32*c* situated in the peripheral areas of the respective capacitor cells C11 and C12 are coupled to the lower electrodes CL11 and CL12 via the contact holes 21*a* and 22*a*, respectively. The first metal interconnect layers 31*d* and 32*d* situated in the central areas of the respective capacitor cells C11 and C12 are coupled to the upper electrodes CU11 and CU12 via the contact holes 21*b* and 22*b*, respectively.

The plane configuration of the first metal interconnect layer 30*c* is the same as the configuration illustrated in FIG. 22 described in connection with the eighth embodiment, and the corresponding reference symbols are used. A detailed description of the plane configuration will be omitted. It should be noted that the shield interconnect sections S31*c* and S32*c* in the peripheral areas have a shielding effect to suppress the creation of parasitic capacitances.

Referring to FIG. 30 again, a second metal interconnect layer 70*c* is disposed above the first metal interconnect layer 30*c* with an intervening insulating layer 64. The second metal interconnect layer 70*c* is also divided into shield interconnect sections S71*c* and S72*c* formed in the peripheral areas of the respective capacitor cells C11 and C12 and the second metal interconnect layers 71*d* and 72*d* formed in the central areas of the respective capacitor cells C11 and C12. The shield interconnect sections S71*c* and S72*c* are connected to the shield interconnect sections S31*c* and S32*c* of the first metal interconnect layer 30*c* through via holes 41 and 42, respectively. The second metal interconnect layers 71*d* and 72*d* in the central area are connected to the upper electrodes CM and CU12 through via holes 41*d* and 42*d*, respectively.

The plane configuration of the second metal interconnect layer 70*c* is the same as the configuration illustrated in FIG. 23 described in connection with the eighth embodiment, and the corresponding reference symbols are used. A detailed description of the plane configuration of the second metal interconnect layer 70*c* will be omitted. It should be noted, however, that the second metal interconnect layers 71*d* through 74*d* at the center of the respective capacitor cells C11 through C14 adjacent to each other are connected together through the upper electrode connecting sections CUC, and that the outer shield interconnect sections S71*c* through S74*c* are configured to enclose the upper electrodes CU11 through CU14 and the second metal interconnect layers 71*d* through 74*d*, respectively.

Referring to FIG. 30 again, a third metal interconnect layer 130 is disposed above the second metal interconnect layer 70*c*. The second metal interconnect layer 70*c* is formed only in the peripheral areas of the capacitor cells C11 and C12 to constitute shield interconnect sections S131 and S132, respectively. The shield interconnect sections S131 and S132 are connected to the second metal interconnect layers S71*c* and S72*c* through via holes 81 and 82 to be electrically coupled to the lower electrodes CL11 and CL12, respectively.

The plane configuration of the third metal interconnect layer 130 is the same as the configuration illustrated in FIG. 24 described in connection with the eighth embodiment, and the corresponding reference symbols are used. A detailed description of this plane configuration will be omitted. It should be noted, however, that the third metal interconnect layer 130 has a frame shape to enclose the upper electrodes CU11 through CU14, respectively, as viewed from above, thereby serving as shield interconnect sections S131 through S134.

A fourth metal interconnect layer 170 is disposed above the third metal interconnect layer 130. The fourth metal interconnect layer 170 is divided into fourth metal interconnect layers 171 and 172 situated in the right-hand peripheral areas of the respective capacitor cells C11 and C12 and the fixed-potential shield interconnect sections S171 and S172 that cover the entirety of the capacitor cells C11 and C12 inclusive of the upper electrodes CU11 and CU12 from above, respectively. Only the fourth metal interconnect layers 171 and 172 in the peripheral area are connected to the third metal interconnect layers S131 and S132 though via holes 141 and 142, respectively.

The fixed-potential shield interconnect sections S171 and S172 covering most of the respective capacitor cells C11 and C12 are connected to neither the lower electrodes CL11 and CL12 nor the upper electrodes CU11 and CU12, and are fixed to a fixed potential.

A fifth metal interconnect layer 190 is formed above the fourth metal interconnect layer 170, and includes fifth metal interconnect layers 191 and 192 corresponding to the respective capacitor cells C11 and C12. The fifth metal interconnect layers 191 and 192 situated at the right-hand side are electrically coupled to the fourth metal interconnect layers 171 and 172 situated at the right-hand side through via holes 181 and 182, respectively. The fifth metal interconnect layers 191 and 192 serve as input interconnects to supply input signals to the lower electrodes CL11 and CL12, respectively.

Figure 31:
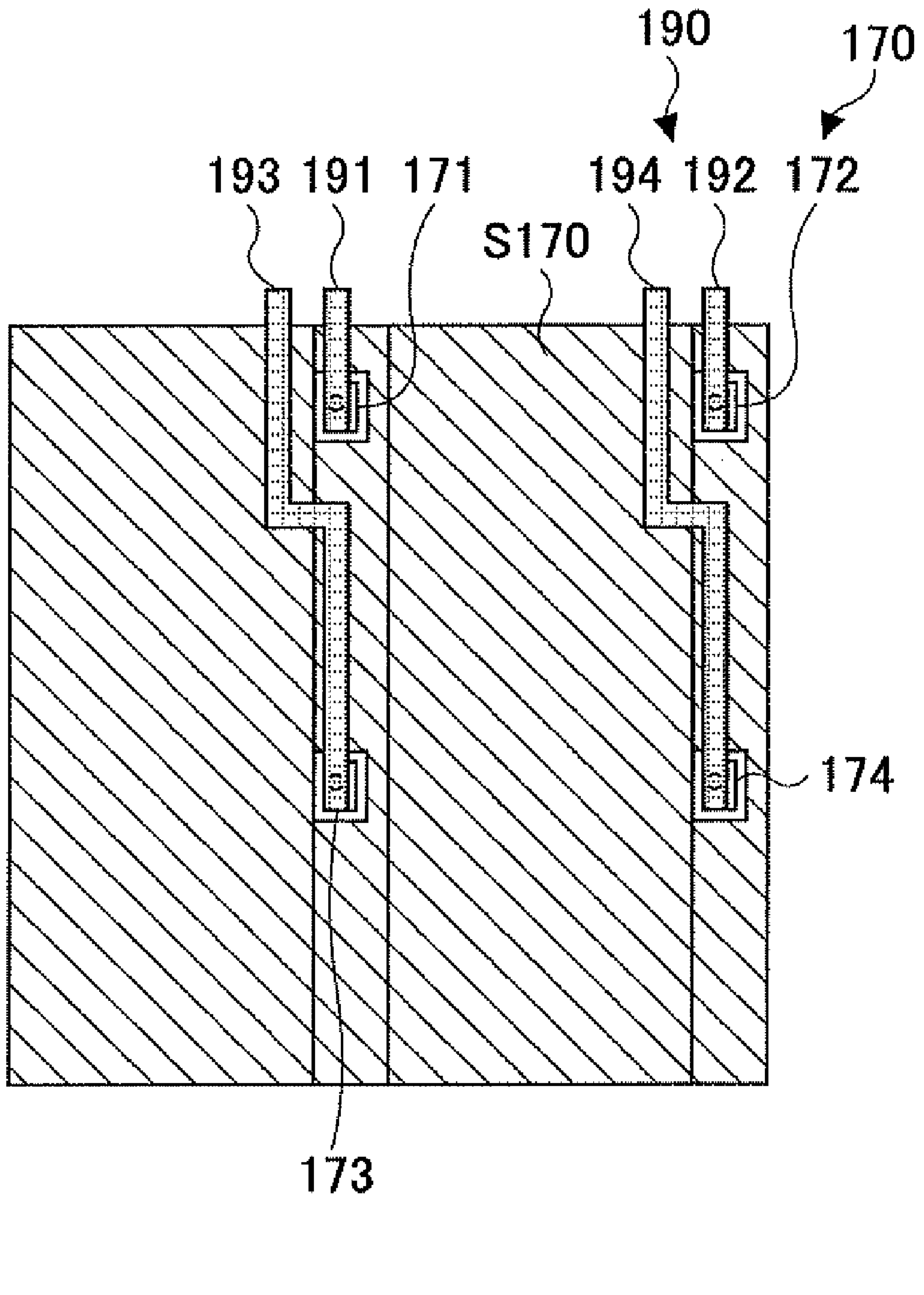
FIG. 31 is a drawing illustrating the plan configuration of the fourth metal interconnect layer 170 and the fifth metal interconnect layer 190 of the semiconductor device 100*j*.

FIG. 31 is a drawing illustrating the plane configuration of the fourth metal interconnect layer 170 and fifth metal interconnect layer 190 of the semiconductor device 100*j* according to the tenth embodiment. The fixed-potential shield interconnect section S170 is formed as a single continuous plate to cover the capacitor cells C11 through C14 (not shown). The fixed-potential shield interconnect section S170 has holes formed in the areas of the fourth metal interconnect layers 171 through 174 for supplying input signals to the capacitor cells C11 through C14, respectively. The fifth metal interconnect layers 191 through 194 are connected to these areas to supply the input signals. The fixed-potential shield interconnect section S170 is connected to a power supply potential Vdd, a ground potential GND, or a reference potential Vref used for various circuits, thereby shielding the capacitor cells C11 through C14 with the connected fixed potential to reduce the occurrence of parasitic capacitances.

Referring to FIG. 30 again, as has been described heretofore, the semiconductor device 100*j* of the tenth embodiment includes plural shield interconnect sections S31*c*, S32*c*, S71*c*, S72*c*, S131, and S132 that are the interconnect layers having the same potentials as the lower electrodes CL11 and CL12 to enclose the upper electrodes CU11 and CU12 as viewed from above, respectively. Above these layers, the fixed-potential shield interconnect sections S171 and S172 for providing fixed-potential shielding caps are provided, on which the input interconnect layer for the lower electrodes CL11 and CL12 is situated. This arrangement provides a semiconductor device 100*j* that is suitable for a multilayer interconnect structure to conserve space, and that effectively utilizes plural potentials to suppress the occurrence of capacitance unevenness.

With respect to FIG. 30, a description has been given of an example in which one first metal interconnect layer 30*c* having the plane configuration illustrated in FIG. 22 and one second metal interconnect layer 70*c* having the plane configuration illustrated in FIG. 24 are provided. Notwithstanding this, provision may be made such that plural interconnect layers having the same plane configuration as the first metal interconnect layer 30*c* and plural interconnect layers having the same plane configuration as the second metal interconnect layer 70*c* are provided according to need. For example, the semiconductor device 100*j* may have a large number of interconnect layers with the input interconnect situated at the top layer. In such a case, interconnect layers such as the first metal interconnect layer 30*c* having the frame-shape shield interconnect sections S31*c* and S32*c* to enclose the respective upper electrodes CU11 and CU12 and frame-shape interconnect layers such as the second metal interconnect layer 70*c* to enclose the upper electrodes CU11 and CU12 from above may be stacked one over another, thereby forming a semiconductor device 100*j* having a multilayer interconnect structure.

Figure 32:
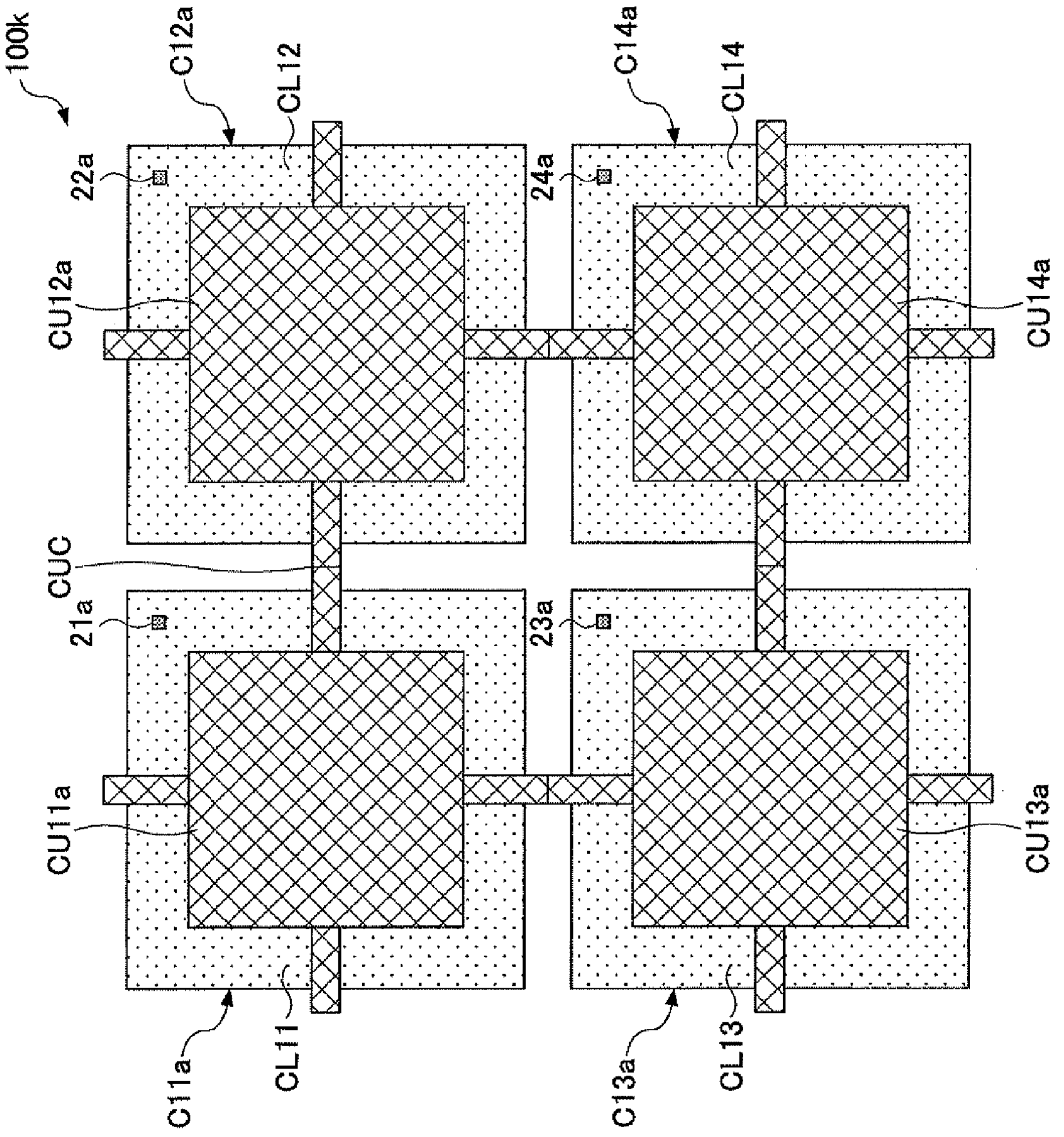
FIG. 32 is a plan view of the electrode configuration of the semiconductor device 100*k* according to a variation of the tenth embodiment.

In the following, a description will be given of a semiconductor device 100*k* according to a variation of the tenth embodiment by referring to FIG. 30, FIG. 32, and FIG. 33. FIG. 32 is a plan view of the electrode configuration of the semiconductor device 100*k* according to a variation of the tenth embodiment.

FIG. 32 shows capacitor cells C11*a* through C14*a* arranged side by side. The capacitor cells C11*a* through C14*a* include lower electrodes CL11 through CL14 and upper electrodes CU11*a* through CU14*a* smaller in area size than the lower electrodes CL11 through CL14, respectively. The lower electrodes CL11 through CL14 have areas for contact holes 21*a* through 24*a* supplying input signals to be arranged, which do not overlap the upper electrodes CU11*a* through CU14*a*, respectively. The upper electrodes CU11*a* through CU14*a* are connected together through upper electrode connecting sections CUC to constitute a single upper electrode in terms of electrical connection. In this manner, the semiconductor device 100*j* of the tenth embodiment is applicable to a configuration in which the upper electrodes CU11*a* through CU14*a* of the respective capacitor cells C11*a* through C14*a* are not connected together through an interconnect layer, but are directly connected together.

If the upper electrodes CU11 and CU12 are directly connected together in FIG. 30, the first metal interconnect layer 30*c* and the second metal interconnect layer 70*c* are not necessary. In the semiconductor device 100*k* having the electrode structure illustrated in FIG. 32, therefore, the first metal interconnect layer 30*c* and the second metal interconnect layer 70*c* may be removed from the configuration illustrated in FIG. 30. In this case, a frame-shape interconnect layer having the same plane configuration as the third metal interconnect layer 130 may be provided to enclose the upper electrodes CU11 and CU12 illustrated in FIG. 30.

Figure 33:
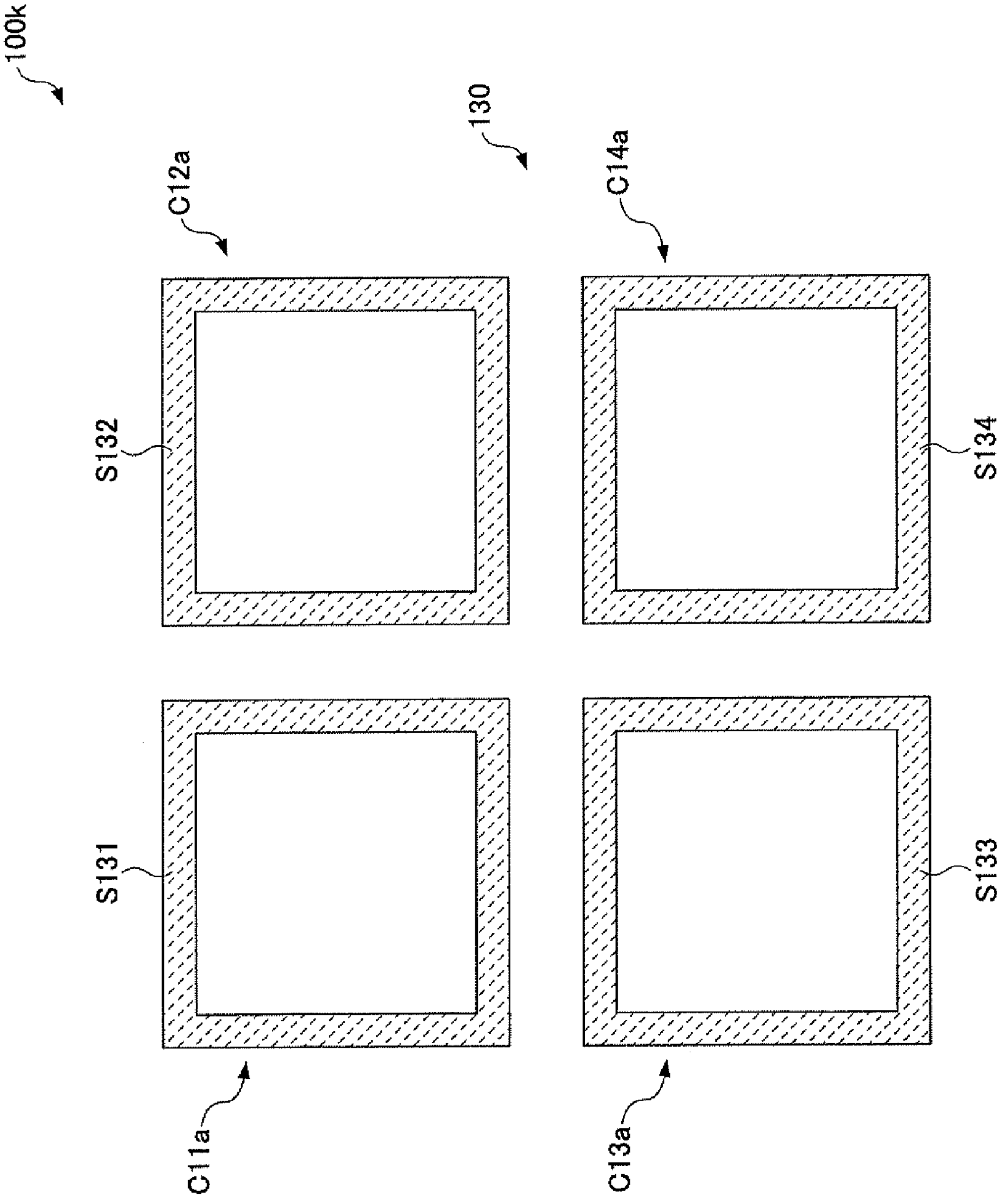
FIG. 33 is a drawing illustrating the plan configuration of the interconnect layer 130 having shield interconnect sections S131 through S134 of the semiconductor device 100*k*.

FIG. 33 is a drawing showing the plane configuration of the interconnect layer 130 having the shield interconnect sections S131 through S134 for shielding the respective capacitor cells C11*a* through C14*a* having the plane configuration illustrated in FIG. 32. The shield interconnect sections S131 through S134 have a frame shape to enclose the respective capacitor cells C11*a* through C14*a* as viewed from above, and are coupled to the respective lower electrodes CL11 through CL14 to be set to the same potentials as input signals, thereby suppressing parasitic capacitances created between the upper electrodes CU11*a* through CU14*a* and the input interconnects.

As many interconnect layers as necessary may be provided having the same plane configuration as the third metal interconnect layer 130 having the frame-shape shield interconnect sections S131 through S134, in accordance with the number of interconnect layers of the semiconductor device 100*k*.

Above the interconnect layer 130 having the shield interconnect sections S131 through S134, an interconnect layer having the fixed-potential shield interconnect sections S171 and S172 in the same manner as in FIG. 30 is formed, above which is further formed input interconnects for supplying input signals to the lower electrodes CL11 and CL12. The cross-sectional configuration is the same as the configuration illustrated in FIG. 31, and a description thereof will be omitted. It should be noted, however, that a plate having a fixed potential is used as a lid to provide a shielding effect, thereby making it possible to equalize capacitor cells, in the same manner as described in connection with FIG. 31.

In the semiconductor device 100*k* of the tenth embodiment described above, input signals and a fixed potential are utilized to suppress the creation of parasitic capacitances and to equalize capacitor cells even when the capacitor cells have the upper electrodes CU11*a* through CU14*a* directly connected together.

Eleventh Embodiment

In the following, a description will be given of an example in which one of the semiconductor devices 100 through 100*k* described in the first through tenth embodiments is employed in a semiconductor device 100*m* inclusive of an A/D converter having a D/A converter circuit.

Figure 34:
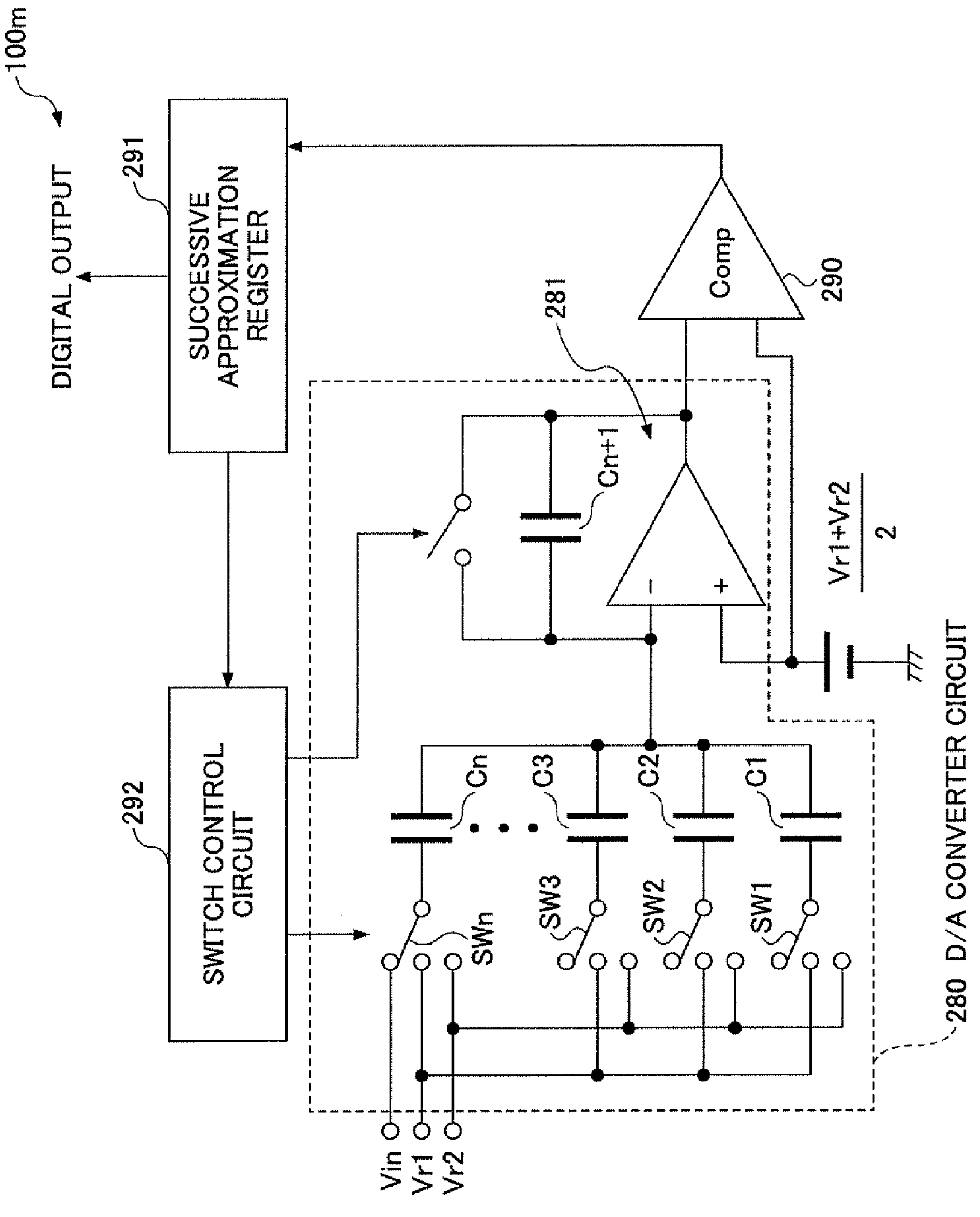
FIG. 34 is a drawing showing the semiconductor device 100*m* having an A/D converter according to an eleventh embodiment.

FIG. 34 is a drawing showing the semiconductor device 100*m* having an A/D converter according to an eleventh embodiment. In FIG. 34, the A/D converter includes a D/A converter circuit 280, a comparator 290, a successive approximation register 291, and a switch control circuit 292. The output line of the D/A converter circuit 280 is connected to one input terminal of the comparator 290. The other input terminal of the comparator 290 is connected to a reference voltage (Vr1+Vr2)/2. The output of the comparator 290 is input into the successive approximation register 291.

The A/D converter is configured such that the output voltage of the D/A converter circuit 280 is compared with the reference voltage (Vr1+Vr2)/2, and the successive approximation register 291 changes the output voltage of the D/A converter circuit 280 via the switch control circuit 292 in response to the result of the comparison. The A/D converter has an n-bit resolution. The D/A converter circuit 280 includes an integration circuit 281 and a set of capacitor cells C1 through Cn that has a maximum ratio of $2^{n-1}$ to 1 with respect to the n-bit resolution. With this configuration, the switch control circuit 292 supplies control signals for setting switches SW1 through SWn to either Vr1 or Vr2 after an input voltage Vin is accumulated in Cn, thereby applying a differential voltage corresponding to bit weights from the D/A converter circuit 280 to the comparator 290. Digital data from the successive approximation register 291 is thus determined.

In the semiconductor device 100*m* having the configuration described above, one of the semiconductor devices 100 through 100*k* described in the first through tenth embodiments may be utilized in the D/A converter circuit 280, thereby providing a semiconductor device 100*m* having such a D/A converter circuit 280. With this provision, a semiconductor device 100*m* having high-level output precision is obtained.

Twelfth Embodiment

Figure 35:
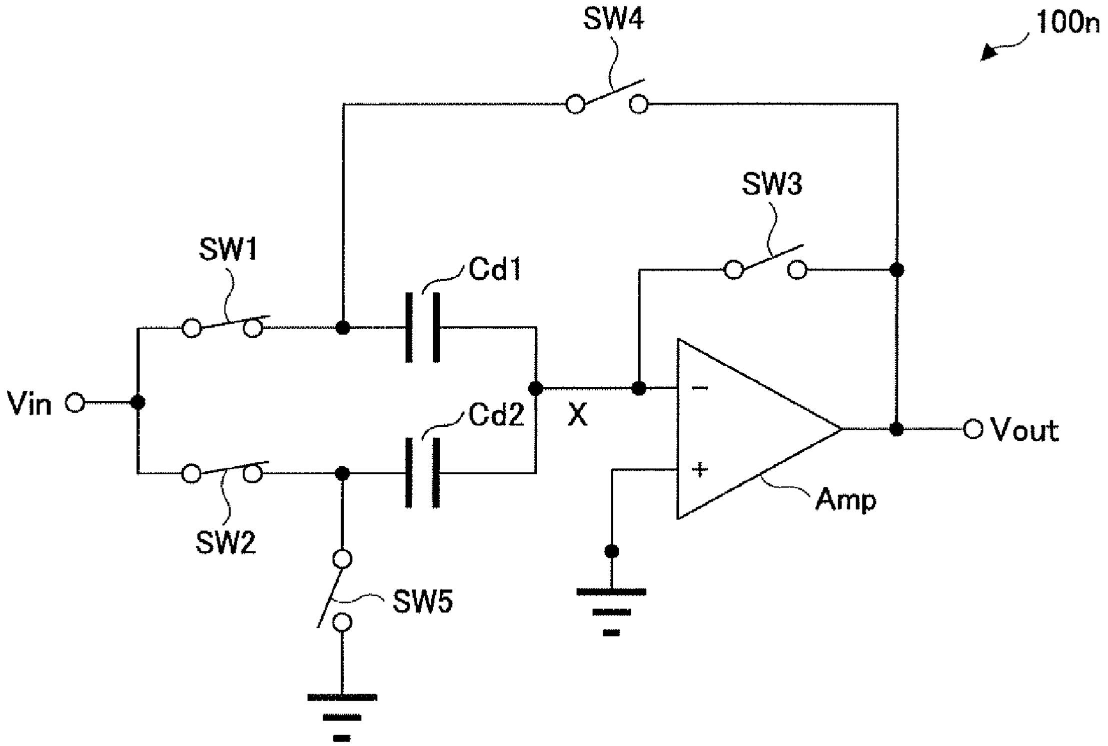
FIG. 35 is a drawing illustrating the circuit structure of the semiconductor device 100*n* according to the twelfth embodiment.

In the following, after the eleventh embodiment, a description will be given of an amplifier circuit to which one of the semiconductor devices 100 through 100*k* according to the first through tenth embodiments is applied. FIG. 35 is a drawing illustrating the circuit configuration of a semiconductor device 100*n* according to a twelfth embodiment inclusive of an amplifier circuit in which one of the semiconductor devices 100 through 100*k* according to the first through tenth embodiment is employed.

In FIG. 35, the semiconductor device 100*n* according to the twelfth embodiment includes switches SW1 through SW5, condensers Cd1 and Cd2, and an operational amplifier Amp. One end of each of the condensers Cd1 and Cd2 connected in parallel is connected to the inverted input node of the operational amplifier Amp. The other end of the condenser Cd1 is connected to the voltage input node Vin through the switch SW1, and is also connected to an output node Vout of the operational amplifier Amp through the switch SW4. Further, the other end of the condenser Cd2 is connected to the voltage input node Vin through the switch SW2, and is also connected to the ground through the switch SW5. The inverted input node of the operational amplifier Amp is connected to the output node Vout through the switch SW3, and the non-inverted input node is connected to the ground. The semiconductor device 100*n* of the twelfth embodiment constitutes an amplifier having an amplification factor of 2 utilizing a sample-hold circuit.

In FIG. 35, an amplification circuit having an amplification factor of 2 is implemented by providing the condenser Cd1 and the condenser Cd2 that have equal capacitances. One of the semiconductor devices 100 through 100*k* of the first through tenth embodiments is applied to the condensers Cd1 and Cd2 to equalize the capacitances of the condenser Cd1 and the condenser Cd2 with high precision, thereby providing a highly accurate amplification circuit having an amplification factor of 2. Namely, the condensers Cd1 and Cd2 comprised of plural capacitor cells are made not to experience the effect of noise caused by parasitic capacitances, thereby providing a highly accurate amplification circuit having an amplification factor of 2.

In the following, the operation of the semiconductor device 100*h* will be described by referring to FIG. 36 through FIG. 38. Here, the condensers are such that Cd1=Cd2=C, and the voltage input into Vin is equal to $V_0$.

Figure 36:
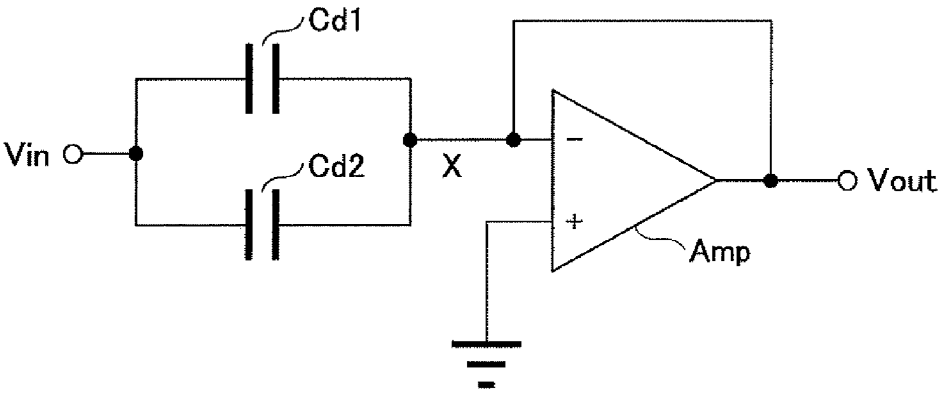
FIG. 36 is a drawing showing the circuit configuration of the semiconductor device 100*n* in a sampling mode.

FIG. 36 is a drawing showing the circuit configuration of the semiconductor device 100*n* in a sampling mode. In FIG. 35, the switches SW1, SW2, and SW3 are turned on, and the switches SW4 and SW5 are turned off, resulting in the circuit configuration illustrated in FIG. 36. In FIG. 36, a connection point X is a virtual ground, so that the voltage between the node of the condenser Cd1 and the node of the condenser Cd2 follows the input voltage Vin.

Figure 37:
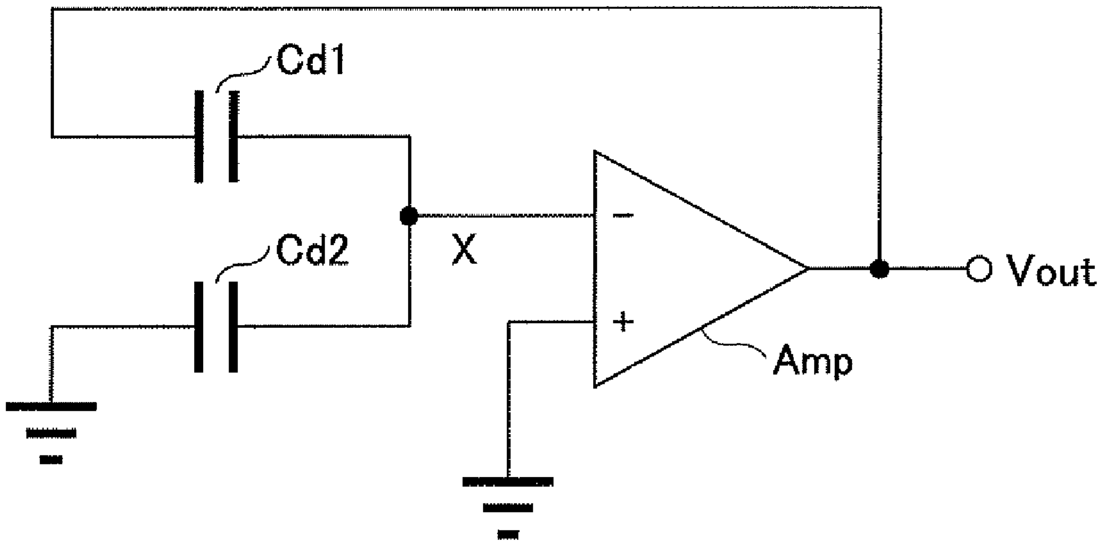
FIG. 37 is a drawing showing the circuit configuration of the semiconductor device 100*n* in an amplification mode.

FIG. 37 is a drawing showing the circuit configuration of the semiconductor device 100*n* in an amplification mode. In FIG. 35, the switches SW1, SW2, and SW3 are turned off, and the switches SW4 and SW5 are turned on, resulting in the circuit configuration illustrated in FIG. 37. When entering the amplification mode illustrated in FIG. 37, the switch SW3 is first turned off to place the condenser Cd1 in a feedback path, followed by turning off the switches SW1 and SW2 and turning on the switch SW4. At the end, the switch SW5 is turned on to connect the left-side node of the condenser Cd2 to the ground. At the instant of turning off the switch SW3, the total electric charge of the condenser Cd1 and the condenser Cd2 is equal to $2CV_0$, and, then, the voltage across the condenser Cd2 approaches 0 in the amplification mode. As a result, the voltage across the condenser Cd1, i.e., the output voltage Vout, becomes approximately equal to $2V_0$.

Figure 38:
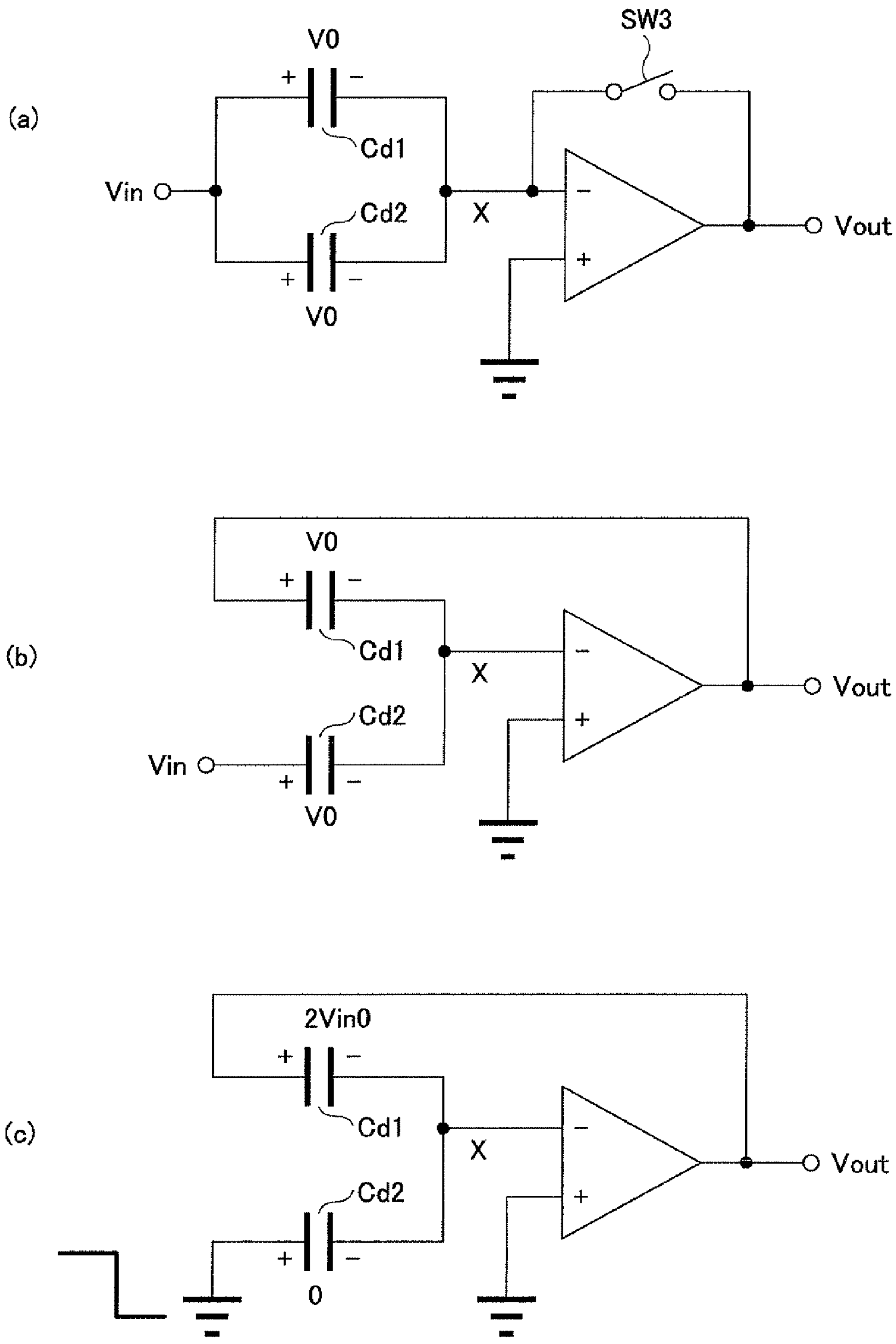
FIG. 38 is a state transition diagram of an amplification operation having an amplification factor of 2 performed by the semiconductor device 100*n*, in which FIG. 38-(*a*) is a drawing illustrating the state immediately after the switch SW3 is turned off in the sampling mode, FIG. 38-(*b*) is a drawing illustrating the state immediately after the switches SW1, SW2, and SW4 are switched over in the state illustrated in FIG. 38-(*a*), and FIG. 38-(*c*) is a drawing illustrating the state immediately after the switch SW5 is turned on in the state illustrated in FIG. 38-(*b*).
Figure 39:
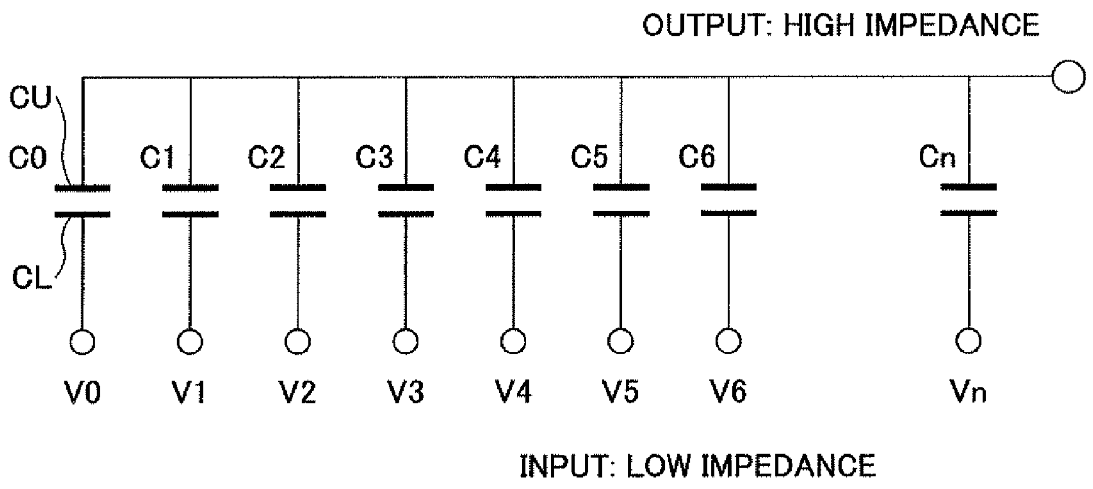
FIG. 39 is a circuit diagram showing part of a related-art D/A converter circuit.
Figure 40:
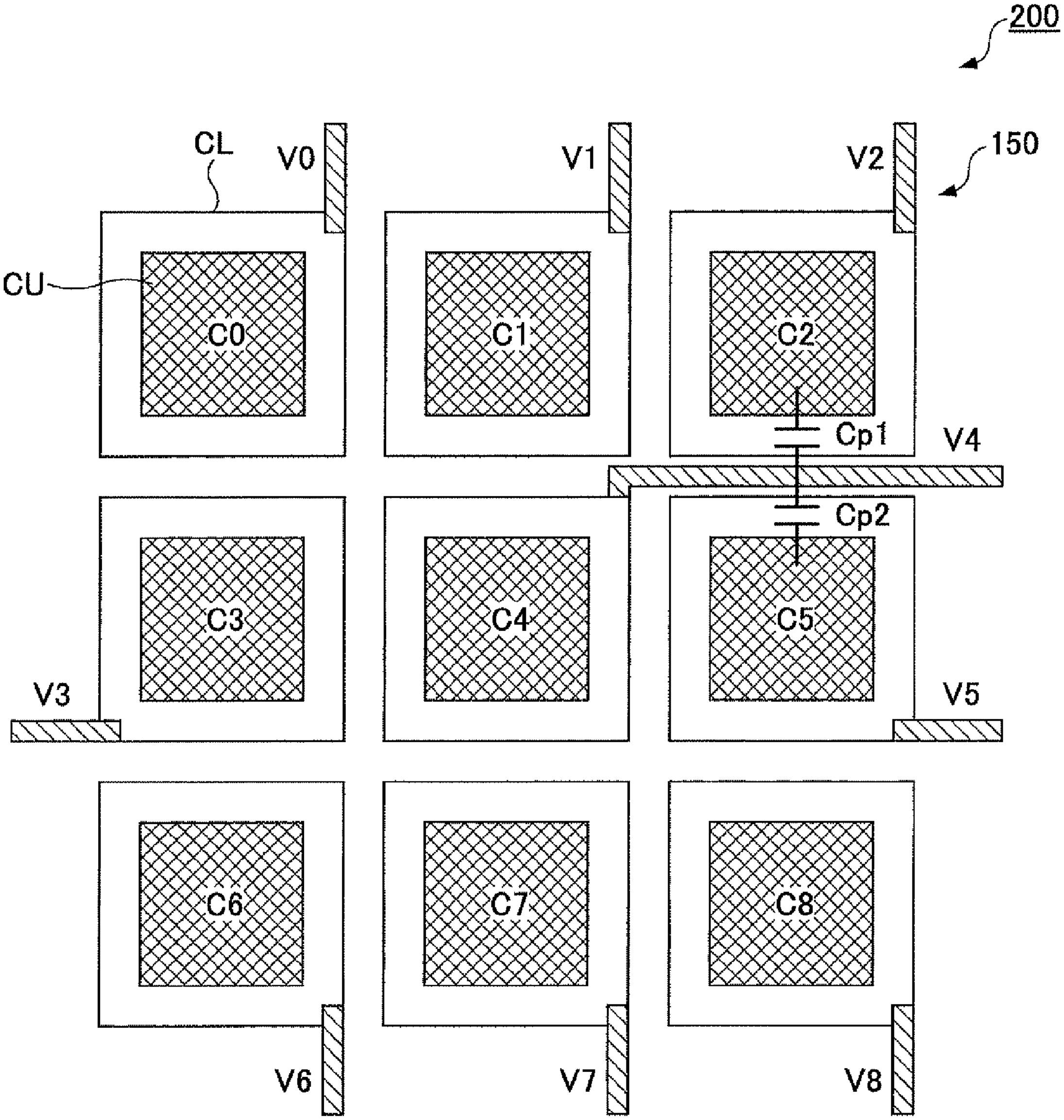
FIG. 40 is a drawing illustrating an example of a plane configuration of a related-art semiconductor device 200.

FIG. 38 is a set of state transition diagrams illustrating the operation of amplification by a factor of 2 performed by the semiconductor device 100*n* together with the illustration of electric charge conditions at transitional stages on the way from FIG. 36 to FIG. 37.

FIG. 38-(*a*) shows the state immediately after the switch SW3 is turned off in the sampling mode illustrated in FIG. 36. In FIG. 38-(*a*), $V_0$ is applied to Vin, so that electric charge $CV_0$ is accumulated in each of the condensers Cd1 and Cd2, resulting in $V_0$ appearing across each condenser. The switch SW3 is turned off in this state.

FIG. 38-(*b*) shows the state immediately after the switches SW1 and SW2 are turned off and the switch SW4 is turned on in the state illustrated in FIG. 38-(*a*). In this state, the total electric charge $2CV_0$ is accumulated at the right-hand ends of the condensers Cd1 and Cd2.

FIG. 38-(*c*) shows the state immediately after the switch SW5 is turned on in the state illustrated in FIG. 38-(*b*). In FIG.

38-(*c*), the voltage across the condenser Cd2 approaches 0, so that the voltage across the condenser Cd1 becomes almost equal to $2V_0$, resulting in $2V_0$ being output as the output voltage Vout.

In this manner, the sample-hold circuit using the condensers Cd1 and Cd2 is utilized to provide the semiconductor device 100*n* that is an amplification circuit having an amplification factor of 2. The condensers Cd1 and Cd2 are implemented by use of any of the capacitor cells C0 through C8, C11 through C16, C11*a* through C14*a* described in the first through tenth embodiments, thereby providing condensers with high precision. As a result, a capacitance error between the condensers Cd1 and Cd2 is made extremely small to provide a highly accurate amplification circuit having an amplification factor of 2.

In FIG. 35 through FIG. 38, a description has been directed to an example in which an amplification circuit having an amplification factor of 2 is used. The amplification factor, however, may be set to any desired value by selecting a capacitance ratio between the condensers Cd1 and Cd2. For example, the amplification factor may be set to 1.5, 3, or 4. In this manner, the semiconductor device 100*n* of the twelfth embodiment is applicable to amplification circuits having various amplification factors.

Further, the present invention is not limited to these embodiments, but various variations and modifications may be made without departing from the scope of the present invention.

This international application claims foreign priority to Japanese Patent Application No. 2007-169242 filed on Jun. 27, 2007, the entire contents of which are incorporated herein by reference.

The invention claimed is:

1. A semiconductor device, comprising a plurality of capacitor cells having respective lower electrodes to which signals are applied and respective upper electrodes arranged to face the respective lower electrodes, wherein each interconnect connected to a corresponding one of the lower electrodes includes a shield interconnect section including a shield interconnect line enclosing a corresponding one of the upper electrodes, and the shield interconnect section is set to a potential equal to a corresponding one of the applied signals, the shield interconnect line being situated outside a periphery of the corresponding one of the upper electrodes to surround the corresponding one of the upper electrodes.

2. The semiconductor device as claimed in claim 1, wherein the shield interconnect section includes an interconnect structure enclosing the corresponding one of the upper electrodes as viewed from above.

3. The semiconductor device as claimed in claim 1, wherein the shield interconnect section includes a plate shape that covers the corresponding one of the upper electrodes from above.

4. The semiconductor device as claimed in claim 1, further comprising:

a comparator; and a D/A converter circuit.

5. The semiconductor device as claimed in claim 1, further comprising:

an operational amplifier; and an amplification circuit.

6. The semiconductor device as claimed in claim 2, wherein the shield interconnect section has a multilayer interconnect structure.

7. The semiconductor device as claimed in claim 2, further comprising a fixed-potential shield interconnect section situated above the shield interconnect section, the fixed-potential shield interconnect section having a plate shape covering at least the corresponding one of the upper electrodes and configured to receive a fixed potential.

8. The semiconductor device as claimed in claim 2, wherein the shield interconnect section includes an interconnect structure partly enclosing the corresponding one of the upper electrodes.

9. The semiconductor device as claimed in claim 7, wherein the plate shape has an area size that covers the upper electrodes.

10. The semiconductor device as claimed in claim 8, wherein the interconnect structure partly enclosing the corresponding one of the upper electrodes provides an enclosure along a perimeter excluding a portion where an upper electrode connecting section is provided to electrically connect the upper electrodes together.

11. The semiconductor device as claimed in claim 8, further comprising a fixed-potential shield interconnect section situated above the shield interconnect section, the fixed-potential shield interconnect section having a plate shape covering at least the corresponding one of the upper electrodes and configured to receive a fixed potential.

12. The semiconductor device as claimed in claim 11, wherein the plate shape has an area size that covers the upper electrodes.

13. A semiconductor device, comprising:

a plurality of capacitor cells having respective lower electrodes to which signals are applied and respective upper electrodes arranged to face the respective lower electrodes; and a lower-electrode interconnect connected to a corresponding one of the lower electrodes, the lower-electrode interconnect having a plate-shape shield interconnect section covering a corresponding one of the upper electrodes, and having an input interconnect line to supply a corresponding one of the signals, wherein the input interconnect line is situated in an interconnect layer above the plate-shape shield interconnect section.

14. The semiconductor device as claimed in claim 13, wherein the input interconnect line for a corresponding one of the capacitor cells is situated in an interconnect layer above the plate-shape shield interconnect section for another one of the capacitor cells.

15. The semiconductor device as claimed in claim 13, wherein the plate-shape shield interconnect section has a multilayer interconnect structure.

16. The semiconductor device as claimed in claim 13, wherein the plate-shape shield interconnect section includes a plate shape that covers the corresponding one of the upper electrodes from above.

17. The semiconductor device as claimed in claim 13, further comprising:

a comparator; and a D/A converter circuit.

18. The semiconductor device as claimed in claim 13, further comprising:

an operational amplifier; and an amplification circuit.

19. The semiconductor device as claimed in claim 15, wherein the plate-shape shield interconnect section has a plate shape of an area size that covers the upper electrodes.

20. The semiconductor device as claimed in claim 15, further comprising a fixed-potential shield interconnect section situated above the plate-shape shield interconnect section, the fixed-potential shield interconnect section having a plate shape covering at least the corresponding one of the upper electrodes and configured to receive a fixed potential.

21. The semiconductor device as claimed in claim 16, wherein the plate-shape shield interconnect section includes an interconnect structure enclosing the corresponding one of the upper electrodes as viewed from above.

22. The semiconductor device as claimed in claim 21, wherein the plate-shape shield interconnect section includes an interconnect structure partly enclosing the corresponding one of the upper electrodes.

23. The semiconductor device as claimed in claim 22, wherein the interconnect structure partly enclosing the corresponding one of the upper electrodes provides an enclosure along a perimeter excluding a portion where an upper electrode connecting section is provided to electrically connect the upper electrodes together.

* * * * *